US009012123B2

(12) United States Patent
Yamamoto et al.

(10) Patent No.: US 9,012,123 B2

(45) Date of Patent: Apr. 21, 2015

(54) POSITIVE RESIST COMPOSITION AND PATTERN FORMING METHOD USING THE SAME

(75) Inventors: Kei Yamamoto, Shizuoka (JP); Akinori Shibuya, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 303 days.

(21) Appl. No.: 12/922,041

(22) PCT Filed: Mar. 26, 2009

(86) PCT No.: PCT/JP2009/056837

§ 371 (c)(1), (2), (4) Date: Sep. 10, 2010

(87) PCT Pub. No.: WO2009/119894

PCT Pub. Date: Oct. 1, 2009

(65) Prior Publication Data

US 2011/0014571 A1 Jan. 20, 2011

(30) Foreign Application Priority Data

Mar. 28, 2008 (JP) ................................ 2008-088776
Mar. 3, 2009 (JP) ................................ 2009-049662
Mar. 23, 2009 (JP) ................................ 2009-071006

(51) Int. Cl.

*G03F 7/004* (2006.01)
*G03F 7/039* (2006.01)
*G03F 7/26* (2006.01)
*G03F 7/00* (2006.01)
*G03F 7/075* (2006.01)
*G03F 7/20* (2006.01)

(52) U.S. Cl.

CPC ............ *G03F 7/0397* (2013.01); *G03F 7/0007* (2013.01); *G03F 7/0046* (2013.01); *G03F 7/0758* (2013.01); *G03F 7/2041* (2013.01); *Y10S 430/111* (2013.01)

USPC ........................ 430/270.1; 430/326; 430/910

(58) Field of Classification Search

USPC ...................................... 430/270.1, 326, 910

See application file for complete search history.

(56) References Cited

U.S. PATENT DOCUMENTS 5,968,713 A 10/1999 Nozaki et al.
6,013,416 A 1/2000 Nozaki et al.
6,200,725 B1 3/2001 Takechi et al.
6,280,898 B1 8/2001 Hasegawa et al.
6,388,101 B1 5/2002 Hada et al.
7,122,291 B2 * 10/2006 Padmanaban et al. ..... 430/270.1
2001/0003640 A1 6/2001 Takechi et al.
2001/0026901 A1 10/2001 Maeda et al.
2003/0054289 A1 3/2003 Nishi et al.
2003/0108809 A1 6/2003 Sato
2003/0134225 A1 * 7/2003 Fujimori et al. .......... 430/270.1
2005/0058938 A1 3/2005 Tachibana et al.
2005/0089796 A1 4/2005 Funatsu et al.
2005/0186503 A1 8/2005 Nishiyama et al.
2006/0008736 A1 * 1/2006 Kanda et al. ............... 430/270.1
2006/0024610 A1 2/2006 Padmanaban et al.
2007/0134588 A1 6/2007 Kanda et al.
2007/0134590 A1 * 6/2007 Fukuhara et al. .......... 430/270.1
2007/0172761 A1 7/2007 Takahashi et al.
2007/0172769 A1 * 7/2007 Kanna et al. .................. 430/311
2007/0218401 A1 9/2007 Ando et al.
2007/0218405 A1 * 9/2007 Iwato et al. ................ 430/270.1
2008/0206669 A1 * 8/2008 Kato et al. ................. 430/270.1
2008/0248425 A1 * 10/2008 Nishiyama et al. ........ 430/285.1
2012/0058431 A1 3/2012 Takahashi et al.
2014/0134541 A1 5/2014 Kanda et al.

FOREIGN PATENT DOCUMENTS

EP 1 489 459 A1 12/2004
EP 1 903 394 A1 3/2008
EP 1 906 238 A2 4/2008
EP 1 975 705 A2 10/2008
EP 1 975 716 A2 10/2008
EP 2 009 498 A1 12/2008
JP 09-073173 A 3/1997
JP 2000-159758 A 6/2000
JP 2001-109154 A 4/2001

(Continued)

OTHER PUBLICATIONS

International Search Report for PCT/JP2009/056837 issued Apr. 28, 2009 [PCT/ISA/210].
Written Opinion for PCT/JP2009/056837 issued Apr. 28, 2010 [PCT/ISA/237].
Extended European Search Report dated Oct. 4, 2012 in European Patent Application No. 09724389.3.
Office Action dated Jul. 31, 2012 in Japanese Application No. 2009-071006.
Office Action dated Mar. 26, 2013 in Japanese Application No. 2009-071006.
Office Action dated Jan. 28, 2014 issued by the Japanese Patent Office in counterpart Japanese Patent Application No. 2009-071006.
Communication dated Nov. 12, 2013, issued by the Taiwanese Patent Office in corresponding Taiwan Application No. 098110106.
Office Action dated Jun. 9, 2014, issued by the Taiwanese Patent Office in counterpart Taiwanese Application No. 098110106.
Japanese Office Action dated Jul. 4, 2014 in JP Patent No. 2009-071006.

*Primary Examiner* — Anca Eoff

(74) *Attorney, Agent, or Firm* — Sughrue Mion, PLLC

(57) ABSTRACT

A positive resist composition and a pattern forming method using the resist composition are provided, the resist composition including: (A) a resin containing a repeating structural unit represented by formula (I) as defined in the specification and being capable of decomposing by an action of an acid to increase the solubility in an alkali developer; (B) an acid generator; and (C) a mixed solvent containing at least one solvent selected from the group consisting of the following Group (a) and at least one solvent selected from the group consisting of the following Groups (b) to (d):

Group (a): an alkylene glycol monoalkyl ether,

Group (b): an alkylene glycol monoalkyl ether carboxylate,

Group (c): a linear ketone, a branched chain ketone, a cyclic ketone, a lactone and an alkylene carbonate, and Group (d): a lactic acid ester, an acetic acid ester and an alkoxypropionic acid ester.

35 Claims, No Drawings

(56) References Cited

FOREIGN PATENT DOCUMENTS

| | | | |
|---|---|---|---|
| JP | 2003-064134 | A | 3/2003 |
| JP | 2003-107709 | A | 4/2003 |
| JP | 2003-107710 | A | 4/2003 |
| JP | 2003-167333 | A | 6/2003 |
| JP | 2005-097533 | A | 4/2005 |
| JP | 2005-105260 | A | 4/2005 |
| JP | 2005-234330 | A | 9/2005 |
| JP | 2007-072102 | A | 3/2007 |
| JP | 2007-086514 | A | 4/2007 |
| JP | 2007-249074 | A | 9/2007 |
| JP | 2007-249192 | A | 9/2007 |
| JP | 2007-272194 | A | 10/2007 |
| JP | 2007-326903 | A | 12/2007 |
| JP | 2008-046582 | A | 2/2008 |

* cited by examiner

POSITIVE RESIST COMPOSITION AND PATTERN FORMING METHOD USING THE SAME

TECHNICAL FIELD

The present invention relates to a positive resist composition that undergoes a reaction upon irradiation with an actinic ray or radiation and thereby changes in the property, a pattern forming method using the positive resist composition, and a compound for use in the positive resist composition. More specifically, the present invention relates to a positive resist composition for use in the production process of a semiconductor such as IC, in the production of a circuit board for liquid crystal devices, thermal heads or the like, in other photofabrication processes, or in the lithographic printing plate or acid-curable composition, a pattern forming method using the positive resist composition, and a compound for use in the positive resist composition.

BACKGROUND ART

The chemical amplification positive resist composition is a pattern forming material which is sparingly soluble or insoluble in a developer immediately after the formation on a substrate but when irradiated with radiation such as far ultraviolet light, produces an acid in the exposed area and through a reaction using this acid as the catalyst, increases the solubility in a developer of the area irradiated with actinic radiation, thereby forming a pattern on the substrate. Also, the chemical amplification negative resist composition is a pattern forming material which is easily soluble in a developer immediately after the formation on a substrate but when irradiated with radiation such as far ultraviolet light, produces an acid in the exposed area and through a reaction using this acid as the catalyst, decreases the solubility in a developer of the area irradiated with actinic radiation, thereby forming a pattern on the substrate.

In general, the chemical amplification resist composition for the processing using a light source (radiation source) such as KrF excimer laser, ArF excimer laser, F2 excimer laser, EUV (extreme ultraviolet light) and EB (electron beam) comprises, for example, a resin component, an acid generator component capable of generating an acid upon exposure, and an organic solvent capable of dissolving these components. Such a chemical amplification resist composition is required to give a resist pattern with high resolution, high sensitivity and good profile.

In the case of using an ArF excimer laser (193 nm) as a light source having a short wavelength for the exposure light source, since an aromatic group-containing compound substantially has large absorption in the 193-nm region, a resist containing a resin having an alicyclic hydrocarbon structure is being developed for use with an ArF excimer laser (see, for example, JP-A-9-73173 (the term "JP-A" as used herein means an "unexamined published Japanese patent application")).

It has been found that the performance can be enhanced by incorporating a repeating unit having a lactone structure into the above-described resin having an alicyclic hydrocarbon structure. For example, in JP-A-2005-97533, U.S. Pat. No. 6,388,101, JP-A-2000-159758, JP-A-2001-109154 and U.S. Patent Application Publication No. 2001-26901), a resist composition containing an acid-decomposable resin having a lactone structure is described.

On the other hand, in JP-A-2005-234330, a plurality of solvents are used with an attempt to enhance the image performance.

However, in view of integrated performance as the resist, an appropriate combination of the resin, photo-acid generator, additive, solvent and the like used is actually very difficult to find out, and moreover, at the formation of a fine pattern with a line width of 100 nm or less, even when the resolving performance is excellent, if the line width uniformity of the line pattern formed is bad, an electrical characteristic failure is brought about, giving rise to decrease in the yield. Accordingly, it is demanded to enhance the line width uniformity.

DISCLOSURE OF THE INVENTION

The present invention has been made under these circumstances, and an object of the present invention is to provide a resist composition capable of realizing high filterability and excellent line width uniformity and a pattern forming method using the resist composition.

As a result of intensive studies, the present inventors have found that when a resin having a specific repeating unit is used in admixture with a specific solvent, the object of the present invention can be achieved. The present invention has been accomplished based on this finding.

That is, the above-described object can be attained by the following constructions.

(1) A positive resist composition, comprising:

(A) a resin containing a repeating structural unit represented by formula (I) and being capable of decomposing by an action of an acid to increase a solubility of the resin (A) in an alkali developer;

(B) a compound capable of generating an acid upon irradiation with an actinic ray or radiation; and (C) a mixed solvent containing at least one solvent selected from the group consisting of the following Group (a) and at least one solvent selected from the group consisting of the following Groups (b) to (d):

Group (a): an alkylene glycol monoalkyl ether,

Group (b): an alkylene glycol monoalkyl ether carboxylate,

Group (c): a linear ketone, a branched chain ketone, a cyclic ketone, a lactone and an alkylene carbonate, and Group (d): a lactic acid ester, an acetic acid ester and an alkoxypropionic acid ester:

(I)

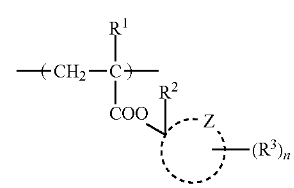

wherein $R^1$ represents a hydrogen atom, a halogen atom or an alkyl group;

$R^2$ represents an alkyl group;

$R^3$ represents a halogen atom, an alkyl group, a cycloalkyl group, a cyano group or a hydroxyl group, and when a plurality of $R^3$'s are present, the plurality of $R^3$'s are the same or different;

n represents 0 or a positive integer; and

Z represents a cyclic alkyl group having a carbon number of 3 to 8.

(2) The positive resist composition as described in (1) above, further comprising:

(D) a surfactant; and (E) a basic compound.

(3) The positive resist composition as described in (1) or (2) above, further comprising:

a hydrophobic resin (HR), wherein the positive resist composition is used for immersion exposure.

(4) The positive resist composition as described in any one of (1) to (3) above, wherein the cyclic alkyl group represented by Z in formula (I) is a 5-membered ring.

(5) The positive resist composition as described in any one of (1) to (4) above, wherein the resin as the component (A) further contains a repeating unit having a lactone structure.

(6) The positive resist composition as described in (5) above, wherein the lactone structure is represented by formula (A2):

(A2)

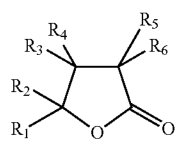

wherein $R_1$ to $R_6$ each independently represents a linking group to a main chain of the resin (A), a hydrogen atom or a substituent, provided that at least one of $R_1$ to $R_6$ represents a cyano group or a cyano group-containing substituent, at least two members out of $R_1$ to $R_6$ may combine together to form a ring structure, and at least one of $R_1$ to $R_6$ includes the linking group to the main chain of the resin (A).

(7) The positive resist composition as described in (5) above, wherein the lactone structure is represented by formula (A6):

(A6)

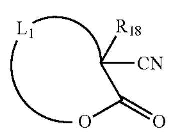

wherein $R_{18}$ represents a linking group to a main chain of the resin (A), a hydrogen atom or a substituent;

$L_1$ represents a linking group for linking the carbon atom at the 2-position of the lactone ring and the oxygen atom of the lactone ring to form a lactone ring structure, and the linking group to the main chain of the resin (A) may be substituted to $L_1$; and $R_{18}$ and $L_1$ may combine together to form a ring structure, provided that at least one of $R_{18}$ and $L_1$ includes the linking group to the main chain of the resin (A).

(8) The positive resist composition as described in any one of (1) to (7) above, wherein the resin as the component (A) further contains a repeating unit represented by formula (2-1):

(2-1)

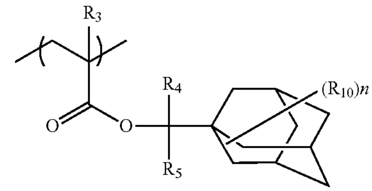

wherein $R_3$ represents a hydrogen atom, a halogen atom or an alkyl group;

$R_4$ and $R_5$ each independently represents an alkyl group or a cycloalkyl group;

$R_{10}$ represents a substituent containing a polar group; and n represents an integer of 0 to 15.

(9) The positive resist composition as described in (8) above, wherein $R_{10}$ in formula (2-1) represents a partial structure represented by —C($R_4$')($R_5$')—OH, in which $R_4$' and $R_5$' each independently represents an alkyl group or a cycloalkyl group.

(10) A pattern forming method, comprising:

forming a resist film from the positive resist composition as described in any one of (1) to (9) above; and exposing and developing the resist film

(11) The pattern forming method as described in (10) above, wherein the resist film is exposed through an immersion medium.

BEST MODE FOR CARRYING OUT THE INVENTION

The components for use in the present invention are described in detail below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(A) Resin Capable of Increasing the Solubility in an Alkali Developer by the Action of an Acid The positive resist composition of the present invention contains (A) a resin capable of increasing the solubility in an alkali developer by the action of an acid. The resin (A) is a resin having a group capable of decomposing by the action of an acid to produce an alkali-soluble group (hereinafter sometimes referred to as an "acid-decomposable group"), in the main or side chain of the resin or in both the main chain and the side chain.

The alkali-soluble group is not specifically limited as long as it is a group which becomes an ion by being dissociated in an alkali developer. Examples of the alkali-soluble group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)-methylene group, a bis(alkylsulfonyl)imide group, a tris(alkylcarbonyl)methylene group and a tris(alkylsulfonyl)methylene group.

Preferred alkali-soluble groups are a carboxyl group, a fluorinated alcohol group (preferably hexafluoroisopropanol) and a sulfonic acid group.

The group preferred as the acid-decomposable group is a group where a hydrogen atom of such an alkali-soluble group is substituted by a group capable of leaving by the action of an acid.

Examples of the group capable of leaving by the action of an acid include —$C(R_{36})(R_{37})(R_{38})$, —$C(R_{36})(R_{37})(OR_{39})$ and —$C(R_{01})(R_{02})(OR_{39})$.

In the formulae, $R_{36}$ to $R_{39}$ each independently represents an alkyl group, a cycloalkyl group, an aryl group, an aralkyl group or an alkenyl group, and $R_{36}$ and $R_{37}$ may combine together to form a ring.

$R_{01}$ and $R_{02}$ each independently represents a hydrogen atom, an alkyl group, a cycloalkyl group, an aryl group, an aralkyl group or an alkenyl group.

The acid-decomposable group is preferably, for example, a cumyl ester group, an enol ester group, an acetal ester group or a tertiary alkyl ester group, more preferably a tertiary alkyl ester group.

The resin (A) contains at least one repeating unit represented by formula (I).

(I)

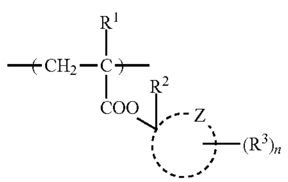

In formula (I), $R^1$ represents a hydrogen atom, a halogen atom or an alkyl group.

$R^2$ represents an alkyl group.

$R^3$ represents a halogen atom, an alkyl group, a cycloalkyl group, a cyano group or a hydroxyl group. When a plurality of $R^3$'s are present, the plurality of $R^3$'s may be the same or different each other.

n represents 0 or a positive integer.

Z represents a cyclic alkyl group having a carbon number of 3 to 8.

The alkyl group of $R^1$ is preferably an alkyl group having a carbon number of 1 to 4, and examples thereof include a methyl group, an ethyl group, a propyl group and an isopropyl group. The alkyl group may also have a hydroxyl group, a halogen atom (more preferably a fluorine atom), a cyano group or the like. $R^1$ is preferably a hydrogen atom or a methyl group.

The alkyl group of $R^2$ is preferably a linear or branched alkyl group having a carbon number of 1 to 3, and examples thereof include a methyl group, an ethyl group, a propyl group and an isopropyl group.

Z is preferably a cycloalkyl group having a carbon number of 3 to 6, more preferably a 5-membered ring, that is, a cyclopentane structure.

The halogen atom of $R^3$ is preferably a fluorine atom.

Examples of the alkyl group of $R^3$ include a methyl group, an ethyl group, a propyl group and an isopropyl group. The substituent of $R^3$ may be present at any position of the ring.

The cycloalkyl group of $R^3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a cyclopentyl group or a cylohexyl group.

n represents 0 or a positive integer. That is, the cycloalkyl group represented by Z may have a substitutable number of substituents $R^3$. n is preferably 0 or 1.

The alkyl group and cycloalkyl group of $R^2$ and $R^3$ each may further have a substituent, and examples of the substituent which these groups each may have include a halogen atom, a hydroxyl group, a nitro group, a cyano group, a carboxy group, a substituted carbonyl group, a cycloalkyl group (preferably having a carbon number of 3 to 10), an aryl group (preferably having a carbon number of 6 to 14), an alkoxy group (preferably having a carbon number of 1 to 10), a substituted acyl group (preferably having a carbon number of 2 to 20), a substituted acyloxy group (preferably having a carbon number of 2 to 10), a substituted alkoxycarbonyl group (preferably having a carbon number of 2 to 20), and a substituted aminoacyl group (preferably having a carbon number of 2 to 10). The substituent of the cyclic structure in the aryl group, cycloalkyl group and the like includes an alkyl group (preferably having a carbon number of 1 to 10). The substituent in the substituted carbonyl group, substituted acyl group, substituted acyloxy group and substituted alkoxycarbonyl group includes one or two alkyl groups (preferably having a carbon number of 1 to 10). The substituent in the substituted aminoacyl group includes one or two alkyl groups (preferably having a carbon number of 1 to 10).

The content of the repeating unit represented by formula (I) is preferably from 20 to 70 mol %, more preferably from 30 to 60 mol %, based on all repeating units in the polymer.

Specific examples of the repeating unit represented by formula (I) are set forth below, but the present invention is not particularly limited thereto. In the formulae, $R^1$ represents a hydrogen atom, a halogen atom or an alkyl group having a carbon number of 1 to 4.

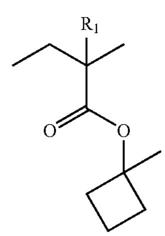
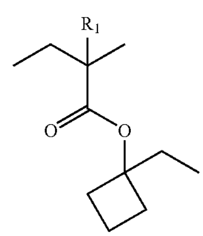
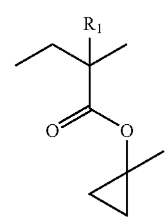

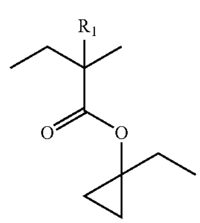
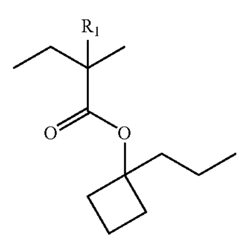

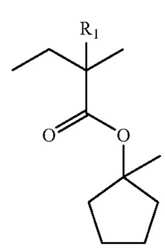
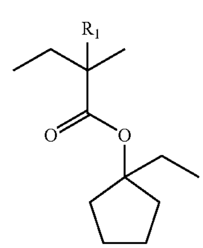
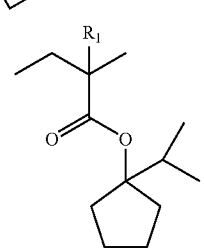

-continued

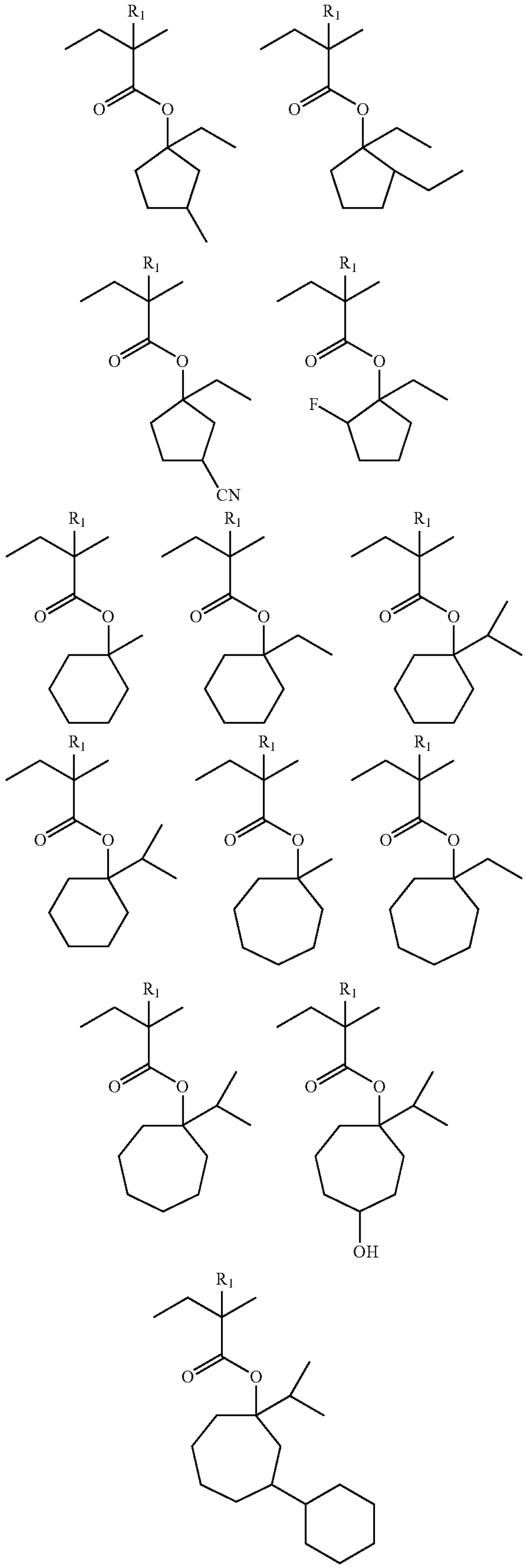

The resin (A) for use in the present invention preferably further contains a repeating unit represented by the following formula (AT) as an acid-decomposable group.

(AT)

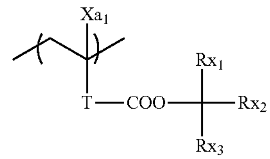

In formula (AT), $Xa_1$ represents a hydrogen atom, a halogen atom or an alkyl group.

T represents a single bond or a divalent linking group.

$Rx_1$ to $Rx_3$ each independently represents an alkyl group (linear or branched) or a cycloalkyl group (monocyclic or polycyclic).

At least two members out of $Rx_1$ to $Rx_3$ may combine to form a cycloalkyl group (monocyclic or polycyclic).

The alkyl group in $Xa_1$ may have a substituent, for example, may be further substituted by a halogen atom, a hydroxyl group or an alkyl halide group. $Xa_1$ is preferably a hydrogen atom, a methyl group, a trifluoromethyl group or a hydroxymethyl group, more preferably a hydrogen atom or a methyl group.

Examples of the divalent linking group of T include an alkylene group, a —COO-Rt- group and a —O-Rt- group, wherein Rt represents an alkylene group or a cycloalkylene group.

T is preferably a single bond or a —COO-Rt- group. Rt is preferably an alkylene group having a carbon number of 1 to 5, more preferably a $—CH_2—$ group or a $—(CH_2)_3—$ group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining at least two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The alkylene group and cycloalkylene group in the linking group T and the alkyl group and cycloalkyl group in $Rx_1$ to $Rx_3$ each may further have a substituent, and examples of the substituent which these groups each may have include a halogen atom, a hydroxyl group, a nitro group, a cyano group, a carboxy group, a substituted carbonyl group, a cycloalkyl group (preferably having a carbon number of 3 to 10), an aryl group (preferably having a carbon number of 6 to 14), an alkoxy group (preferably having a carbon number of 1 to 10), a substituted acyl group (preferably having a carbon number of 2 to 20), a substituted acyloxy group (preferably having a carbon number of 2 to 10), a substituted alkoxycarbonyl group (preferably having a carbon number of 2 to 20), and a substituted aminoacyl group (preferably having a carbon number of 2 to 10). The substituent of the cyclic structure in the aryl group, cycloalkyl group and the like includes an alkyl group (preferably having a carbon number of 1 to 10). The substituent in the substituted carbonyl group, substituted acyl group, substituted acyloxy group and substituted alkoxycarbonyl group includes one or two alkyl groups (preferably having a carbon number of 1 to 10). The substituent in the substituted aminoacyl group includes one or two alkyl groups (preferably having a carbon number of 1 to 10).

As for the combination of $Rx_1$ to $Rx_3$, the following embodiments are preferred:

an embodiment where $Rx_1$ is a methyl group or an ethyl group (more preferably an ethyl group) and $Rx_2$ and $Rx_3$ combine to form the above-described polycyclic cycloalkyl group (more preferably an adamantyl group);

an embodiment where $Rx_1$ and $Rx_2$ each is a methyl group or an ethyl group (more preferably both a methyl group) and $Rx_3$ forms the above-described polycyclic cycloalkyl group (more preferably an adamantyl group);

an embodiment where $Rx_1$ and $Rx_2$ each is a methyl group or an ethyl group (more preferably both a methyl group) and $Rx_3$ forms the monocyclic cycloalkyl group (more preferably a cyclohexyl group); and an embodiment where $Rx_1$ to $Rx_3$ each is a methyl group or an ethyl group (more preferably a methyl group).

The content of the repeating unit represented by formula (AT) is preferably from 20 to 50 mol %, more preferably from 25 to 45 mol %, based on all repeating units in the polymer.

Specific preferred examples of the repeating unit having an acid-decomposable group are set forth below, but the present invention is not particularly limited thereto.

In specific examples, Rx and $Xa_1$ each represents a hydrogen atom, $CH_3$, $CF_3$ or $CH_2OH$, and Rxa and Rxb each represents an alkyl group having a carbon number of 1 to 4. Z represents, when a plurality of Z's are present, each independently represents, a substituent containing a polar group and is, for example, a hydroxyl group, a cyano group, an amino group, an alkylamide group, a sulfonamide group or a linear or branched alkyl or cycloalkyl group having any one of these groups, preferably an alkyl group having a hydroxyl group, more preferably a branched alkyl group having a hydroxyl group. p represents 0 or a positive integer.

1

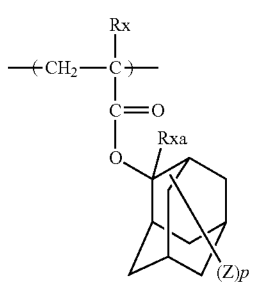

2

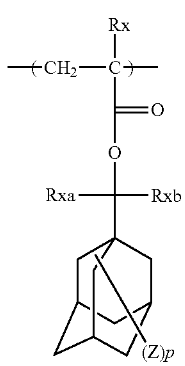

-continued

3

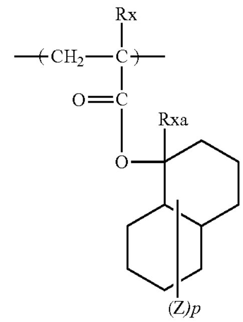

4

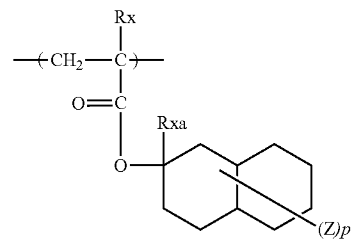

5

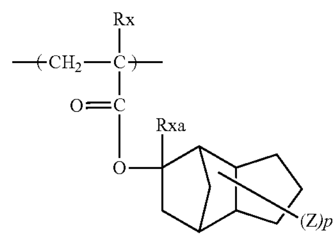

6

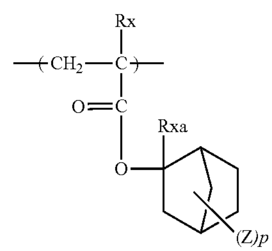

7

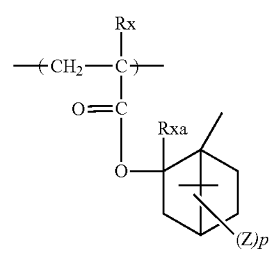

8

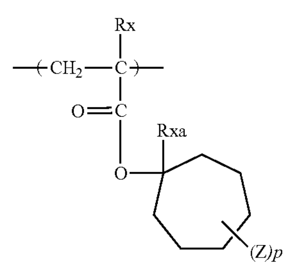

-continued
9
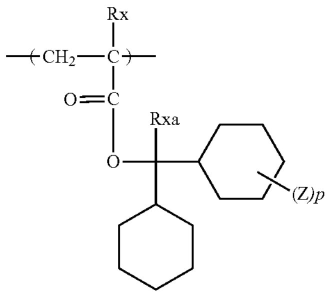
10
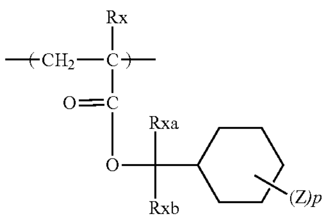
11
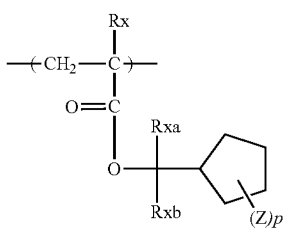
12
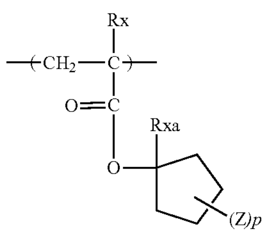
13
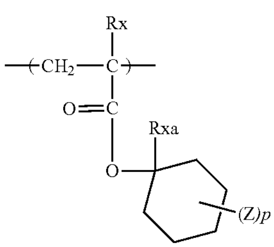
14
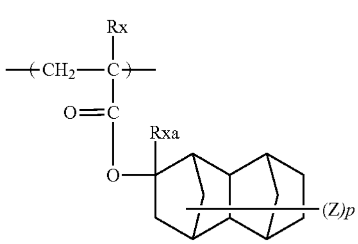
-continued
15
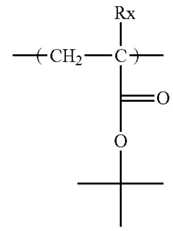
16
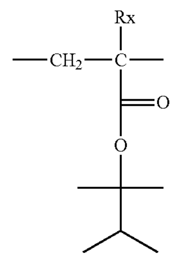
17
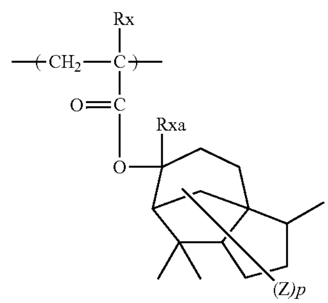
18
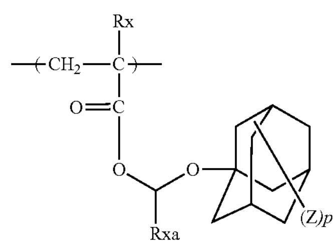
19
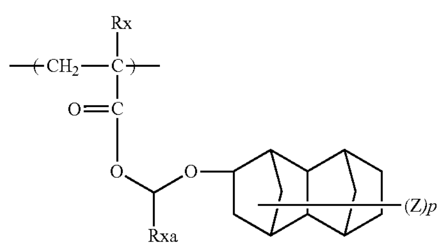
20
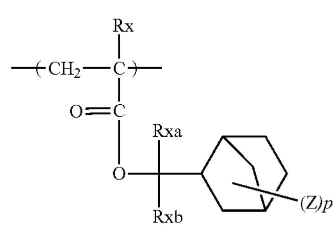

-continued
21
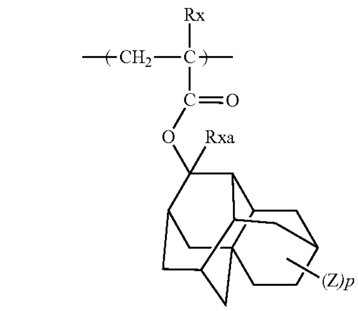
22
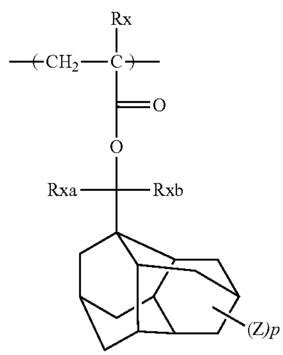
23
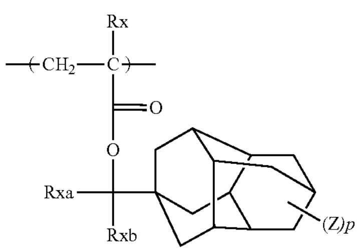
24
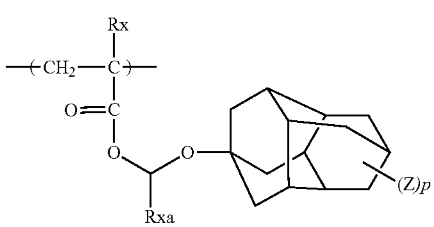
25
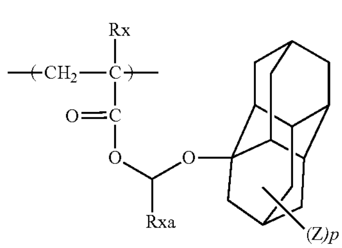
-continued
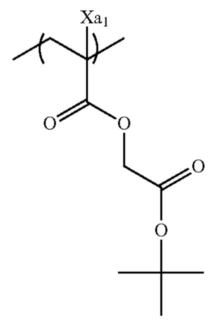
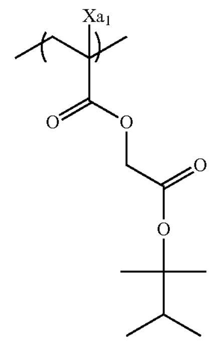
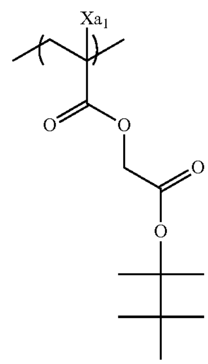
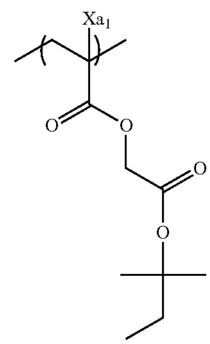
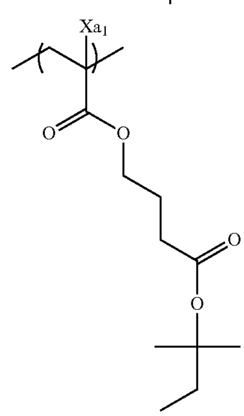
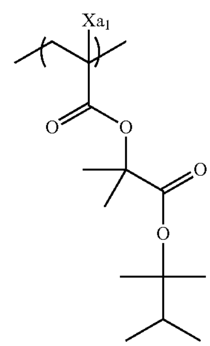
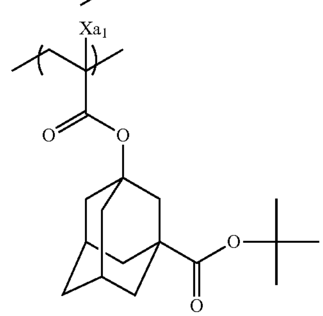
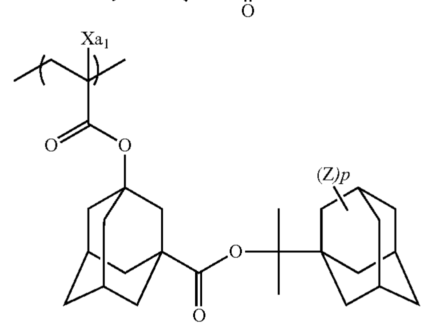

-continued
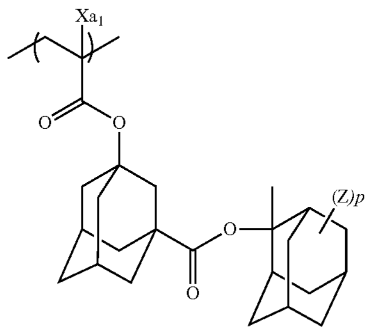
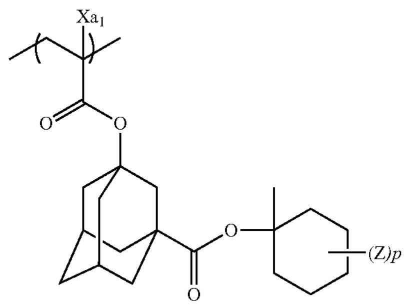
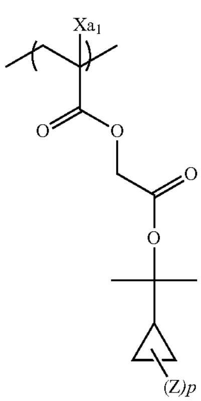
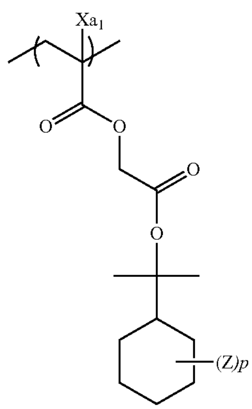
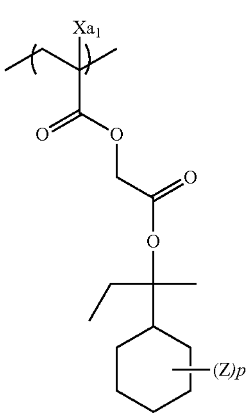
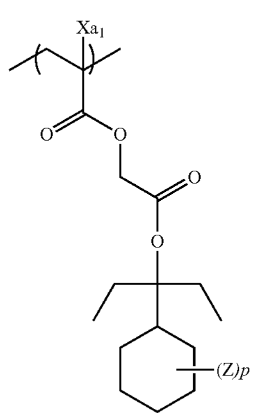
-continued
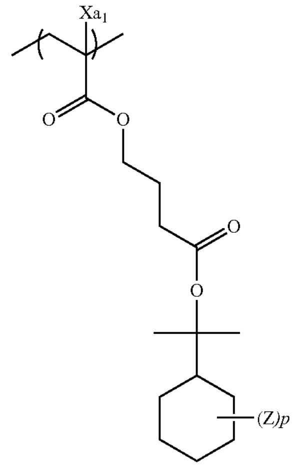
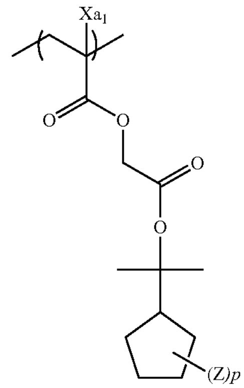
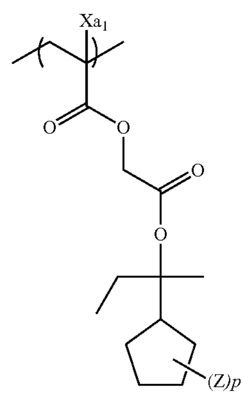
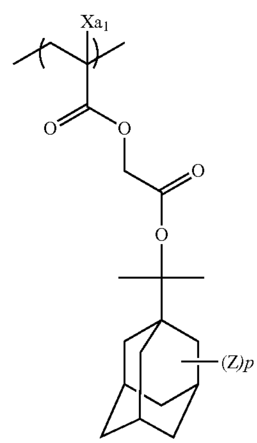
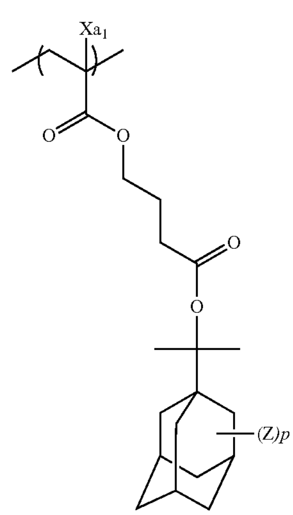
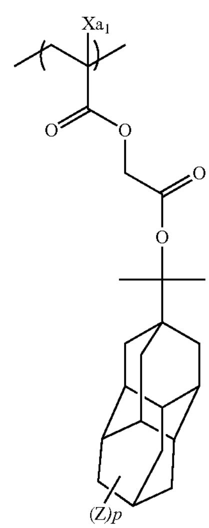

-continued
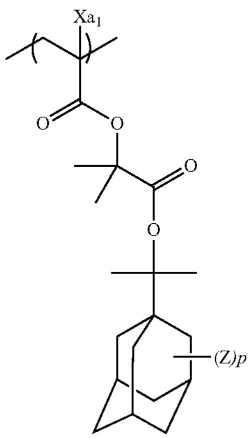
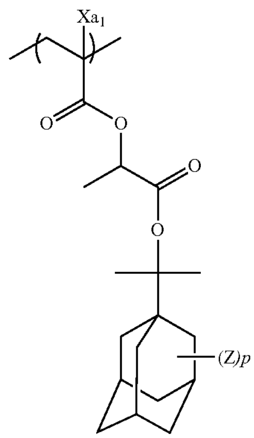
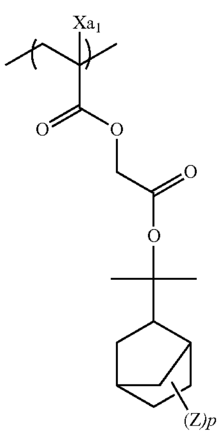
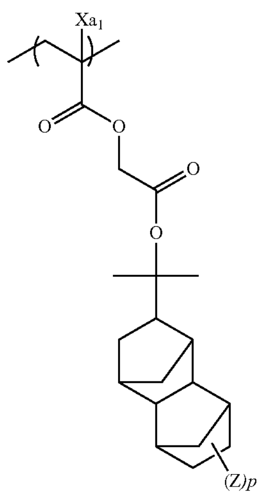
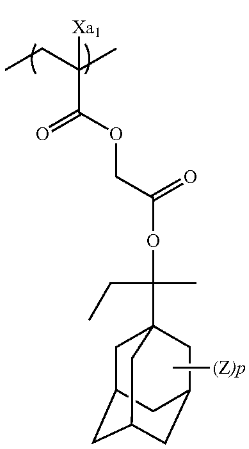
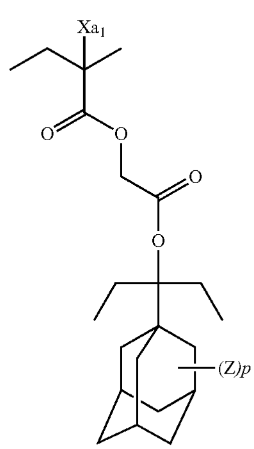
-continued
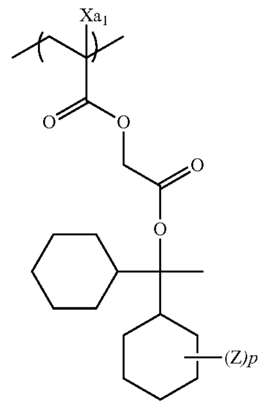
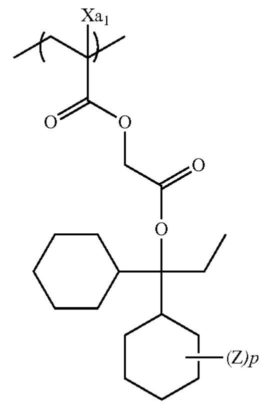
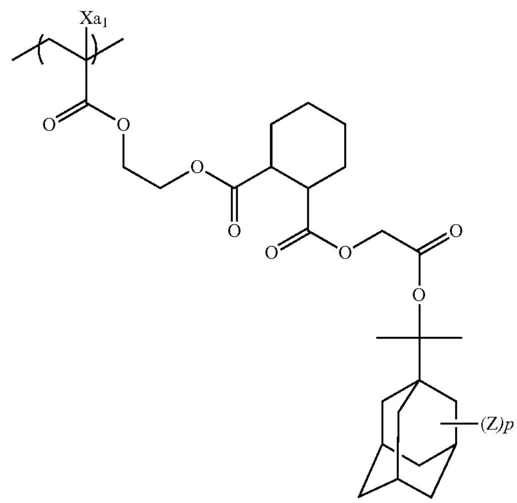
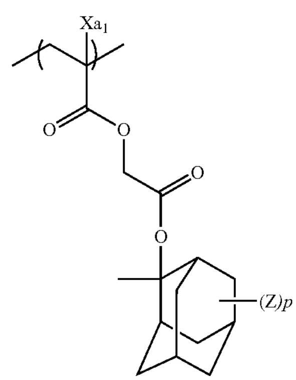
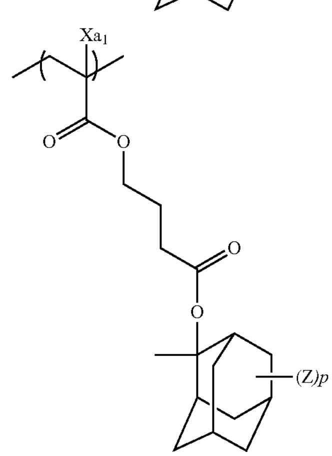

-continued

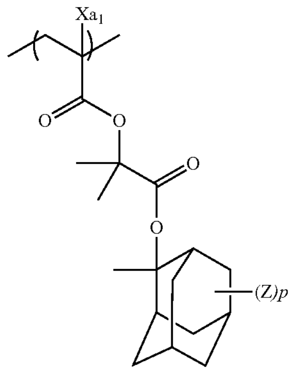

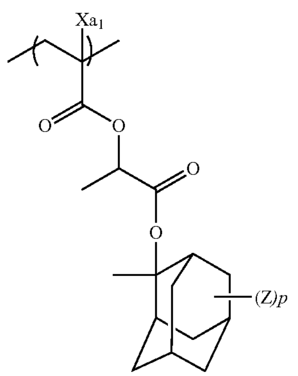

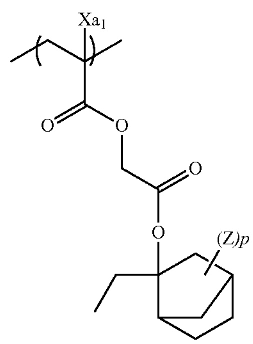

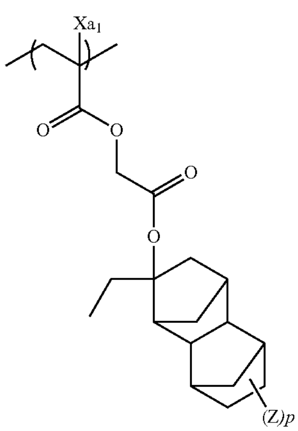

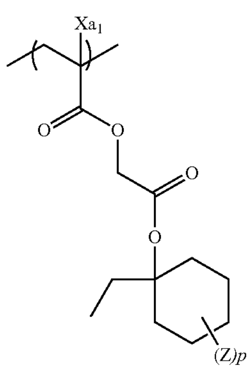

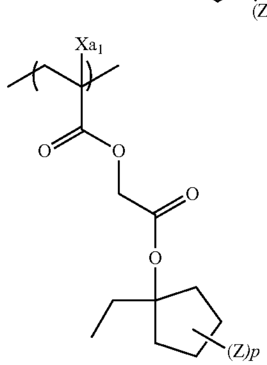

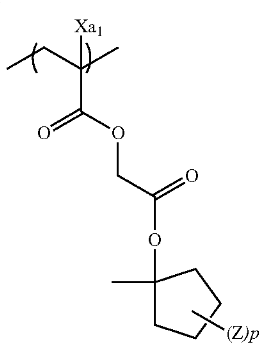

-continued

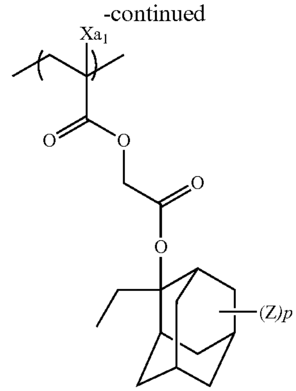

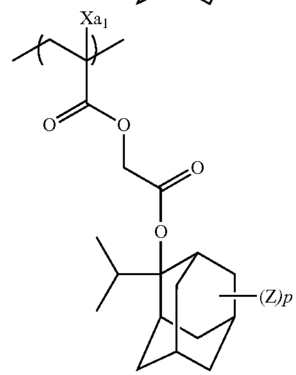

The repeating unit represented by formula (AT) is preferably a repeating unit represented by the following formula (2-1):

(2-1)

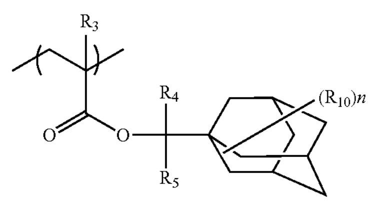

In formula (2-1), $R_3$ represents a hydrogen atom, a halogen atom or an alkyl group, and specific examples thereof are the same as those for $Xa_1$ in formula (AT).

$R_4$ and $R_5$ each independently represents an alkyl group or a cycloalkyl group, and specific examples thereof are the same as those for $Rx_1$ and $Rx_2$ in formula (AT).

$R_{10}$ represents a substituent containing a polar group. In the case where a plurality of $R_{10}$'s are present, these may be the same or different. The substituent containing a polar group is, for example, a hydroxyl group, a cyano group, an amino group, an alkylamide group, a sulfonamide group or a linear or branched alkyl or cycloalkyl group having any one of these groups, preferably a linear or branched alkyl or cycloalkyl group having a hydroxyl group, a cyano group, an amino group, an alkylamide group or a sulfonamide group, more preferably an alkyl group having a hydroxyl group, still more preferably a branched alkyl group having a hydroxyl group.

$R_{10}$ more preferably represents a partial structure represented by —C($R_4$')($R_5$')—OH. $R_4$' and $R_5$' have the same meanings as $R_4$ and $R_5$ in formula (2-1). Preferably, $R_4$' and $R_5$' both are an alkyl group (preferably having a carbon number of 1 to 3), and more preferably, $R_4$' and $R_5$' both are a methyl group.

n represents an integer of 0 to 15. n is preferably an integer of 0 to 2, more preferably 0 or 1.
In the case where the resin (A) uses acid-decomposable repeating units in combination, preferred examples of the combination include the followings.
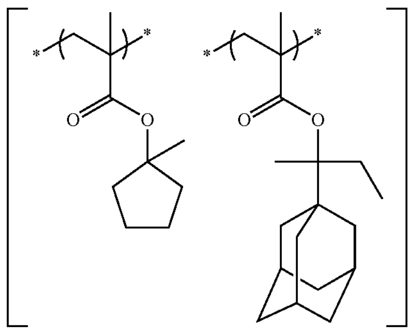
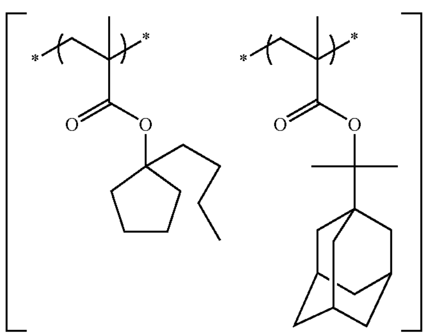
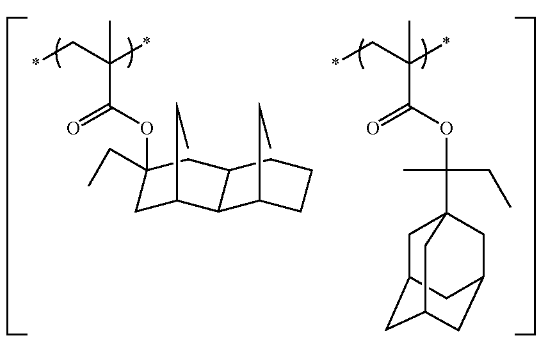
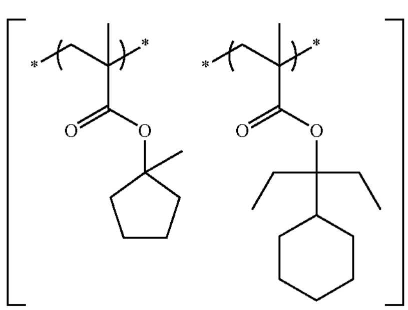
-continued
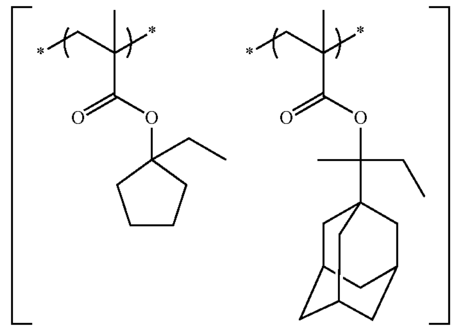
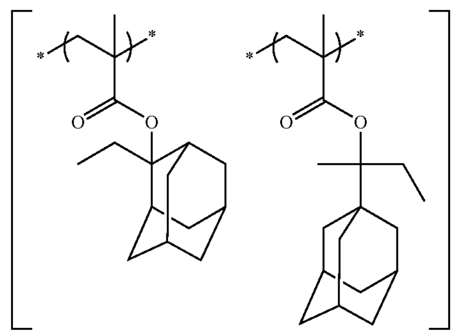
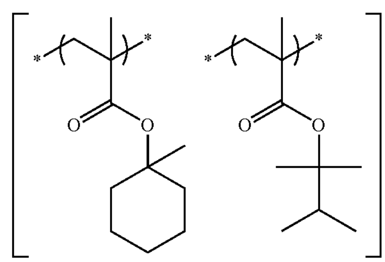
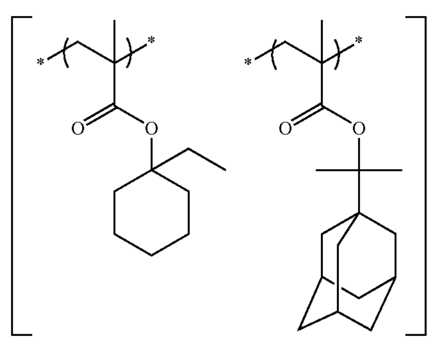
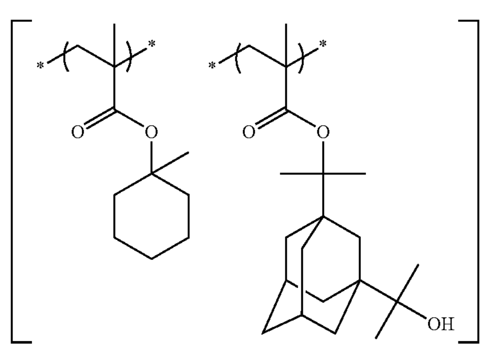

-continued
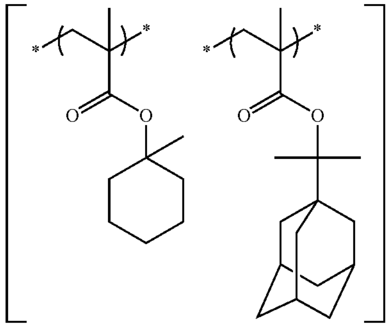
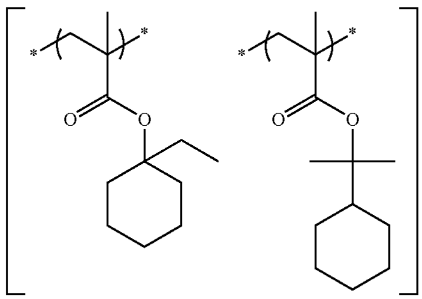
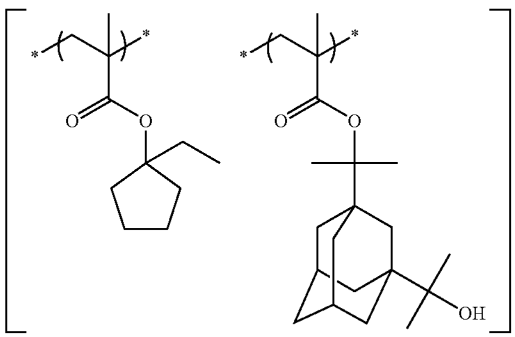
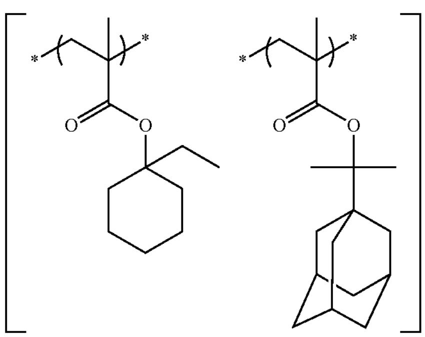
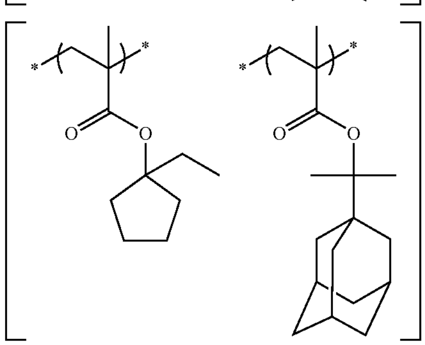
-continued
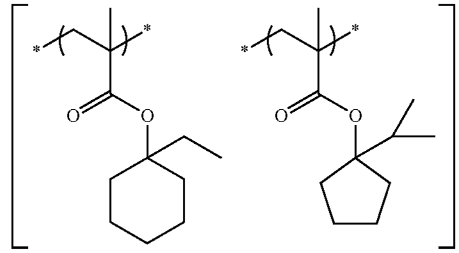
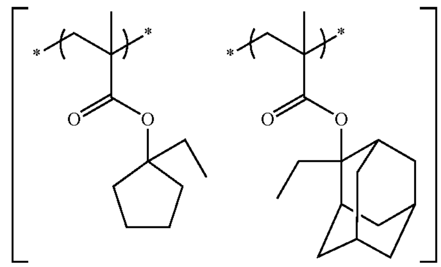
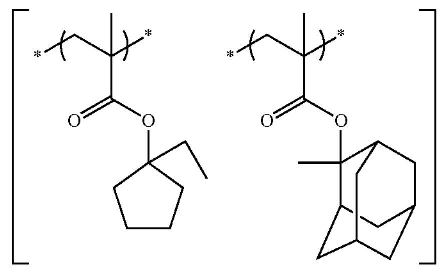
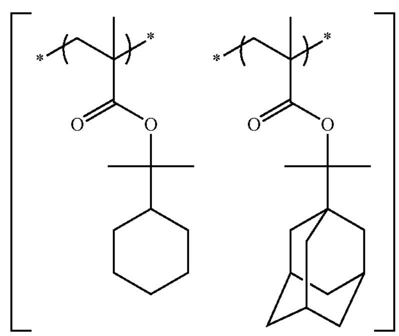
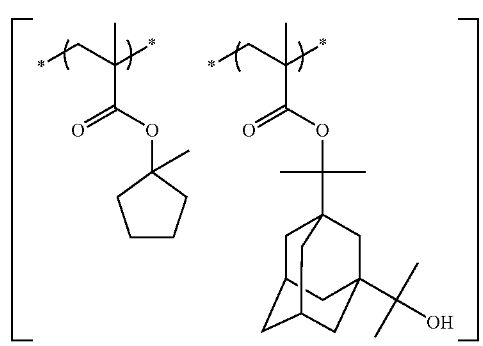

-continued

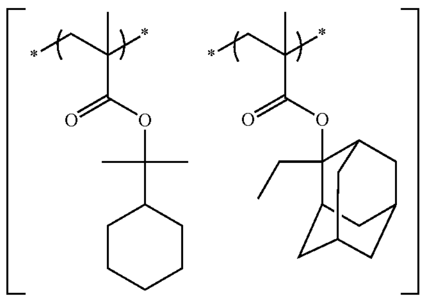

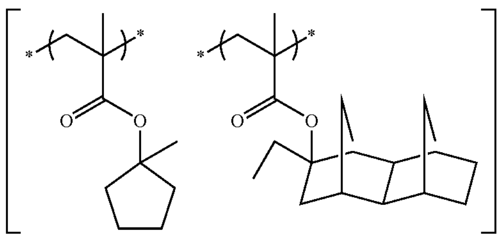

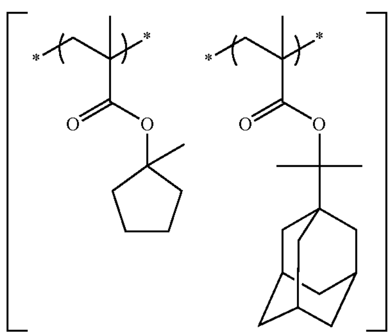

The resin (A) preferably further contains a repeating unit having at least one kind of a group selected from a lactone group, a hydroxyl group, a cyano group and an alkali-soluble group.

The resin (A) preferably contains a repeating unit having a lactone group.

As for the lactone group, any group may be used as long as it has a lactone structure, but the lactone structure is preferably a 5- to 7-membered ring lactone structure, and a structure where another ring structure is condensed to the 5- to 7-membered ring lactone structure in the form of forming a bicyclo or spiro structure is preferred. The resin more preferably contains a repeating unit having a lactone structure represented by any one of the following formulae (LC1-1) to (LC1-17). The lactone structure may be bonded directly to the main chain. Among these lactone structures, preferred are (LC1-1), (LC1-4), (LC1-5), (LC1-6), (LC1-13), (LC1-14) and (LC1-17). By virtue of using a specific lactone structure, the line edge roughness and development defect are improved.

LC1-1

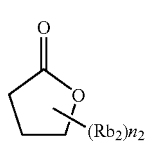

-continued

LC1-2

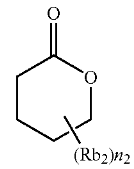

LC1-3

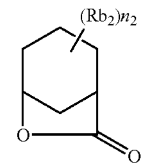

LC1-4

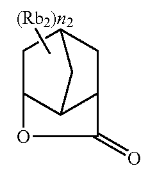

LC1-5

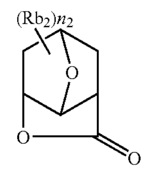

LC1-6

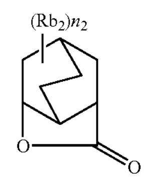

LC1-7

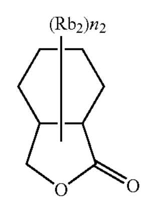

LC1-8

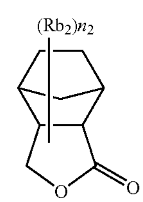

LC1-9

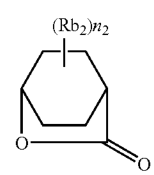

LC1-10

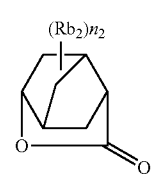

-continued

LC1-11

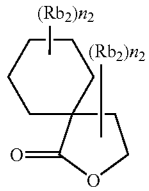

LC1-12

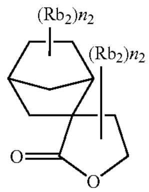

LC1-13

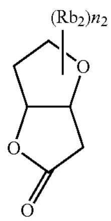

LC1-14

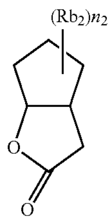

LC1-15

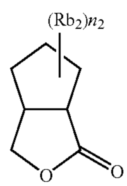

LC1-16

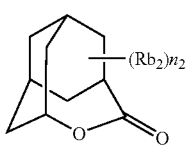

LC1-17

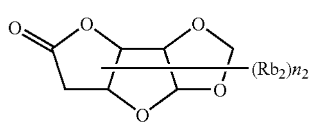

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, the plurality of substituents ($Rb_2$) present in the lactone structure may be the same or different and also, the plurality of substituents ($Rb_2$) may combine together to form a ring.

The repeating unit having a lactone structure represented by any one of formulae (LC1-1) to (LC1-17) includes a repeating unit represented by the following formula (AI).

(AI)

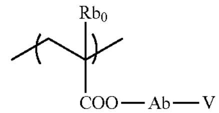

In formula (AI), $Rb_0$ represents a hydrogen atom, a halogen atom or an alkyl group having a carbon number of 1 to 4. Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent linking group comprising a combination thereof, and is preferably a single bond or a divalent linking group represented by $-Ab_1-CO_2-$.

$Ab_1$ represents a linear or branched alkylene group or a monocyclic or polycyclic cycloalkylene group and is preferably a methylene group, an ethylene group, a cyclohexylene group, an adamantylene group or a norbornylene group.

V represents a group having a structure represented by any one of formulae (LC1-1) to (LC1-17).

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

The content of the repeating unit having a lactone structure is preferably from 10 to 70 mol %, more preferably from 20 to 50 mol %, still more preferably from 30 to 50 mol %, based on all repeating units in the polymer.

Specific examples of the repeating unit having a lactone group are set forth below, but the present invention is not limited thereto. In the specific examples, Rx represents H, $CH_3$, $CH_2OH$ or $CF_3$.

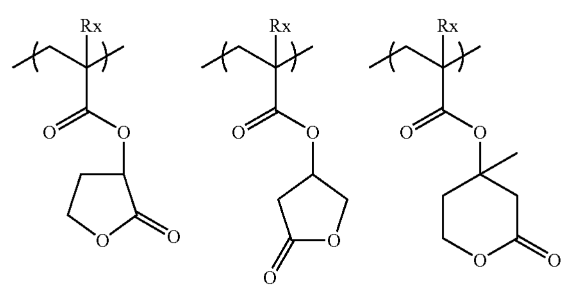

-continued
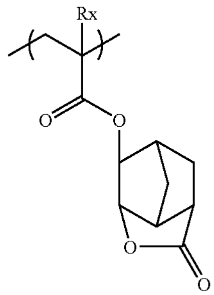
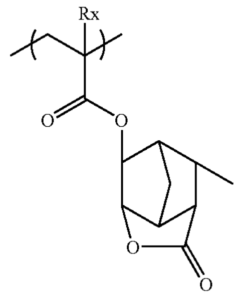
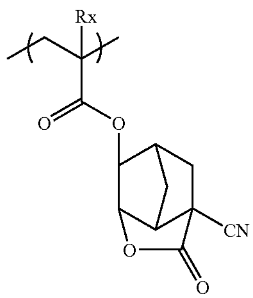
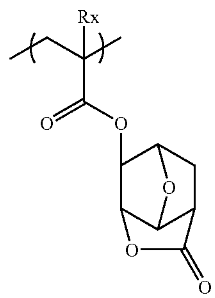
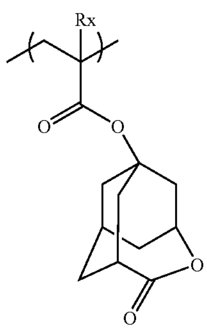
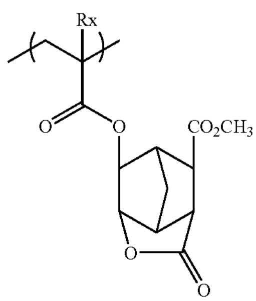
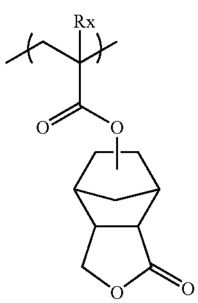
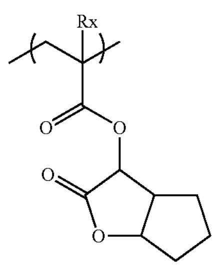
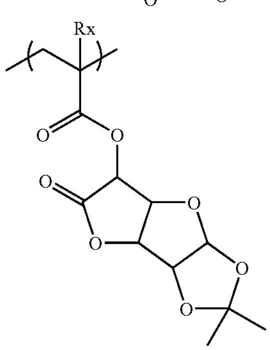
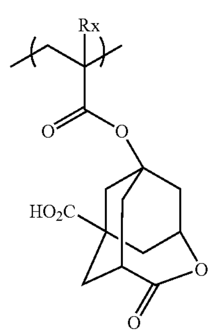
-continued
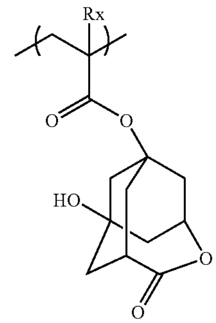
(In the formulae, Rx is H, $CH_3$, $CH_2OH$ or $CF_3$.)
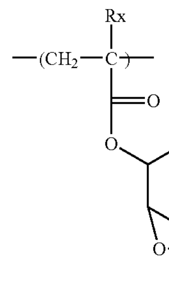
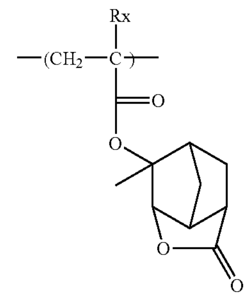
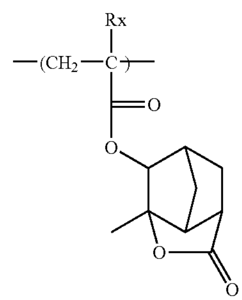
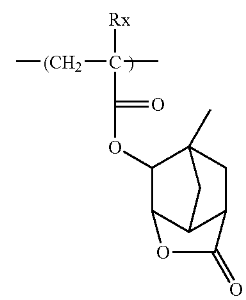
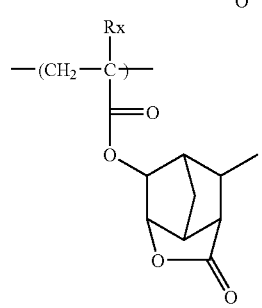
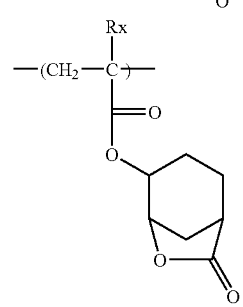
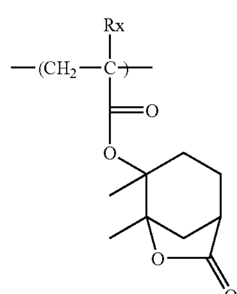
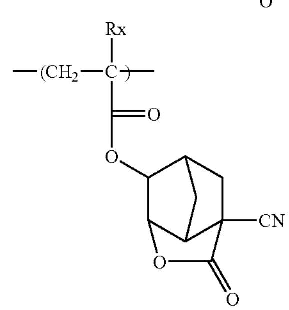

-continued
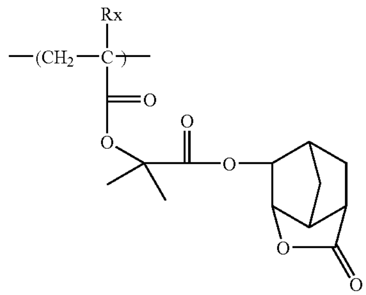
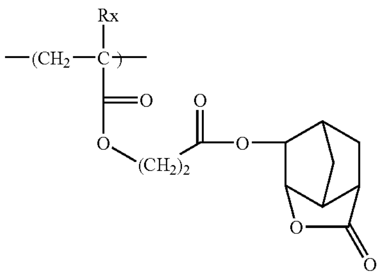
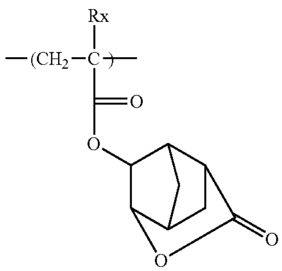
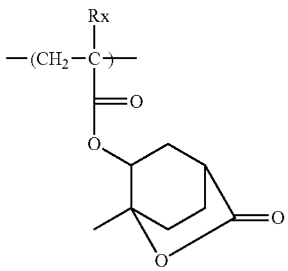
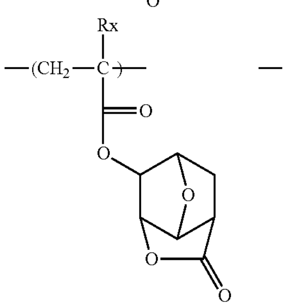
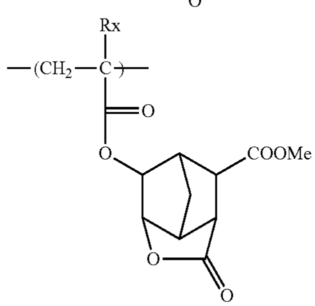
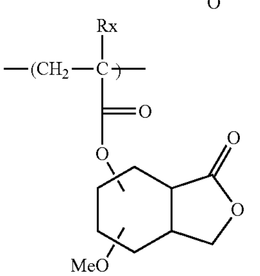
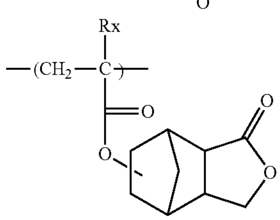
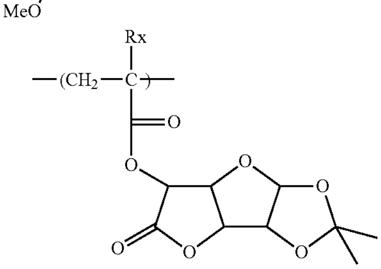
-continued
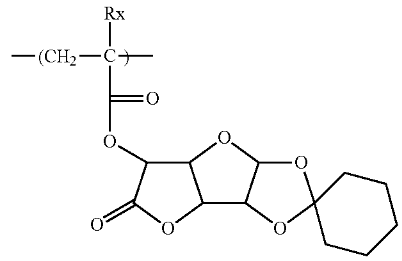
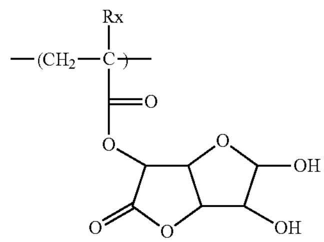
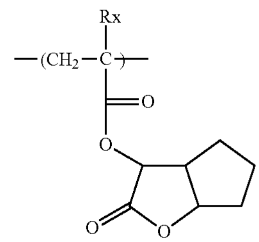
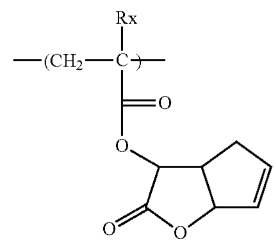
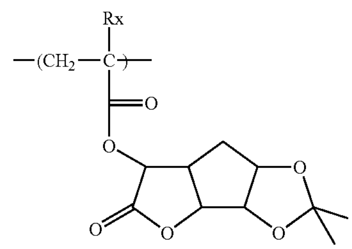
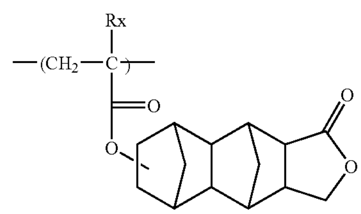
(In the formulae, Rx is H, $CH_3$, $CH_2OH$ or $CF_3$.)
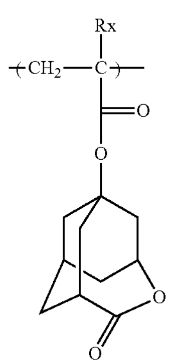
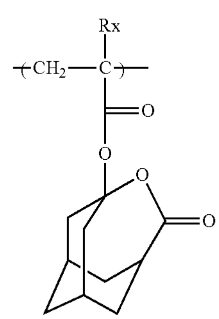
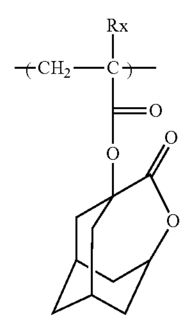

-continued
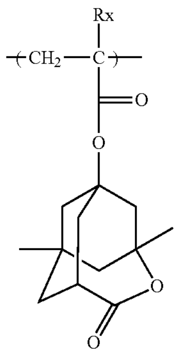
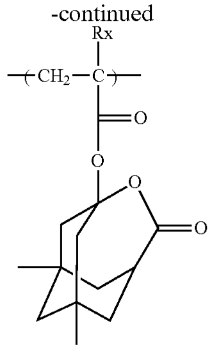
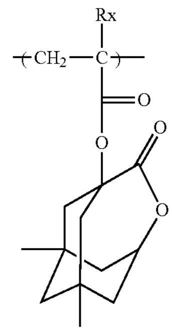
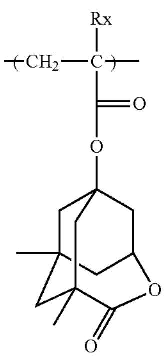
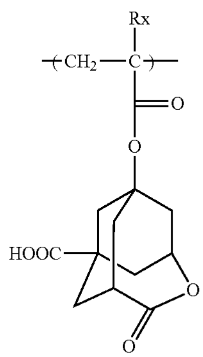
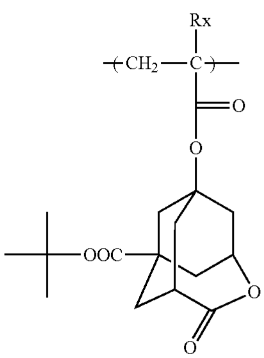
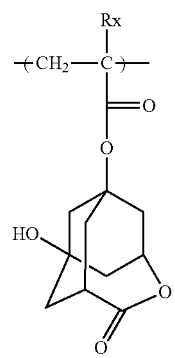
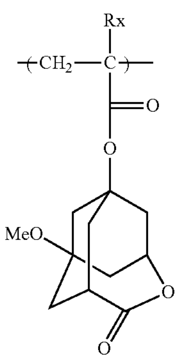
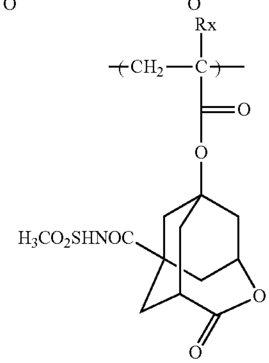
The repeating unit having a particularly preferred lactone group includes the repeating units shown below. By selecting an optimal lactone group, the pattern profile and the performance in terms of iso/dense bias are enhanced.
(In the formulae, Rx is H, $CH_3$, $CH_2OH$ or $CF_3$.)
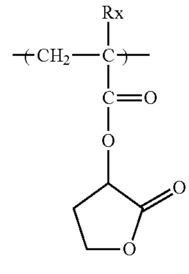
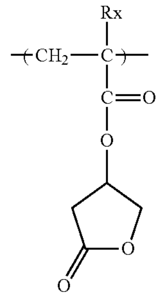
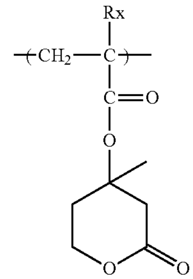
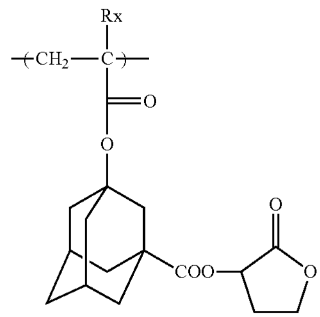
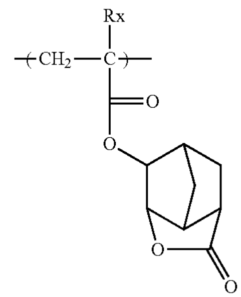
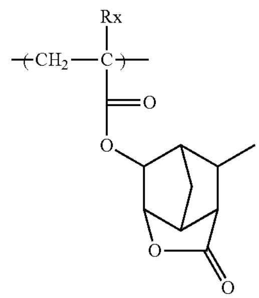
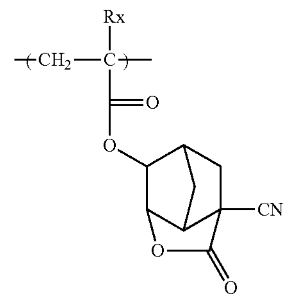
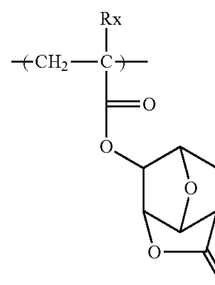
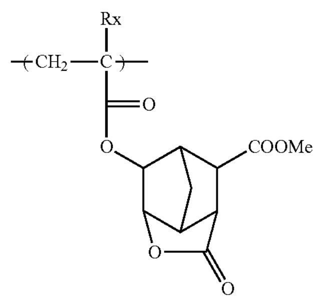
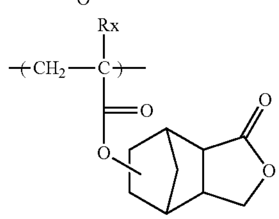
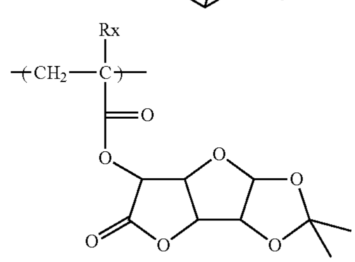

-continued

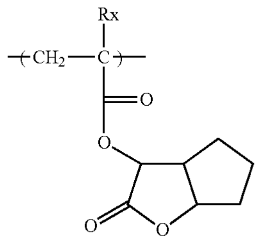

It is also preferred that the resin (A) contains a repeating unit (A1) having a lactone structure and having a cyano group on any site of the same repeating unit.

The lactone structure in the repeating unit (A1) includes, for example, a 4- to 15-membered ring lactone structure. In view of polarity and stability, the lactone is preferably a 4- to 8-membered ring lactone, more preferably a 5- or 6-membered ring lactone, still more preferably a 5-membered ring lactone.

Specific examples of the lactone structure are set forth below, but the present invention is not limited thereto.

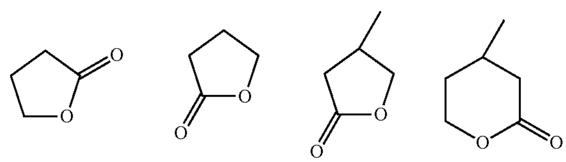

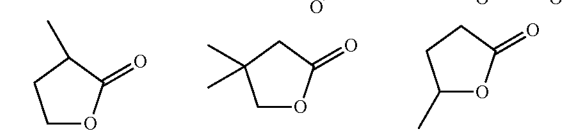

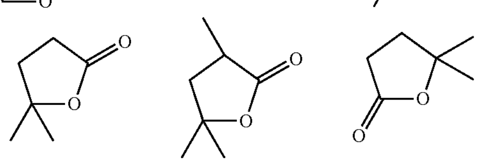

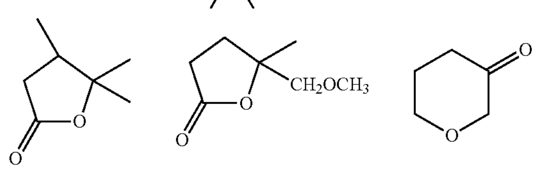

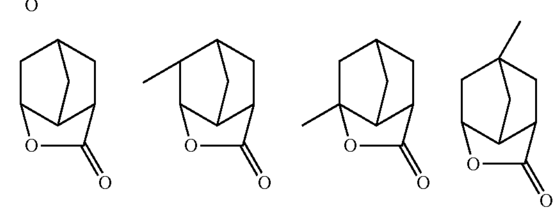

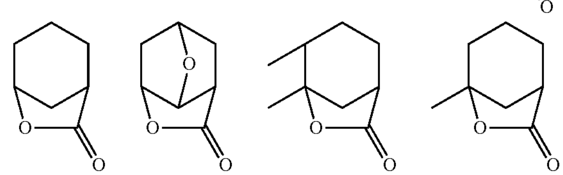

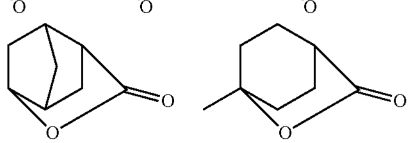

-continued

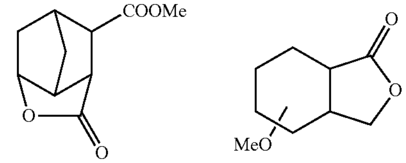

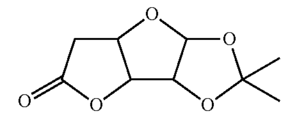

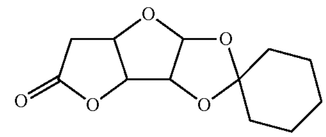

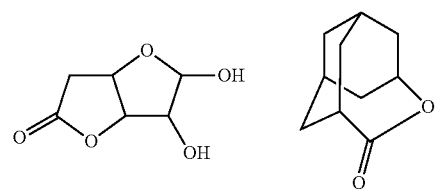

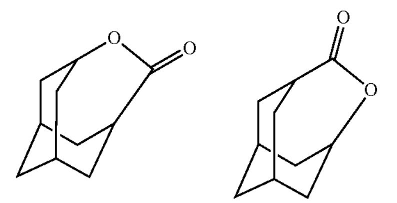

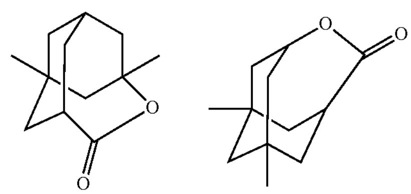

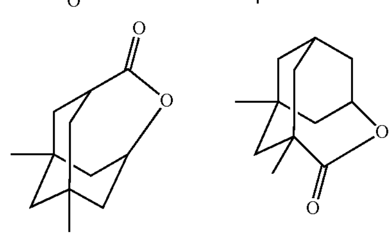

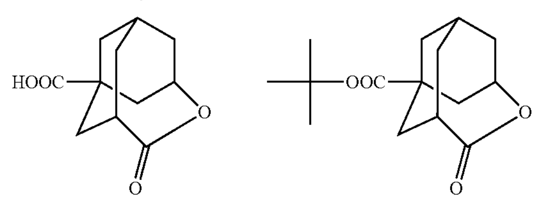

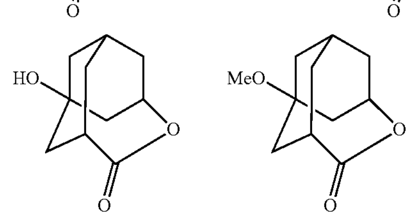

-continued

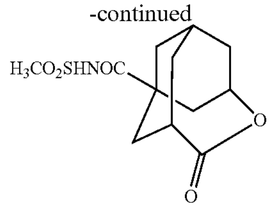

A preferred embodiment of the repeating unit (A1) is a repeating unit having the lactone structure represented by the following formula (A2):

(A2)

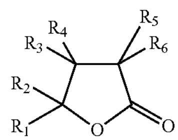

In formula (A2), $R_1$ to $R_6$ each independently represents a linking group to the resin main chain, a hydrogen atom or a substituent, provided that at least one of $R_1$ to $R_6$ represents a cyano group or a cyano group-containing substituent, and at least two members out of $R_1$ to $R_6$ may combine together to form a ring structure. At least one of $R_1$ to $R_6$ includes a linking group to the resin main chain.

Another preferred embodiment of the repeating unit (A1) is a repeating unit having the lactone structure represented by the following formula (A3):

(A3)

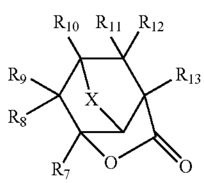

In formula (A3), $R_7$ to $R_{13}$ each independently represents a linking group to the resin main chain, a hydrogen atom or a substituent, and at least two members out of $R_7$ to $R_{13}$ may combine together to form a ring structure.

X represents —O—, —S—, —N($R^N$)$_2$— or —($CH_2$)$_n$—, wherein $R^N$ represents a hydrogen atom or a substituent and n represents 1 or 2.

Here, at least one of $R_7$ to $R_{13}$ and X is a cyano group or a cyano group-containing substituent. At least one of $R_7$ to $R_{13}$ and X includes a linking group to the resin main chain.

A preferred embodiment of the repeating unit having the lactone structure represented by formula (A2) is a repeating unit having the lactone structure represented by the following formula (A4):

(A4)

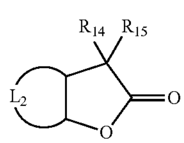

In formula (A4), $R_{14}$ and $R_{15}$ each independently represents a linking group to the resin main chain, a hydrogen atom or a substituent.

$L_2$ represents a linking group for forming a ring structure, and the linking group to the resin main chain may be substituted to $L_2$.

At least two members out of $R_{14}$, $R_{15}$ and $L_2$ may combine to form a ring structure.

Here, at least one of $R_{14}$, $R_{15}$ and $L_2$ is a cyano group or a cyano group-containing substituent. At least one of $R_{14}$, $R_{15}$ and $L_2$ includes a linking group to the resin main chain.

A preferred embodiment of the repeating unit (A1) is a repeating unit having the lactone structure represented by the following formula (A6):

(A6)

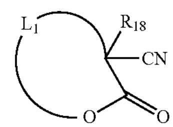

In formula (A6), $R_{18}$ represents a linking group to the resin main chain, a hydrogen atom or a substituent, $L_1$ represents a linking group for linking a carbon atom at the 2-position of the lactone ring and an oxygen atom of the lactone ring to form a lactone ring structure, and the linking group to the resin main chain may be substituted to $L_1$.

$R_{18}$ and $L_1$ may combine together to form a ring structure. At least one of $R_{18}$ and $L_1$ includes a linking group to the resin main chain.

A preferred embodiment of the repeating unit having the lactone structure represented by formula (A6) is a repeating unit having the lactone structure represented by the following formula (A7):

(A7)

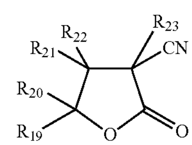

In formula (A7), $R_{19}$ to $R_{23}$ each independently represents a linking group to the resin main chain, a hydrogen atom or a substituent, and at least two members out of $R_{19}$ to $R_{23}$ may combine together to form a ring structure. At least one of $R_{19}$ to $R_{23}$ includes a linking group to the resin main chain.

In formulae (A2) to (A4), (A6) and (A7), examples of the linking group to the resin main chain include an alkylene group, a divalent linking group having a monocyclic or polycyclic alicyclic hydrocarbon structure, an ether group, an ester group (—$CO_2$—), a carbonyl group, and a divalent linking group comprising a combination thereof. The linking group to the resin main chain is preferably an ester group (—$CO_2$—) or a divalent linking group represented by —$CO_2$-$Ab_1$-$CO_2$—. $Ab_1$ represents a linear or branched alkylene group or a monocyclic or polycyclic cycloalkylene group and is preferably a methylene group, an ethylene group, a cyclohexylene group, an adamantylene group or a norbornylene group.

In formulae (A2) to (A4), (A6) and (A7), examples of the structure of the resin main chain to which the linking group to the resin main chain is bonded include the structures shown below. In the structures, the asterisk (*) is a bonding site for forming a repeating unit, and R and R' are arbitrary substituents. An arbitrary hydrogen atom in the structure of the resin main chain is substituted by the linking group for linking with the resin main chain present in formulae (A2) to (A4), (A6) and (A7).

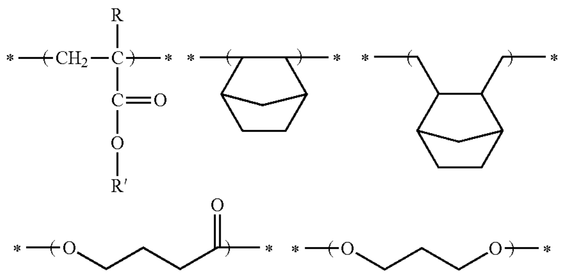

The bonding site for forming a repeating unit in the resin (A) is preferably a bonding site of a repeating unit derived from an ethylenic double bond, more preferably a bonding site of a repeating unit derived from an acrylic acid derivative. A more preferred embodiment of the repeating units having the lactone structures represented by formulae (A2) to (A4), (A6) and (A7) is a repeating unit represented by the following formula (A8):

(A8)

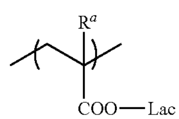

In formula (A8), $R^a$ represents a hydrogen atom or an alkyl group having a carbon number of 1 to 4, which may have a substituent.

Lac represents the lactone structure represented by any one of formulae (A2) to (A4), (A6) and (A7).

In formulae (A2) to (A4), (A6) and (A7), examples of the substituent include, in addition to a cyano group, the residue after removing the Lac group from formula (A8), and a group formed by bonding the residue with an alkylene group, cycloalkylene group, a carbonyl group or an oxy group. The substituent may further have a substituent such as cyano group.

In formulae (A2) to (A4), (A6) and (A7), examples of the ring structure formed by combining at least two substituents together include a 5- or 6-membered ring. The ring structure may have a substituent such as cyano group.

In formulae (A4), examples of the ring structure formed by $L_2$ include a norbornane structure. The ring structure may have a substituent such as cyano group or may have a bonding site.

The content of the repeating unit having a cyano lactone group is preferably from 10 to 70 mol %, more preferably from 20 to 50 mol %, based on all repeating units in the polymer.

Specific examples of the repeating unit represented by formula (A1) are set forth below, but the present invention is not particularly limited thereto. In specific examples, the methyl group may be a hydrogen atom.

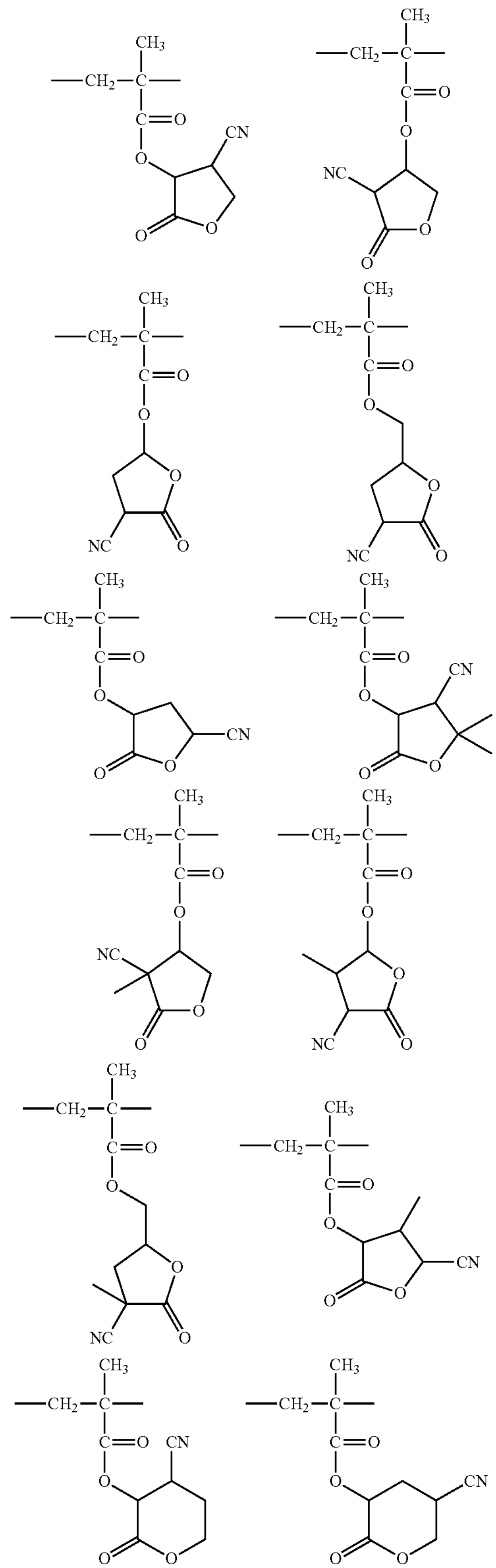

-continued
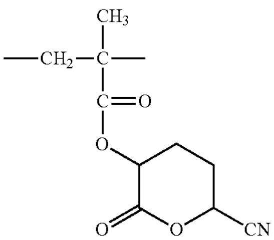
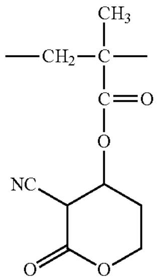
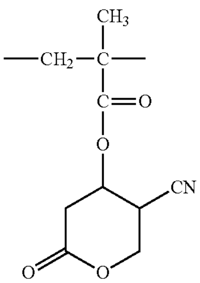
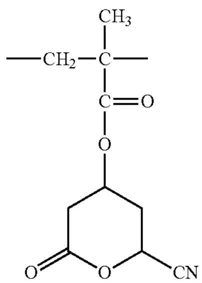
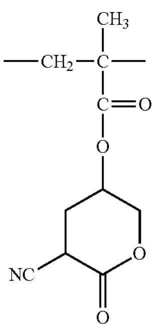
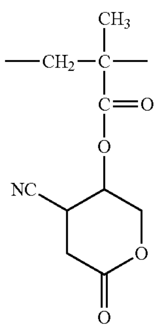
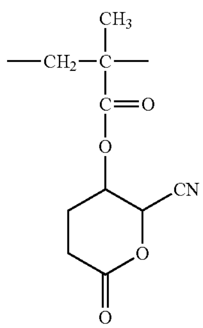
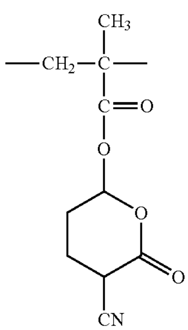
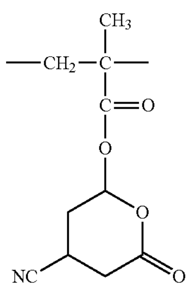
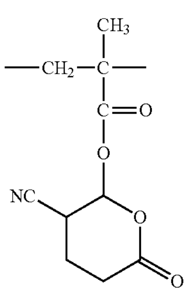
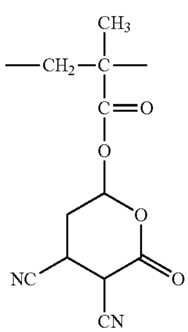
-continued
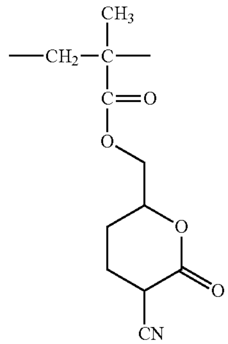
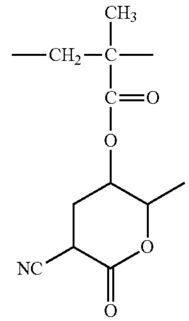
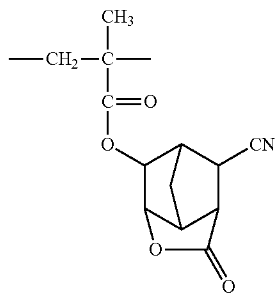
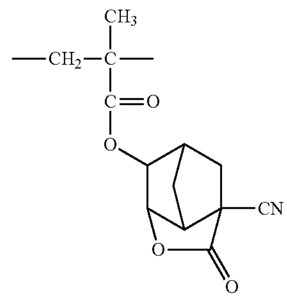
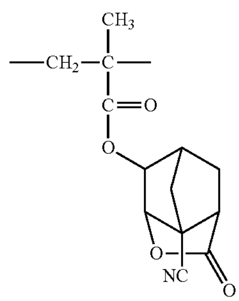
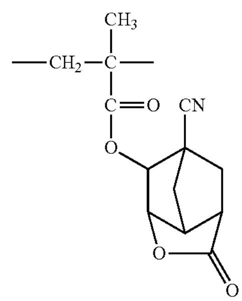
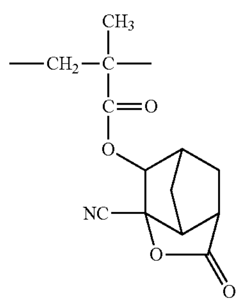
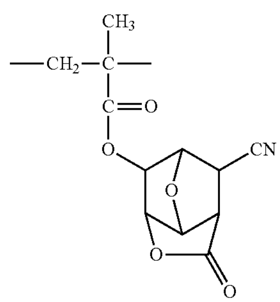
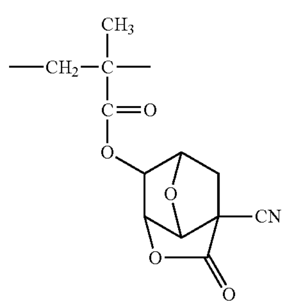
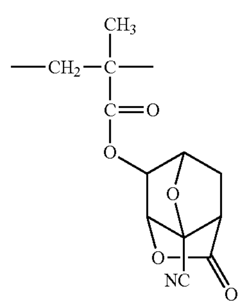

-continued
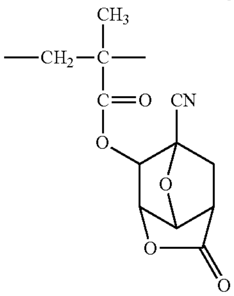
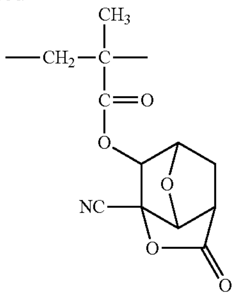
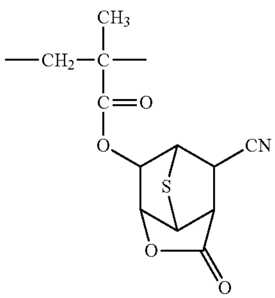
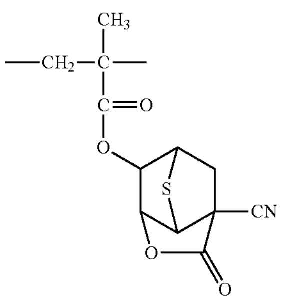
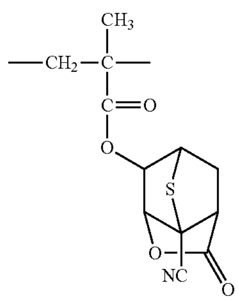
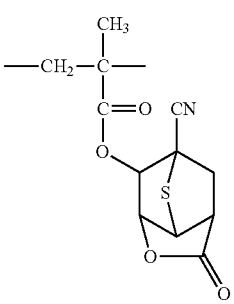
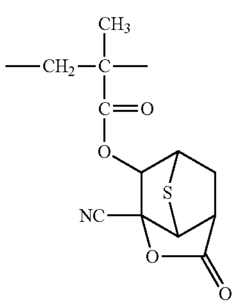
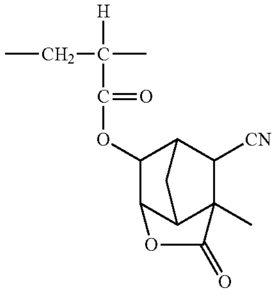
-continued
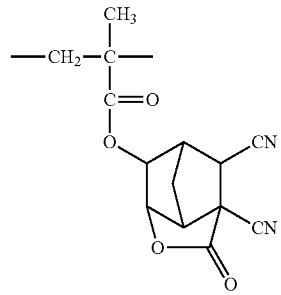
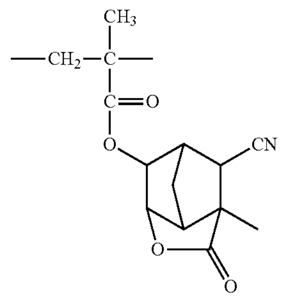
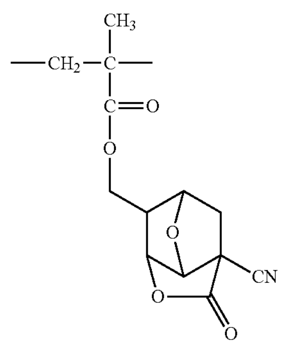
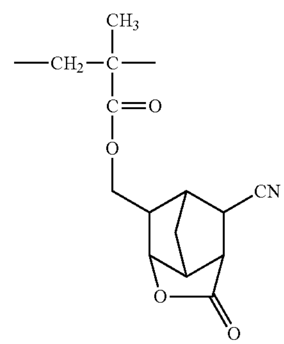
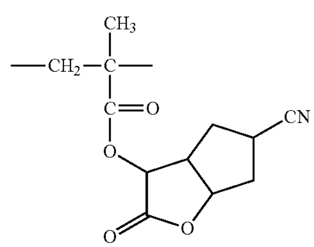
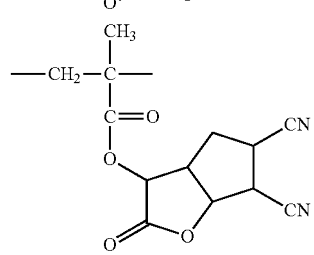
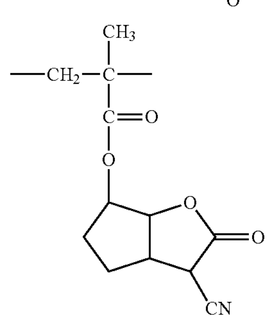
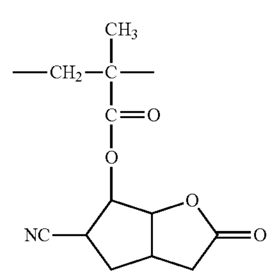

-continued
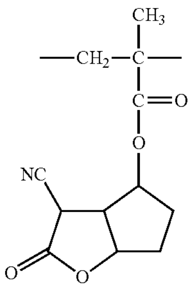
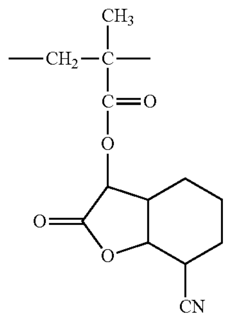
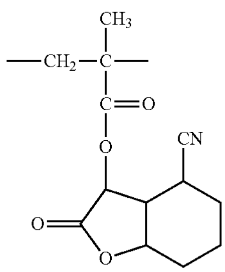
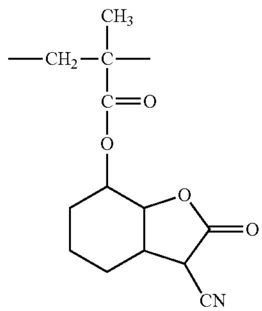
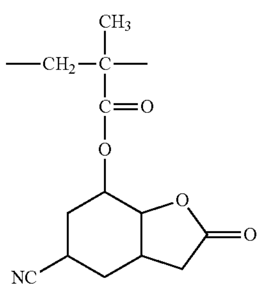
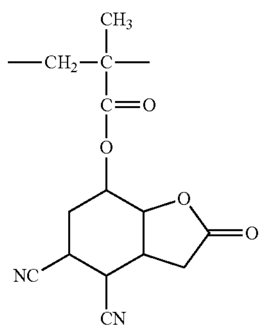
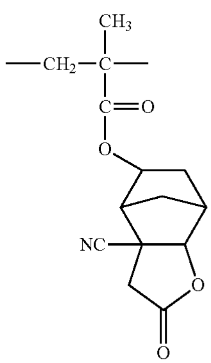
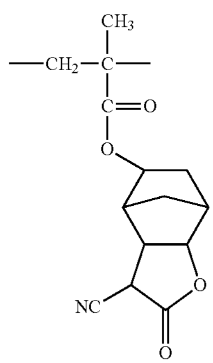
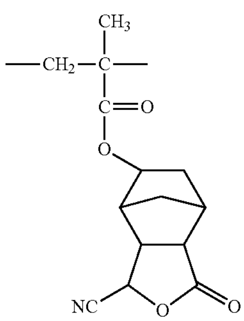
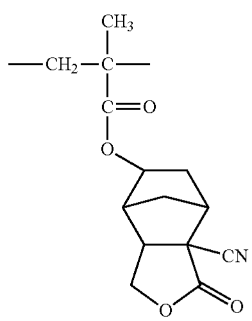
-continued
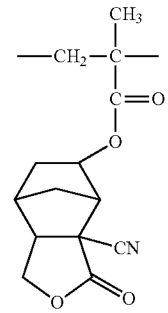
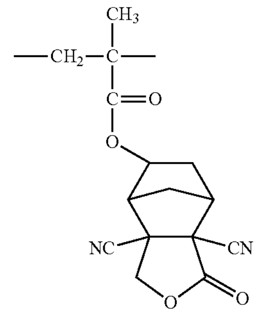
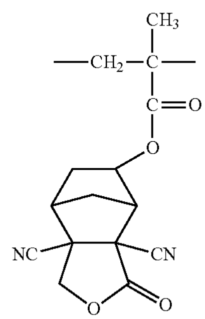
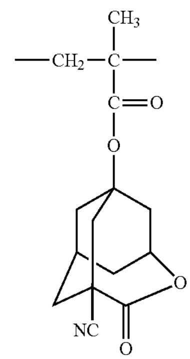
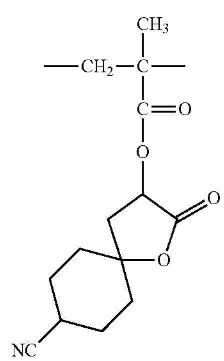
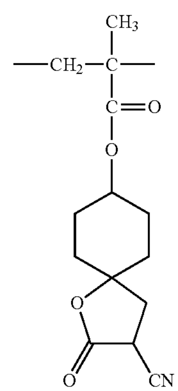
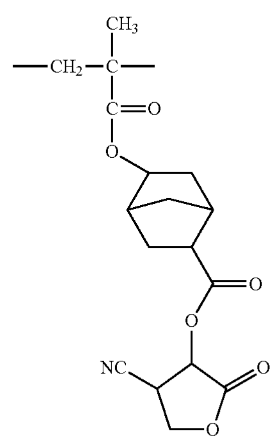

-continued

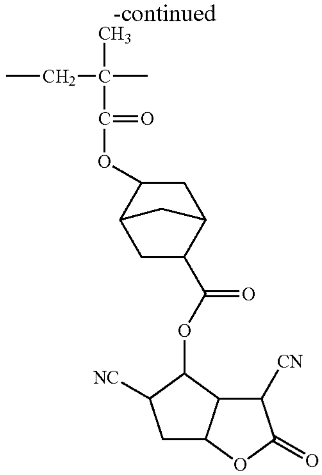

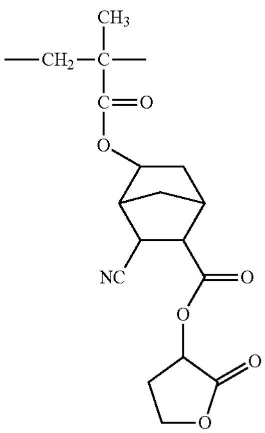

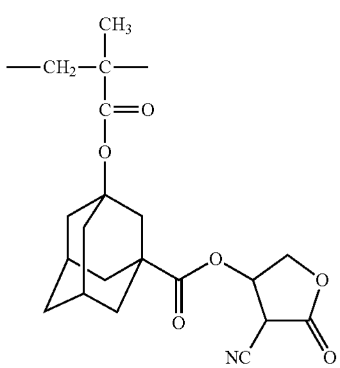

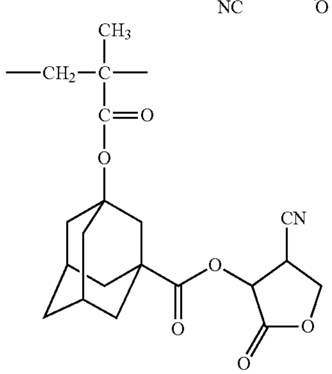

-continued

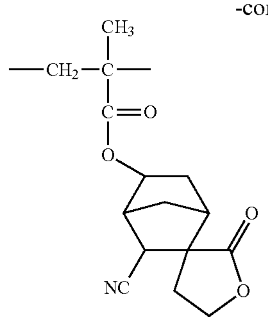

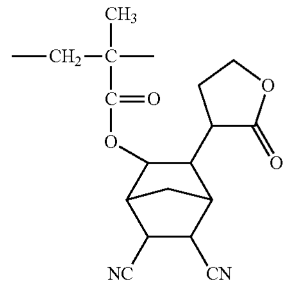

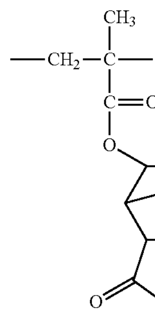

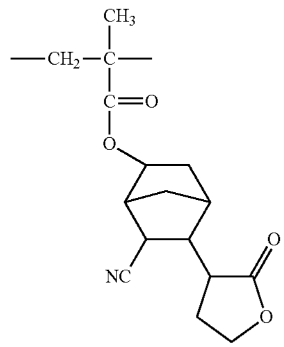

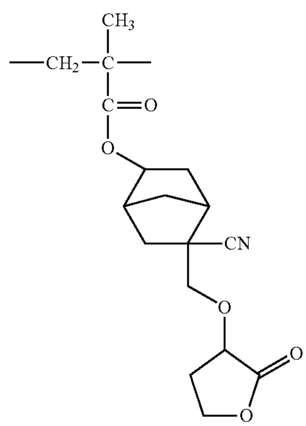

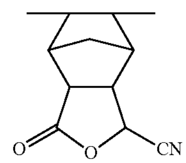

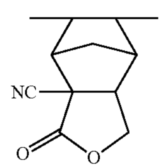

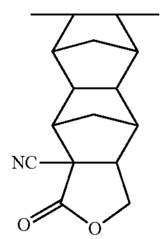

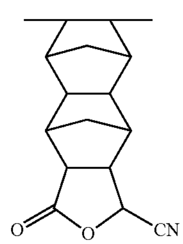

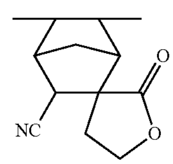

In addition to the repeating unit having an acid-decomposable group and the repeating unit having a lactone structure described above, the resin (A) preferably further contains a repeating unit having a hydroxyl group or a cyano group. By virtue of this repeating unit, the adherence to substrate and the affinity for developer are enhanced. The repeating unit having a hydroxyl group or a cyano group is preferably a repeating unit having an alicyclic hydrocarbon structure substituted by a hydroxyl group or a cyano group. The alicyclic hydrocarbon structure in the alicyclic hydrocarbon structure substituted by a hydroxyl group or a cyano group is preferably an adamantyl group, a diamantyl group or a norbornane group. The alicyclic hydrocarbon structure substituted by a hydroxyl group or a cyano group is preferably a partial structure represented by any one of the following formulae (VIIa) to (VIId):

(VIIa)

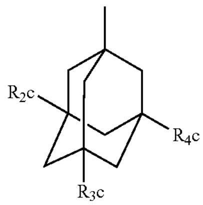

(VIIb)

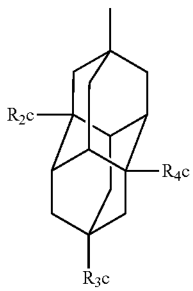

(VIIc)

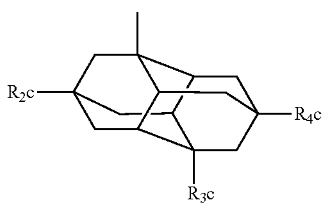

(VIId)

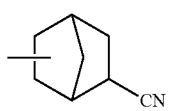

In formulae (VIIa) to (VIIc), $R_2c$ to $R_4c$ each independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by any one of formulae (VIIa) to (VIId) includes repeating units represented by the following formulae (AIIa) to (AIId):

(AIIa)

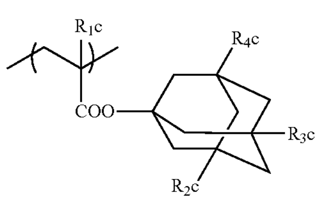

-continued (AIIb)

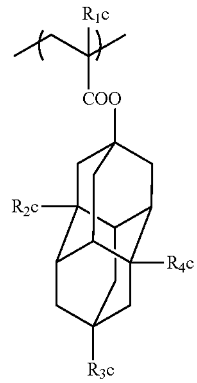

(AIIc)

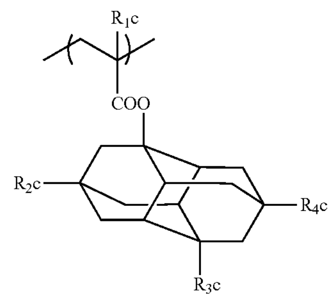

(AIId)

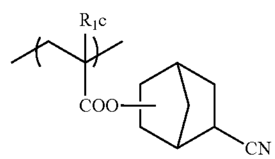

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The content of the repeating unit having an alicyclic hydrocarbon structure substituted by a hydroxyl group or a cyano group is preferably from 5 to 40 mol %, more preferably from 5 to 30 mol %, still more preferably from 10 to 25 mol %, based on all repeating units in the polymer.

Specific examples of the repeating unit having a hydroxyl group or a cyano group are set forth below, but the present invention is not limited thereto.

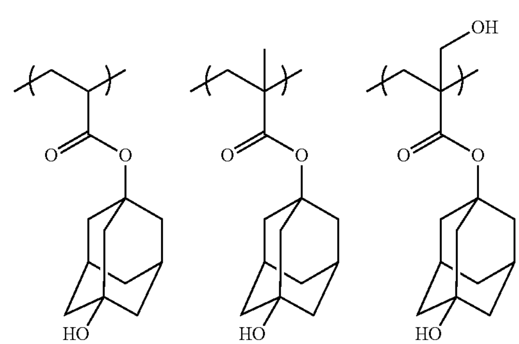

-continued

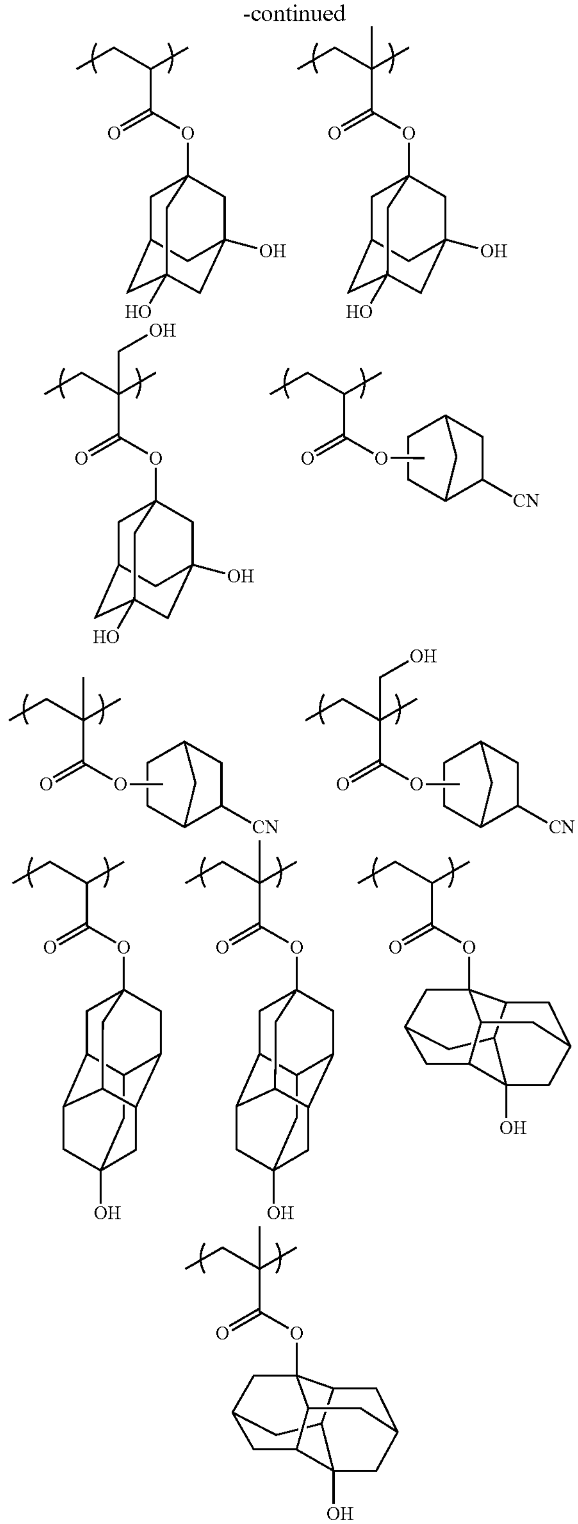

The resin (A) preferably contains a repeating unit having an alkali-soluble group. The alkali-soluble group includes a carboxyl group, a sulfonamide group, a sulfonylimide group, a bisulfonylimide group, and an aliphatic alcohol with the α-position being substituted by an electron-withdrawing group, such as hexafluoroisopropanol group. A repeating unit having a carboxyl group is more preferred. By virtue of containing the repeating unit having an alkali-soluble group, the resolution increases in the usage of forming contact holes. As for the repeating unit having an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic cyclohydrocarbon structure. In particular, a repeating unit by an acrylic acid or a methacrylic acid is preferred.

The content of the repeating unit having an alkali-soluble group is preferably from 0 to 20 mol %, more preferably from 3 to 15 mol %, still more preferably from 5 to 10 mol %, based on all repeating units in the polymer.

Specific examples of the repeating unit having an alkali-soluble group are set forth below, but the present invention is not limited thereto.

(In the formulae, Rx is H, $CH_3$, $CF_3$ or $CH_2OH$.)

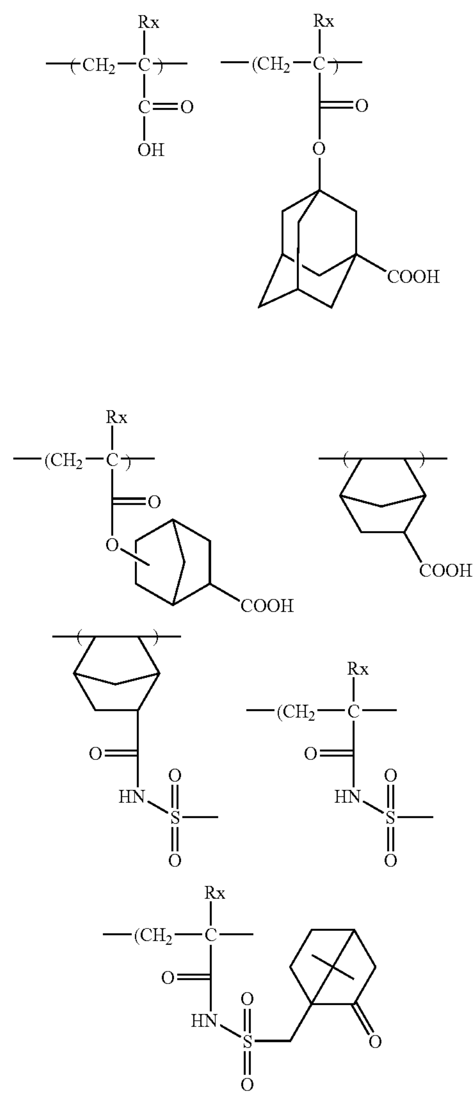

-continued

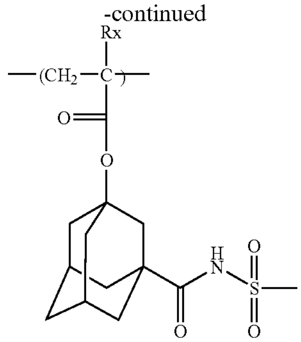

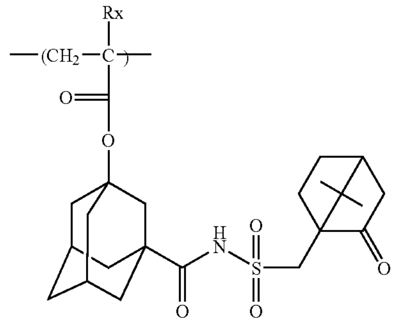

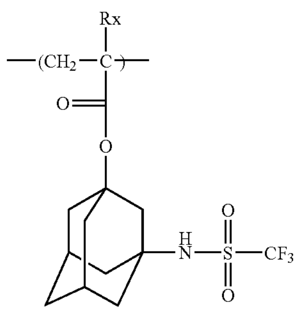

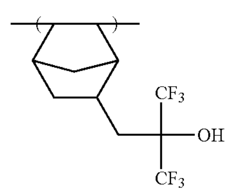

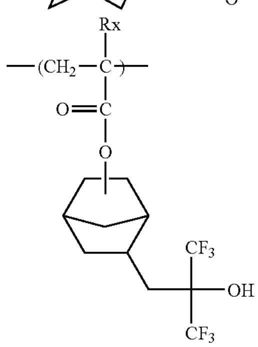

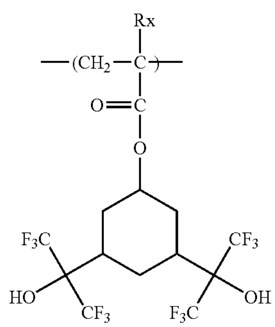

The repeating unit having at least one kind of a group selected from a lactone group, a hydroxyl group, a cyano group and an alkali-soluble group is more preferably a repeating unit having at least two groups selected from a lactone group, a hydroxyl group, a cyano group and an alkali-soluble group, still more preferably a repeating unit having a cyano group and a lactone group, yet still more preferably a repeating unit having a structure where a cyano group is substituted to the lactone structure of (LCI-4) above.

The resin (A) for use in the present invention preferably contains a repeating unit having a polar group-free alicyclic hydrocarbon structure and not exhibiting acid decomposability. By containing such a repeating unit, the dissolving out of low molecular components from the resist film to the immersion liquid at the immersion exposure can be reduced. This repeating unit includes a repeating unit represented by the following formula (3):

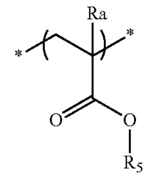
(3)

In formula (3), $R_5$ represents a hydrocarbon group having at least one cyclic structure and having neither a hydroxyl group nor a cyano group.

Ra represents a hydrogen atom, an alkyl group or a $—CH_2—O—Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure possessed by $R_5$ includes a monocyclic hydrocarbon group and a polycyclic hydrocarbon group. Examples of the monocyclic hydrocarbon group include a cycloalkyl group having a carbon number of 3 to 12, and a cycloalkenyl group having a carbon number of 3 to 12. The monocyclic hydrocarbon group is preferably a monocyclic hydrocarbon group having a carbon number of 3 to 7.

The polycyclic hydrocarbon group includes a ring gathered hydrocarbon group and a crosslinked cyclic hydrocarbon group. Examples of the crosslinked cyclic hydrocarbon ring include a bicyclic hydrocarbon ring, a tricyclic hydrocarbon ring and a tetracyclic hydrocarbon ring. The crosslinked cyclic hydrocarbon ring also includes a condensed cyclic hydrocarbon ring (for example, a condensed ring formed by condensing a plurality of 5- to 8-membered cycloalkane rings). The crosslinked cyclic hydrocarbon ring is preferably a norbornyl group or an adamantyl group.

Such an alicyclic hydrocarbon group may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. For example, the alkyl group is preferably an alkyl group having a carbon number of 1 to 4, the substituted methyl group is preferably a methoxymethyl group, a methoxythiomethyl group, a benzyloxymethyl group, a tert-butoxymethyl group or a 2-methoxyethoxymethyl group, the substituted ethyl group is preferably a 1-ethoxyethyl group or a 1-methyl-1-methoxyethyl group, the acyl group is preferably an aliphatic acyl group having a carbon number of 1 to 6, such as formyl group, acetyl group, propionyl group, butyryl group, isobutyryl group, valeryl group and pivaloyl group, and the alkoxycarbonyl group is preferably an alkoxycarbonyl group having a carbon number of 2 to 4.

The content of the repeating unit having a polar group-free alicyclic hydrocarbon structure and not exhibiting acid decomposability is preferably from 0 to 40 mol %, more preferably from 0 to 20 mol %, based on all repeating units in the resin (A).

Specific examples of the repeating unit having a polar group-free alicyclic hydrocarbon structure and not exhibiting acid decomposability are set forth below, but the present invention is not limited thereto. In the formulae, Ra represents H, $CH_3$, $CH_2OH$ or $CF_3$.

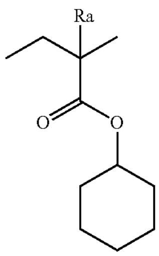
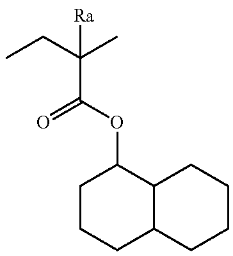
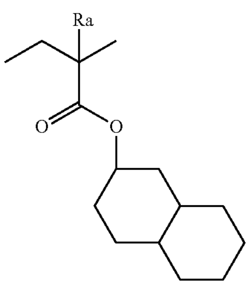
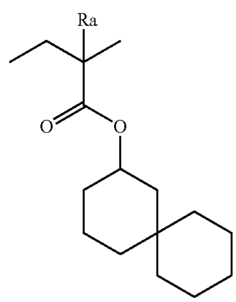
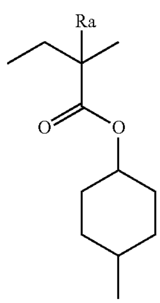
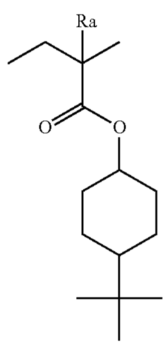
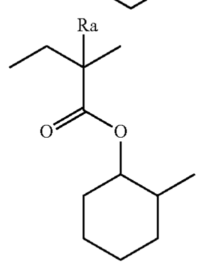
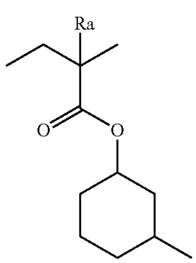
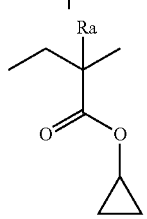
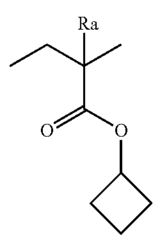
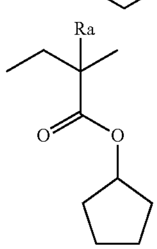
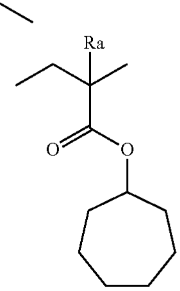
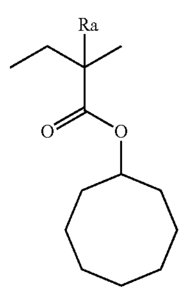

-continued

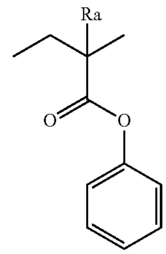
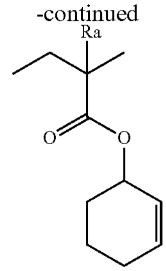
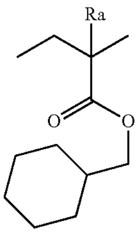
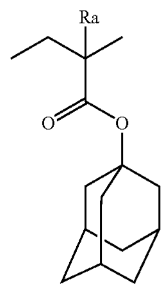
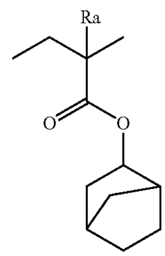
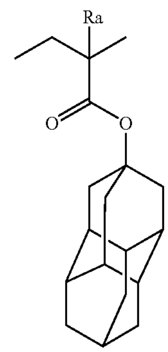
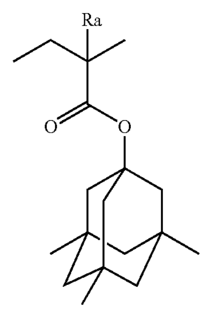

The resin (A) may contain, in addition to the above-described repeating structural units, various repeating structural units for the purpose of controlling the dry etching resistance, suitability for standard developer, adherence to substrate, resist profile and properties generally required of the resist, such as resolution, heat resistance and sensitivity.

Examples of such a repeating structural unit include, but are not limited to, repeating structural units corresponding to the monomers described below.

By virtue of such a repeating structural unit, the performance required of the resin (A), particularly, (1) solubility in coating solvent, (2) film-forming property (glass transition point), (3) alkali developability, (4) film loss (selection of hydrophilic, hydrophobic or alkali-soluble group), (5) adherence of unexposed area to substrate, (6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (A), the molar ratio of respective repeating structural units contained is appropriately determined to control the dry etching resistance of resist, suitability for standard developer, adherence to substrate, resist profile and performances generally required of the resist, such as resolution, heat resistance and sensitivity.

In the case of using the positive resist composition of the present invention for ArF exposure, the resin (A) preferably has no aromatic group in view of transparency to ArF light.

Also, the resin as (A) preferably contains no fluorine atom and no silicon atom in view of compatibility with a hydrophobic resin (HR) described later.

The resin (A) is preferably a resin where all repeating units are composed of a (meth)acrylate-based repeating unit. In this case, the repeating units all may be a methacrylate-based repeating unit, all may be an acrylate-based repeating unit, or all may comprise a methacrylate-based repeating unit and an acrylate-based repeating unit, but the content of the acrylate-based repeating unit is preferably 50 mol % or less based on all repeating units. The resin is more preferably a copolymerized polymer containing from 20 to 50 mol % of an acid decomposable group-containing (meth)acrylate-based repeating unit represented by formula (AT), from 20 to 50 mol % of a (meth)acrylate-based repeating unit having a lactone group, from 5 to 30 mol % of a (meth)acrylate-based repeating unit having an alicyclic hydrocarbon structure substituted by a hydroxyl group or a cyano group, and from 0 to 20 mol % of other (meth)acrylate-based repeating units.

In the case where the positive resist composition of the present invention is irradiated with KrF excimer laser light, electron beam, X-ray or high-energy beam at a wavelength of 50 nm or less (e.g., EUV), the resin (A) preferably further contains a hydroxystyrene-based repeating unit, more preferably a hydroxystyrene-based repeating unit, a hydroxystyrene-based repeating unit protected by an acid-decomposable group, and an acid-decomposable repeating unit such as tertiary alkyl (meth)acrylate, in addition to the repeating unit represented by formula (AT).

Preferred examples of the repeating unit having an acid-decomposable group include a repeating unit composed of a tert-butoxycarbonyloxystyrene, a 1-alkoxyethoxystyrene or a tertiary alkyl (meth)acrylate. A repeating unit composed of a 2-alkyl-2-adamantyl (meth)acrylate or a dialkyl(1-adamantyl)methyl (meth)acrylate is more preferred.

The resin (A) can be synthesized by an ordinary method (for example, radical polymerization). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the positive resist composition of the present invention. By the use of this solvent, production of particles during storage can be suppressed.

The polymerization reaction is preferably performed in an inert gas atmosphere such as nitrogen and argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methyl-propionate). The initiator is added additionally or in parts, if desired. After the completion of reaction, the reaction product is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 60 to 100° C. (In this specification, mass ratio is equal to weight ratio.)

The weight average molecular weight of the resin (A) is preferably from 1,000 to 200,000, more preferably from 2,000 to 20,000, still more preferably from 3,000 to 15,000, yet still more preferably from 3,000 to 10,000, in terms of polystyrene by the GPC method. When the weight average molecular weight is from 1,000 to 200,000, the heat resistance, dry etching resistance and developability can be prevented from deterioration and also, the film-forming property can be prevented from deteriorating due to high viscosity.

The dispersity (molecular weight distribution) is usually from 1 to 3, preferably from 1 to 2.6, more preferably from 1 to 2, still more preferably from 1.4 to 1.7. As the molecular weight distribution is smaller, the resolution and resist profile are more excellent, the side wall of the resist pattern is smoother, and the property in terms of roughness is more improved.

In the positive resist composition of the present invention, the amount of the resin (A) blended in the entire composition is preferably from 50 to 99 mass %, more preferably from 60 to 95 mass %, based on the entire solid content.

In the present invention, as for the resin (A), one species may be used or a plurality of species may be used in combination.

(B) Compound Capable of Generating an Acid Upon Irradiation with an Actinic Ray or Radiation The positive photosensitive composition of the present invention contains a compound capable of generating an acid upon irradiation with an actinic ray or radiation (hereinafter sometimes referred to as an "acid generator").

The acid generator which can be used may be appropriately selected from a photo-initiator for cationic photopolymerization, a photo-initiator for radical photopolymerization, a photo-decoloring agent for dyes, a photo-discoloring agent, a compound known to generate an acid upon irradiation with an actinic ray or radiation and used for microresist or the like, and a mixture thereof.

Examples of such an acid generator include a diazonium salt, a phosphonium salt, a sulfonium salt, an iodonium salt, imidosulfonate, oxime sulfonate, diazodisulfone, disulfone and o-nitrobenzyl sulfonate.

Also, a compound where a group or compound capable of generating an acid upon irradiation with an actinic ray or radiation is introduced into the main or side chain of a polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the acid generators, compounds represented by the following formulae (ZI), (ZII) and (ZIII) are preferred.

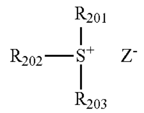

ZI

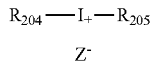

ZII

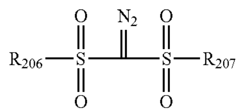

ZIII

In formula (ZI), $R_{201}$, $R_{202}$ and $R_{203}$ each independently represents an organic group.

The number of carbons in the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction and this anion can suppress the decomposition with aging due to intramolecular nucleophilic reaction. By this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion each may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further include an alkyl group (preferably having a carbon number of 1 to 15).

Examples of the aliphatic moiety in the aliphatic carboxylate anion include the same alkyl group and cycloalkyl group as in the aliphatic sulfonate anion.

Examples of the aromatic group in the aromatic carboxylate anion include the same aryl group as in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group and a naphthylethyl group.

The alkyl group, cycloalkyl group, aryl group and aralkyl group in the aliphatic carboxylate anion, aromatic carboxylate anion and aralkylcarboxylate anion each may have a substituent. Examples of the substituent of the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted by a fluorine atom at the $\alpha$-position of the sulfonic acid, an aromatic sulfonate anion substituted by a fluorine atom or a fluorine atom-containing group, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

Examples of the organic group as $R_{201}$, $R_{202}$ and $R_{203}$ include the corresponding groups in the compounds (ZI-1), (ZI-2) and (ZI-3) described later.

The compound may be a compound having a plurality of structures represented by formula (ZI), for example, a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkyl-sulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene). In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

$R_{201}$ to $R_{203}$ each independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C═O at the 2-position of the above-described alkyl group.

The 2-oxocycloalkyl group is preferably a group having >C═O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

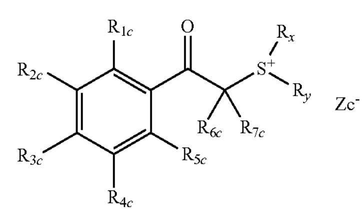

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{5c}$, a pair of $R_{6c}$ and $R_{7c}$, or a pair of $R_x$ and $R_y$ may combine together to form a ring structure. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{2c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

$R_x$ and $R_y$ each is preferably an alkyl or cycloalkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene).

The alkyl group and cycloalkyl group in $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

The aryl group, alkyl group and cycloalkyl group of $R_{204}$ to $R_{207}$ each may have a substituent. Examples of the substituent which the aryl group, alkyl group and cycloalkyl group of $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

$$Ar_3—SO_2—SO_2—Ar_4 \quad \text{ZIV}$$

ZV

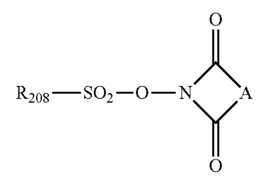

ZVI

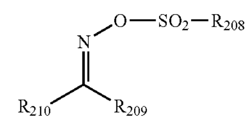

In formulae (ZIV) to (ZVI), $Ar_3$ and $Ar_4$ each independently represents an aryl group.

$R_{208}$, $R_{209}$ and $R_{210}$ each independently represents an alkyl group, a cycloalkyl group or an aryl group.

A represents an alkylene group, an alkenylene group or an arylene group.

Among the acid generators, more preferred are the compounds represented by formulae (ZI) to (ZIII).

The acid generator is preferably a compound that generates an acid having one sulfonic acid group or imide group, more preferably a compound that generates a monovalent perfluoroalkanesulfonic acid, a compound that generates a monovalent aromatic sulfonic acid substituted by a fluorine atom or a fluorine atom-containing group, or a compound that generates a monovalent imide acid substituted by a fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generated from the acid generator which can be used is preferably a fluoro-substituted alkanesulfonic acid, fluoro-substituted benzenesulfonic acid or fluoro-substituted imide acid having a pKa of −1 or less and in this case, the sensitivity can be enhanced.

Out of the acid generators, particularly preferred examples are set forth below.
(z1)
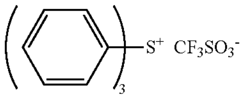
(z2)
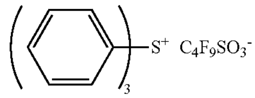
(z3)
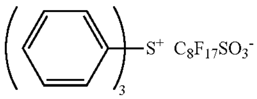
(z4)
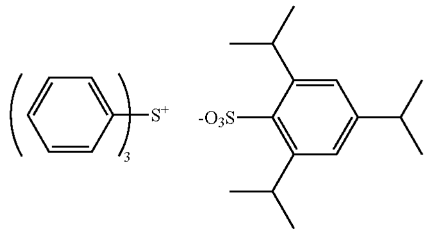
(z5)
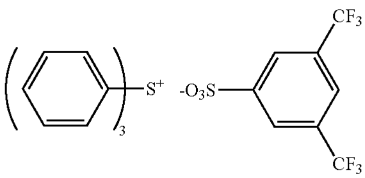
(z6)
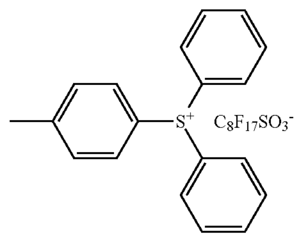
(z7)
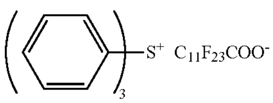
(z8)
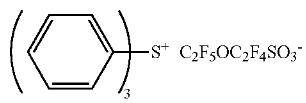
(z9)
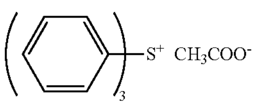
(z10)
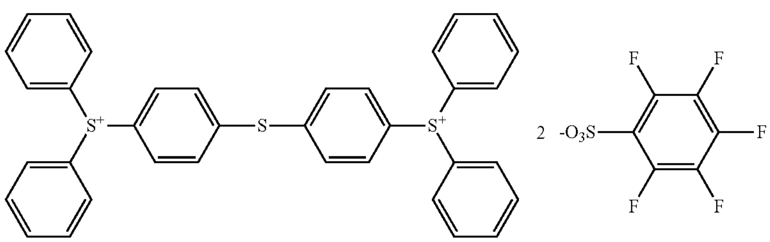
(z11)
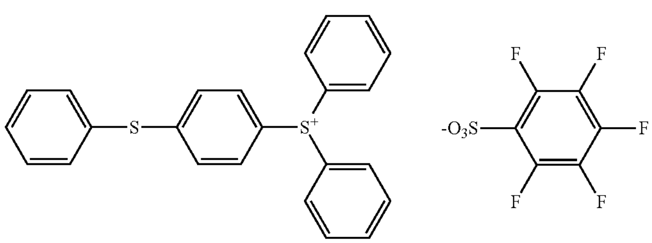
(z12)
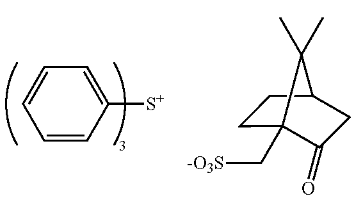
(z13)
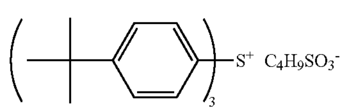

-continued
(z14)
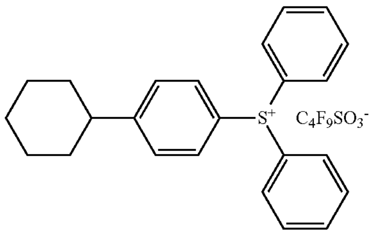
(z15)
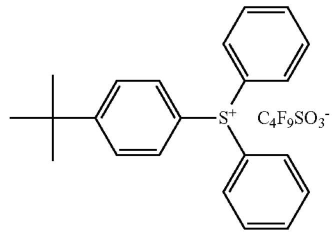
(z16)
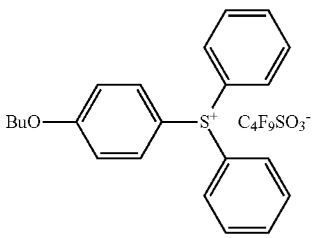
(z17)
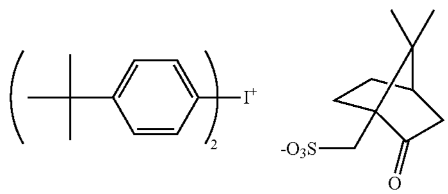
(z18)
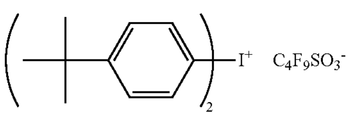
(z19)
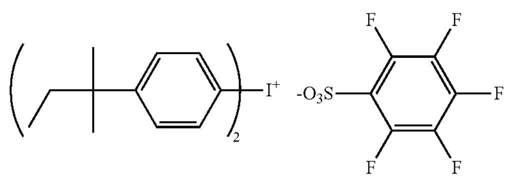
(z20)
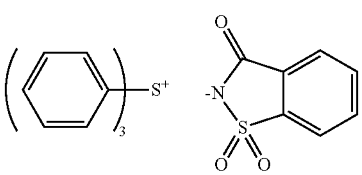
(z21)
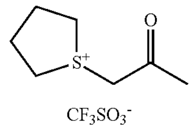
(z22)
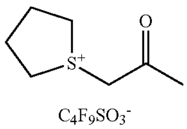
(z23)
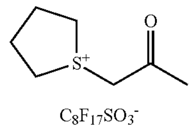
(z24)
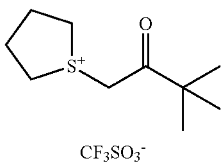
(z25)
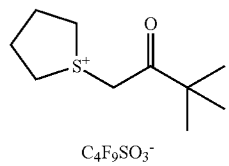
(z26)
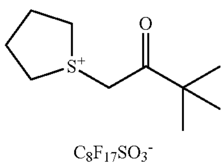
(z27)
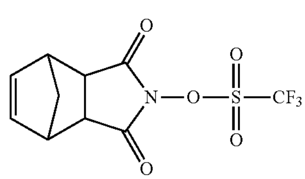
(z28)
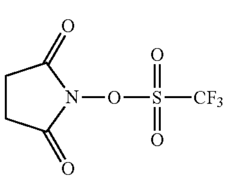
(z29)
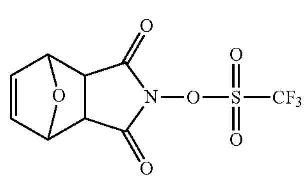

-continued
(z30)
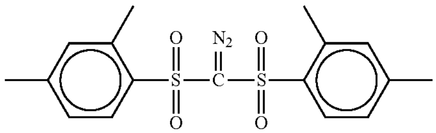
(z31)
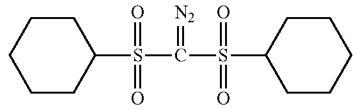
(z32)
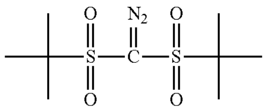
(z33)
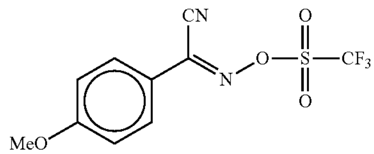
(z34)
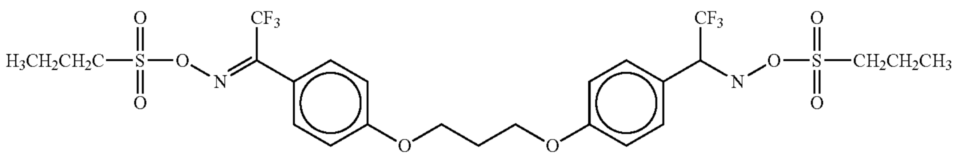
(z35)
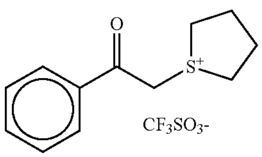
(z36)
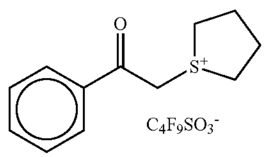
(z37)
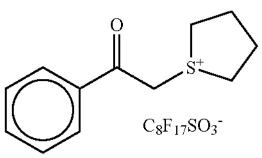
(z38)
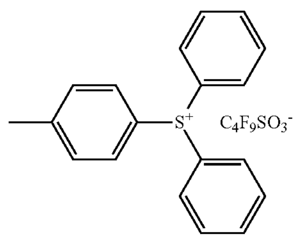
(z39)
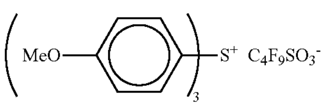
(z40)
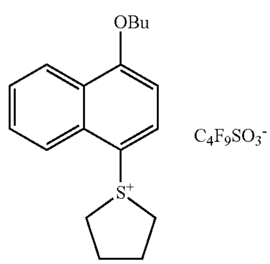
(z41)
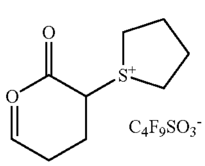
(z42)
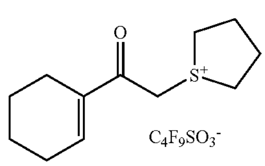
(z43)
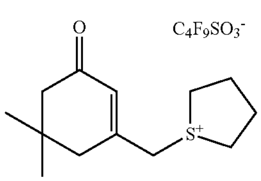
(z44)
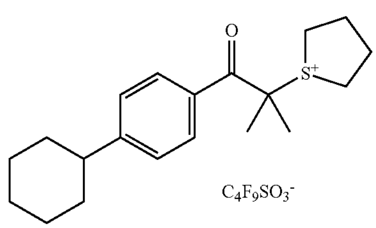

-continued
(z45)
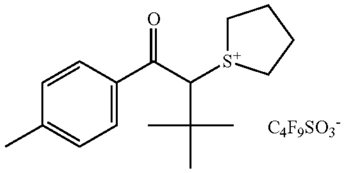
(z46)
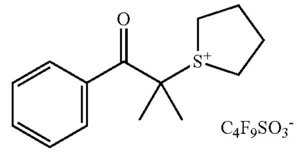
(z47)
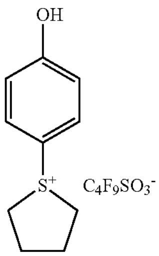
(z48)
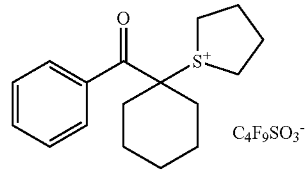
(z49)
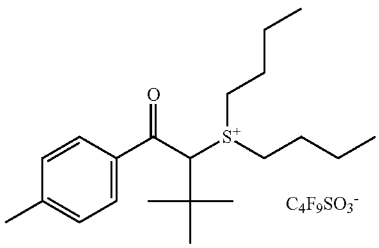
(z50)
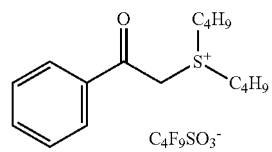
(z51)
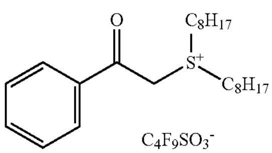
(z52)
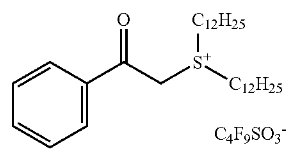
(z53)
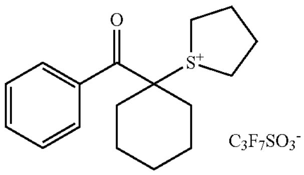
(z54)
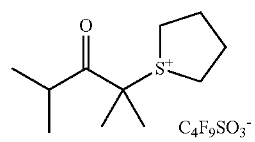
(z55)
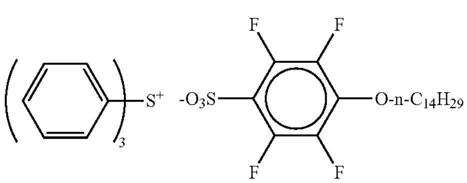
(z56)
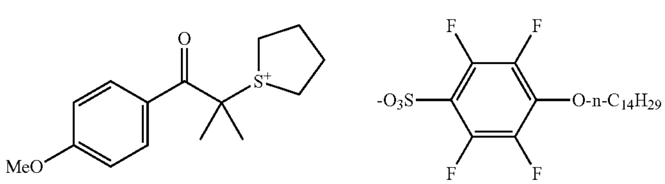
(z57)
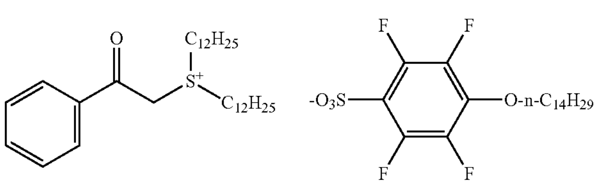

-continued
(z58)
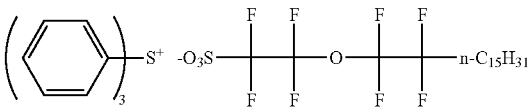
(z59)
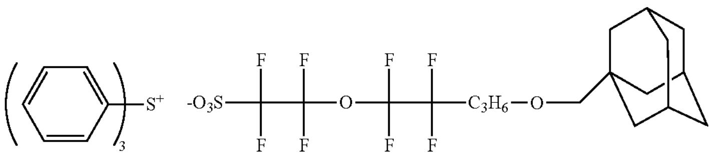
(z60)
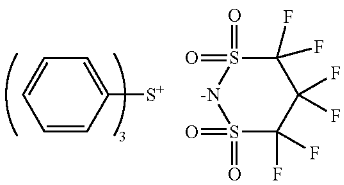
(z61)
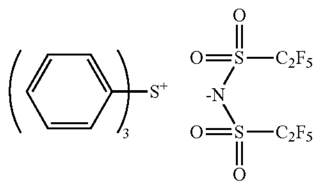
(z62)
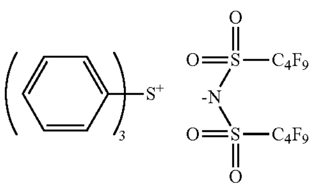
(z63)
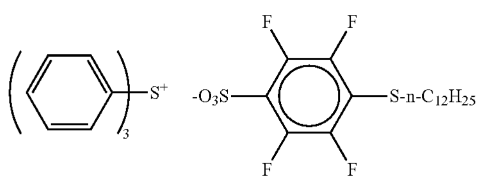
(z64)
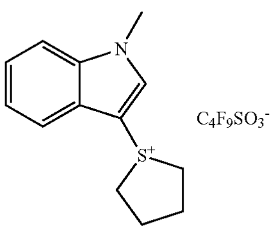
(z65)
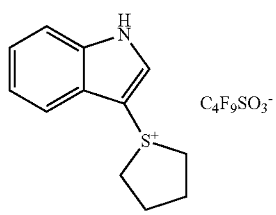
(z66)
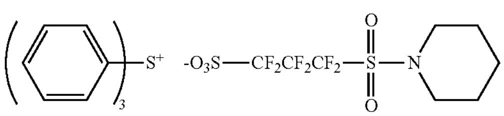
(z67)
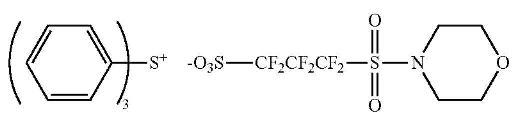
(z68)
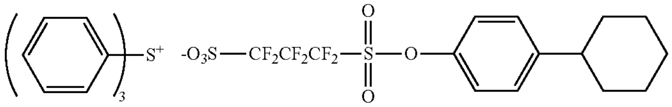
(z69)
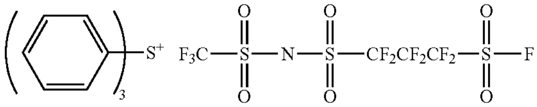
(z70)
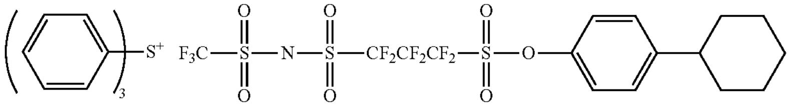

-continued
(z71)
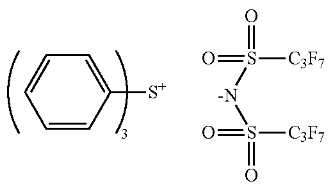
(z72)
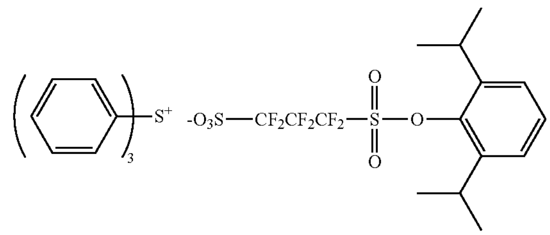
(z73)
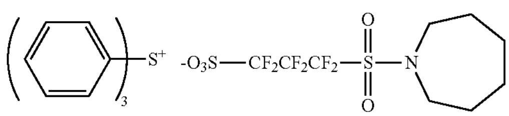
(z74)
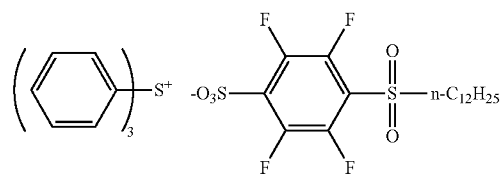
(z75)
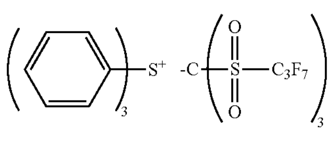
(z76)
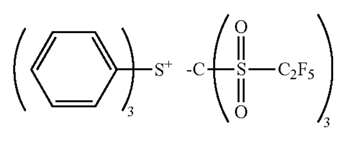
(z77)
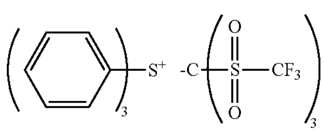
(z78)
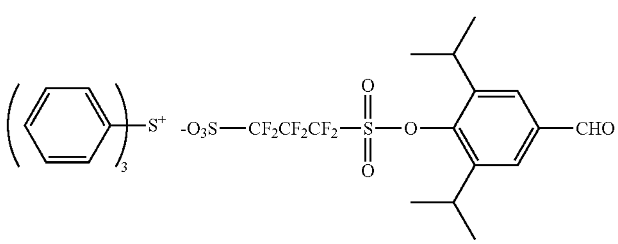
(z79)
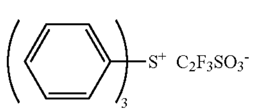
(z80)
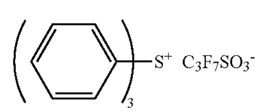
(z81)
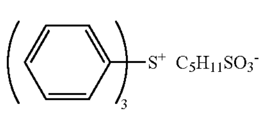
(z82)
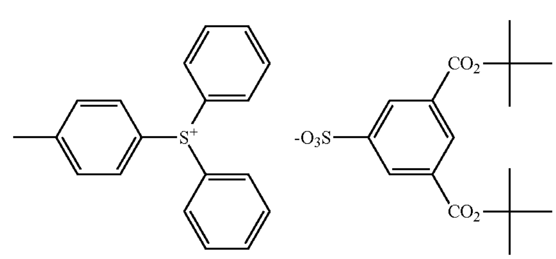

-continued
(z83)
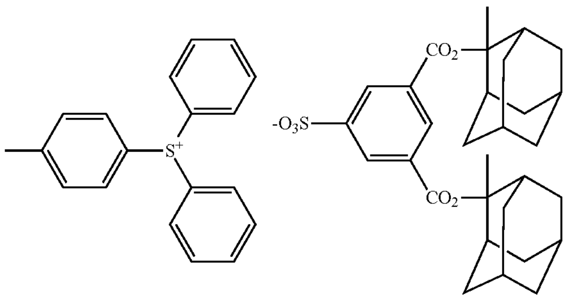
(z84)
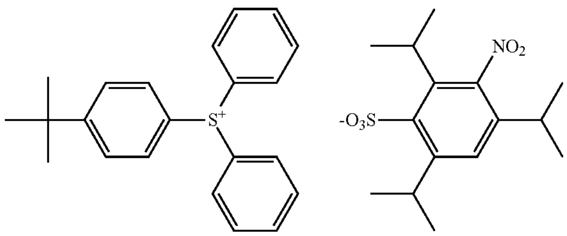
(z85)
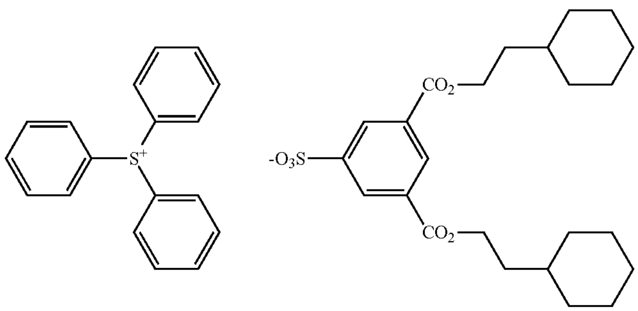
(z86)
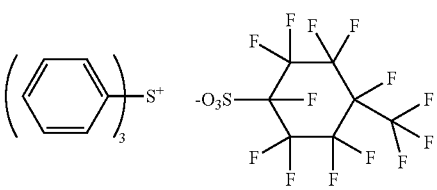
(z87)
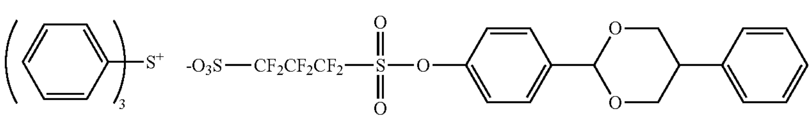
(z88)
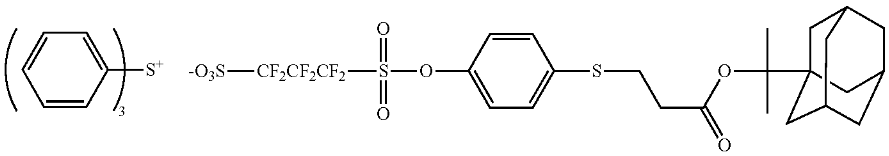
(z89)
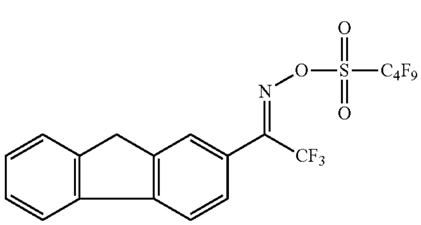

-continued (z90)

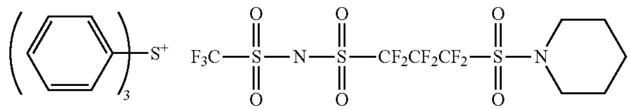

(z91)

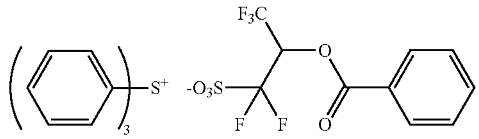

One kind of an acid generator may be used alone or two or more kinds of acid generators may be used in combination.

The content of the acid generator in the positive resist composition is preferably from 0.1 to 20 mass %, more preferably from 0.5 to 10 mass %, still more preferably from 1 to 7 mass %, based on the entire solid content of the positive resist composition.

(C) Mixed Solvent

The positive resist composition of the present invention contains (C) a mixed solvent containing at least one solvent selected from the following Group (a) and at least one solvent selected from the following Groups (b) to (d):

Group (a): an alkylene glycol monoalkyl ether,

Group (b): an alkylene glycol monoalkyl ether carboxylate,

Group (c): a linear ketone, a branched chain ketone, a cyclic ketone, a lactone and an alkylene carbonate, and Group (d): a lactic acid ester, an acetic acid ester and an alkoxypropionic acid ester.

Preferred examples of the alkylene glycol monoalkyl ether of Group (a) include propylene glycol monomethyl ether (PGME, also known as 1-methoxy-2-propanol), propylene glycol monoethyl ether, propylene glycol monopropyl ether, propylene glycol monobutyl ether, ethylene glycol monomethyl ether and ethylene glycol monoethyl ether.

Preferred examples of the alkylene glycol monoalkyl ether carboxylate of Group (b) include propylene glycol monomethyl ether acetate (PGMEA, also known as 1-methoxy-2-acetoxypropane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the linear ketone, branched chain ketone and cyclic ketone of Group (c) include 2-butanone (methyl ethyl ketone), 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the lactone of Group (c) include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the alkylene carbonate of Group (c) include propylene carbonate, vinylene carbonate, ethylene carbonate and butylene carbonate.

Preferred examples of the lactic acid ester of Group (d) include an alkyl lactate such as methyl lactate, ethyl lactate, propyl lactate and butyl lactate.

Preferred examples of the alkoxypropionic acid ester of Group (d) include ethyl 3-ethoxypropionate, methyl 3-methoxypropionate, methyl 3-ethoxypropionate and ethyl 3-methoxypropionate.

Examples of the acetic acid ester of Group (d) include an alkyl alkoxyacetate and an alkyl pyruvate, and preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

Other than these solvents, an appropriate solvent may be mixed.

The solvent which can be preferably used includes a solvent having a boiling point of 130° C. or more at ordinary temperature under atmospheric pressure.

The mixed solvent for use in the present invention contains the solvent (a) in a ratio by mass of 1 to 99%, preferably from 10 to 80%, and most preferably from 20 to 60%, based on all solvents.

(E) Basic Compound

The positive resist composition of the present invention preferably contains a basic compound for reducing the change of performance with aging from exposure until heating.

As for the basic compound, compounds having a structure represented by any one of the following formulae (A) to (E) are preferred.

(A)

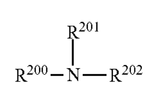

(B)

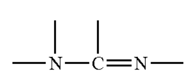

(C)

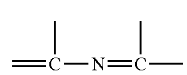

-continued (D)

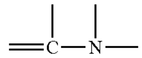

(E)

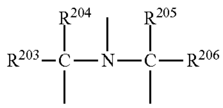

In formulae (A) to (E), $R^{200}$, $R^{201}$ and $R^{202}$, which may be the same or different, each represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to form a ring.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

$R^{203}$, $R^{204}$, $R^{205}$ and $R^{206}$, which may be the same or different, each represents an alkyl group having a carbon number of 1 to 20.

The alkyl group in these formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include tetrabutylammonium hydroxide, triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure becomes a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine, N-phenyldiethanolamine and tris-(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($—CH_2CH_2O—$) and an oxypropylene group ($—CH(CH_3)CH_2O—$ or $—CH_2CH_2CH_2O—$) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($—CH_2CH_2O—$) and an oxypropylene group ($—CH(CH_3)CH_2O—$ or $—CH_2CH_2CH_2O—$) are preferred, and an oxyethylene group is more preferred.

Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. The organic sulfonate includes an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring each may have a substituent, and the substituent is preferably a linear or branched alkyl group having a carbon number of 1 to 6, or a cycloalkyl group having a carbon number of 3 to 6. Specific examples of the linear or branched alkyl group and cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The phenoxy group-containing amine compound and the phenoxy group-containing ammonium salt compound are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group ($—CH_2CH_2O—$) and an oxypropylene group ($—CH(CH_3)CH_2O—$ or $—CH_2CH_2CH_2O—$) are preferred, and an oxyethylene group is more preferred.

The sulfonic acid ester group in the sulfonic acid ester group-containing amine compound and sulfonic acid ester group-containing ammonium salt compound may be any of an alkylsulfonic acid ester, a cycloalkylsulfonic acid ester and an arylsulfonic acid ester. In the case of an alkylsulfonic acid ester, the alkyl group preferably has a carbon number of 1 to 20; in the case of a cycloalkylsulfonic acid ester, the cycloalkyl group preferably has a carbon number of 3 to 20; and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group ($—CH_2CH_2O—$) and an oxypropylene group ($—CH(CH_3)CH_2O—$ or $—CH_2CH_2CH_2O—$) are preferred, and an oxyethylene group is more preferred.

One of these basic compounds may be used alone, or two or more kinds thereof may be used in combination.

The amount of the basic compound used is usually from 0.001 to 10 mass %, preferably from 0.01 to 5 mass %, based on the solid content of the positive resist composition.

The ratio of acid generator and basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

(D) Surfactant

The positive resist composition of the present invention preferably further contains a surfactant, more preferably any one of a fluorine-containing and/or silicon-containing surfactant (a fluorine-containing surfactant, a silicon-containing surfactant and a surfactant containing both a fluorine atom and a silicon atom), or two or more kinds thereof.

By incorporating the above-described surfactant into the positive resist composition of the present invention, a resist pattern with good performance in terms of sensitivity, resolution and adherence as well as less development defect can be provided when using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); Eftop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as a silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), polyoxyethylene•polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of such surfactants may be used alone, or some of these may be used in combination.

The amount of the surfactant used is preferably from 0.0001 to 2 mass %, more preferably from 0.001 to 1 mass %, based on the entire amount of the positive resist composition (excluding the solvent).

Onium Carboxylate:

The positive resist composition of the present invention may contain an onium carboxylate. Examples of the onium carboxylate include sulfonium carboxylate, iodonium carboxylate and ammonium carboxylate. In particular, the onium carboxylate is preferably an iodonium salt or a sulfonium salt. Furthermore, the carboxylate residue of the onium carboxylate for use in the present invention preferably contains no aromatic group and no carbon-carbon double bond. The anion moiety is preferably a linear, branched, monocyclic or polycyclic alkylcarboxylate anion having a carbon number of 1 to 30, more preferably the carboxylate anion above with the alkyl group being partially or entirely fluorine-substituted. The alkyl chain may contain an oxygen atom. By virtue of such a construction, the transparency to light at 220 nm or less is ensured, the sensitivity and resolution are enhanced, and the iso/dense bias and exposure margin are improved.

Examples of the fluorine-substituted carboxylate anion include fluoroacetate, difluoroacetate, trifluoroacetate, pentafluoropropionate, heptafluorobutyrate, nonafluoropentanoate, perfluorododecanoate, perfluorotridecanoate, perfluorocyclohexanecarboxylate and 2,2-bistrifluoromethylpropionate anions.

These onium carboxylates can be synthesized by reacting a sulfonium, iodonium or ammonium hydroxide and a carboxylic acid with silver oxide in an appropriate solvent.

The content of the onium carboxylate in the composition is generally from 0.1 to 20 mass %, preferably from 0.5 to 10 mass %, more preferably from 1 to 7 mass %, based on the entire solid content of the composition.

Dissolution inhibiting compound capable of decomposing by the action of an acid to increase the solubility in an alkali developer and having a molecular weight of 3,000 or less:

The dissolution inhibiting compound capable of decomposing by the action of an acid to increase the solubility in an alkali developer and having a molecular weight of 3,000 or less (hereinafter, sometimes referred to as a "dissolution inhibiting compound") is preferably an alicyclic or aliphatic compound containing an acid-decomposable group, such as acid-decomposable group-containing cholic acid derivative described in Proceeding of SPIE, 2724, 355 (1996), so as not to reduce the transparency to light at 220 nm or less. Examples of the acid-decomposable group and alicyclic structure are the same as those described above with respect to the resin (A).

In the case where the positive resist composition of the present invention is exposed by a KrF excimer laser or irradiated with an electron beam, the composition preferably contains a structure where the phenolic hydroxyl group of a phenol compound is substituted by an acid-decomposable group. The phenol compound is preferably a compound containing from 1 to 9 phenol skeletons, more preferably from 2 to 6 phenol skeletons.

The molecular weight of the dissolution inhibiting compound for use in the present invention is 3,000 or less, preferably from 300 to 3,000, more preferably from 500 to 2,500.

The amount of the dissolution inhibiting compound added is preferably from 3 to 50 mass %, more preferably from 5 to 40 mass %, based on the solid content of the positive resist composition.

Specific examples of the dissolution inhibiting compound are set forth below, but the present invention is not limited thereto.

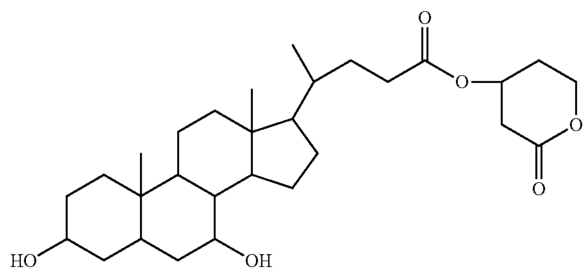

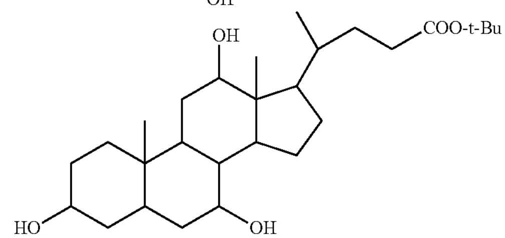

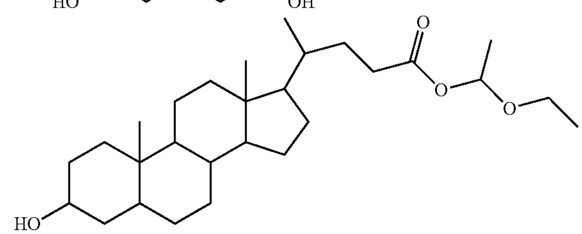

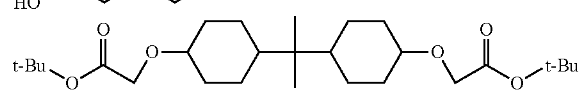

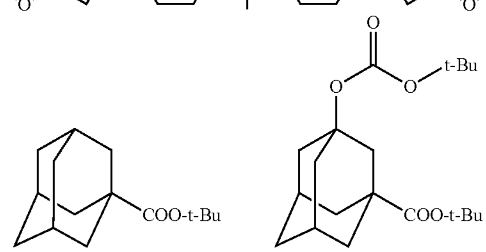

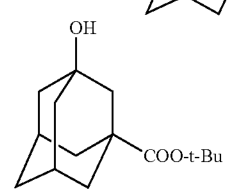

Other Additives:

The positive resist composition of the present invention may further contain, for example, a dye, a plasticizer, a photosensitizer, a light absorber and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art with reference to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

Pattern Forming Method:

The positive resist composition of the present invention is preferably used in a film thickness of 30 to 250 nm, more preferably from 30 to 200 nm, from the standpoint of enhancing the resolution. Such a film thickness can be obtained by setting the solid content concentration in the positive resist composition to an appropriate range, thereby imparting an appropriate viscosity and enhancing the coatability and film-forming property.

The entire solid content concentration in the positive resist composition is generally from 1 to 10 mass %, preferably from 1 to 8.0 mass %, more preferably from 1.0 to 6.0 mass %.

The positive resist composition of the present invention is used by dissolving the components above in a predetermined organic solvent, preferably in the above-described mixed solvent, filtering the solution, and coating it on a predetermined support as follows. The filter used for filtering is preferably a polytetrafluoroethylene-, polyethylene- or nylon-made filter having a pore size of 0.1 μm or less, more preferably 0.05 μm or less, still more preferably 0.03 μm or less.

For example, the positive resist composition is coated on such a substrate (e.g., silicon/silicon dioxide-coated substrate) as used in the production of a precision integrated circuit device, by an appropriate coating method such as spinner or coater and dried to form a resist film.

The resist film is irradiated with an actinic ray or radiation through a predetermined mask, preferably baked (heated) and then subjected to development and rinsing, whereby a good pattern can be obtained.

Examples of the an actinic ray or radiation include infrared light, visible light, ultraviolet light, far ultraviolet light, extreme ultraviolet light, X-ray and electron beam, but the radiation is preferably far ultraviolet light at a wavelength of 250 nm or less, more preferably 220 nm or less, still more preferably from 1 to 200 nm. Specific examples thereof include KrF excimer laser light (248 nm), ArF excimer laser light (193 nm), $F_2$ excimer laser light (157 nm), X-ray and electron beam, with ArF excimer laser light, $F_2$ excimer laser light, EUV (13 nm) and electron beam being preferred.

Before forming the resist film, an antireflection film may be previously provided by coating on the substrate.

The antireflection film used may be either an inorganic film type such as titanium, titanium dioxide, titanium nitride, chromium oxide, carbon and amorphous silicon, or an organic film type comprising a light absorber and a polymer material. Also, the organic anti-reflection film may be a commercially available organic antireflection film such as DUV30 Series and DUV-40 Series produced by Brewer Science, Inc., and AR-2, AR-3 and AR-5 produced by Shipley Co., Ltd.

In the development step, an alkali developer is used as follows. The alkali developer which can be used for the positive resist composition is an alkaline aqueous solution of, for example, inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

Also, the above-described alkaline aqueous solution may be used after adding thereto alcohols and a surfactant each in an appropriate amount.

As for the rinsing solution, pure water is used, and the pure water may be used after adding thereto a surfactant in an appropriate amount.

After the development or rinsing, the developer or rinsing solution adhering on the pattern may removed by a supercritical fluid.

The resist film formed by coating the positive resist composition of the present invention may also be exposed by filling a liquid (immersion medium) having a refractive index higher than that of air between the resist film and a lens at the irradiation with an actinic ray or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film. Particularly, when the exposure light source is an ArF excimer laser (wavelength: 193 nm), water is preferably used in view of easy availability and easy handleability in addition to the above-described aspects.

Furthermore, a medium having a refractive index of 1.5 or more can also be used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is mingled, this incurs distortion of the optical image projected on the resist film. Therefore, the water used is preferably distilled water. Pure water obtained by further filtering the distilled water through an ion exchange filter or the like may also be used.

The electrical resistance of water is preferably 18.3 MQcm or more, and TOC (total organic carbon) is preferably 20 ppb or less. Also, the water is preferably subjected to a deaeration treatment.

The lithography performance can be enhanced by increasing the refractive index of the immersion liquid. From such a standpoint, an additive for increasing the refractive index may be added to water, or heavy water ($D_2O$) may be used in place of water.

In the case where the resist film formed of the positive resist composition of the present invention is exposed through an immersion medium, a hydrophobic resin (HR) may be further added, if desired. The hydrophobic resin (HR) when added is unevenly distributed to the surface layer of the resist film and in the case of using water as the immersion medium, the resist film formed can be enhanced in the receding contact angle on the resist film surface for water as well as in the followability of the immersion liquid. The hydrophobic resin (HR) may be any resin as long as the receding contact angle on the surface is enhanced by its addition, but a resin having at least either one of a fluorine atom and a silicon atom is preferred. The receding contact angle of the resist film is preferably from 60 to 90°, more preferably 70° or more. The amount of the hydrophobic resin added may be appropriately adjusted to give a resist film having a receding contact angle in the range above but is preferably from 0.1 to 10 mass %, more preferably from 0.1 to 5 mass %, based on the entire solid content of the positive resist composition. The hydrophobic resin (HR) is, as described above, unevenly distributed to the interface but unlike a surfactant, need not have necessarily a hydrophilic group in the molecule and may not contribute to uniform mixing of polar/nonpolar substances.

The receding contact angle is a contact angle measured when a contact line recedes on the liquid droplet-substrate interface, and is generally known to be useful in simulating the mobility of a liquid droplet in the dynamic state. In a simple manner, the receding contact angle can be defined as a contact angle at the time of the liquid droplet interface receding when a liquid droplet ejected from a needle tip is landed on a substrate and then the liquid droplet is again sucked into the needle. In general, the receding contact angle can be measured by a contact angle measuring method called an expansion/contraction method.

In the immersion exposure step, the immersion liquid needs to move on a wafer following the movement of an exposure head that is scanning the wafer at a high speed and forming an exposure pattern. Therefore, the contact angle of the immersion liquid with the resist film in a dynamic state is important and the resist is required to have a performance of allowing a liquid droplet to follow the high-speed scanning of an exposure head and not to linger behind.

The fluorine atom or silicon atom in the hydrophobic resin (HR) may be present in the main chain of the resin or may be substituted to the side chain.

The hydrophobic resin (HR) is preferably a resin having a fluorine atom-containing alkyl group, a fluorine atom-containing cycloalkyl group or a fluorine atom-containing aryl group, as a fluorine atom-containing partial structure.

The fluorine atom-containing alkyl group (preferably having a carbon number of 1 to 10, more preferably from 1 to 4) is a linear or branched alkyl group with at least one hydrogen atom being substituted by a fluorine atom and may further have other substituents.

The fluorine atom-containing cycloalkyl group is a monocyclic or polycyclic cycloalkyl group with at least one hydrogen atom being substituted by a fluorine atom and may further have other substituents.

The fluorine atom-containing aryl group is an aryl group (e.g., phenyl, naphthyl) with at least one hydrogen atom being substituted by a fluorine atom and may further have other substituents.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

(F2)

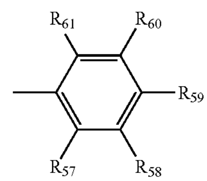

(F3)

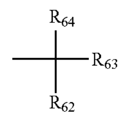

(F4)

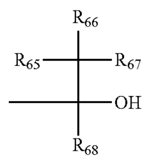

In formulae (F2) to (F4), $R_{57}$ to $R_{68}$ each independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being substituted by a fluorine atom. It is preferred that $R_{57}$ to $R_{61}$ and $R_{65}$ to $R_{67}$ all are a fluorine atom. $R_{62}$, $R_{63}$ and $R_{68}$ each is preferably an alkyl group (preferably having a carbon number of 1 to 4) with at least one hydrogen atom being substituted by a fluorine atom, more preferably a perfluoroalkyl group having a carbon number of 1 to 4. $R_{62}$ and $R_{63}$ may combine together to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —$C(CF_3)_2OH$, —$C(C_2F_5)_2OH$, —$C(CF_3)(CH_3)OH$ and —$CH(CF_3)OH$, with —$C(CF_3)_2OH$ being preferred.

Specific examples of the repeating unit having a fluorine atom are set forth below, but the present invention is not limited thereto.
In specific examples, $X_1$ represents a hydrogen atom, —$CH_3$, —F or —$CF_3$.
$X_2$ represents —F or —$CF_3$.
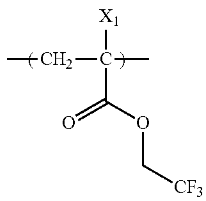
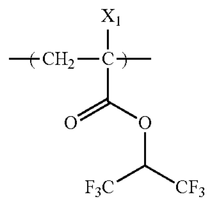
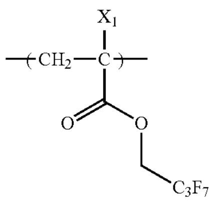
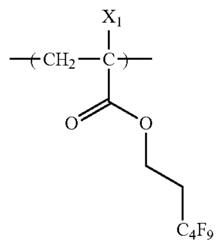
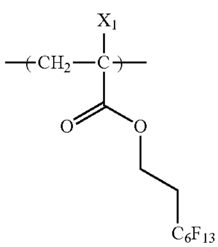
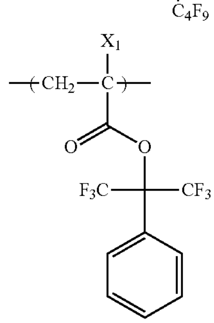
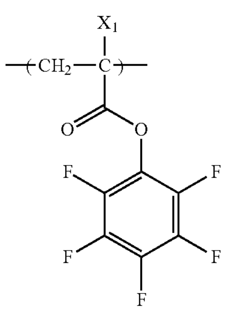
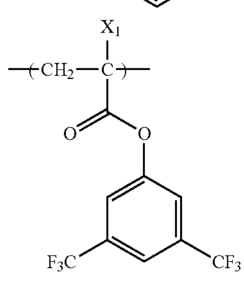
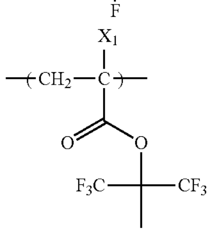
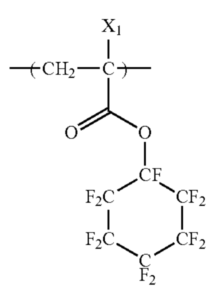
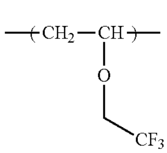
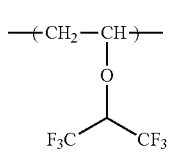
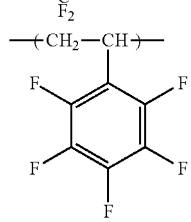
-continued
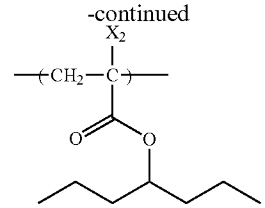
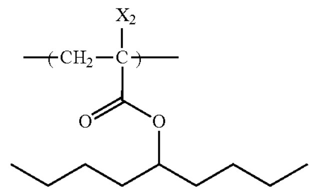
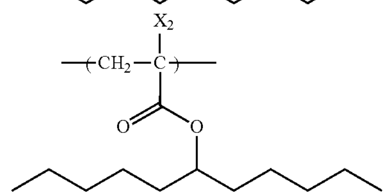
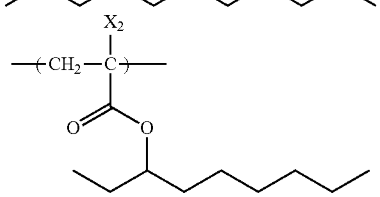
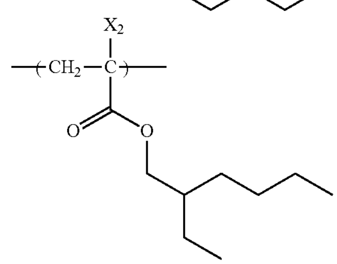
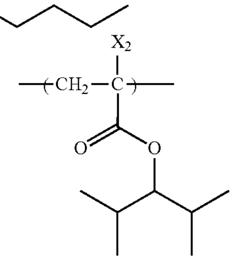
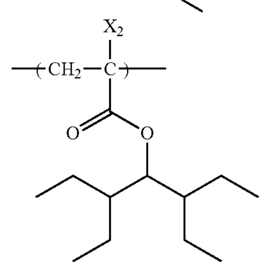
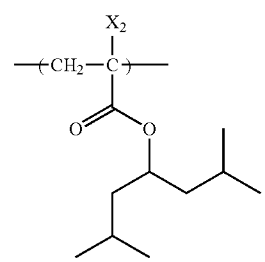
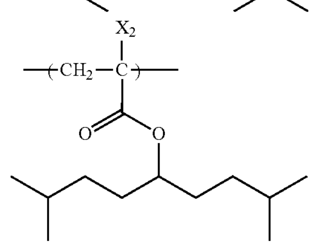
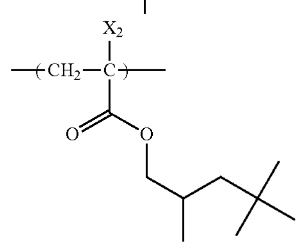
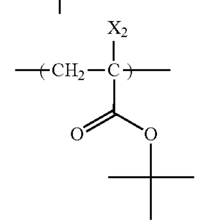

The hydrophobic resin (HR) is preferably a resin having an alkylsilyl structure (preferably a trialkylsilyl group) or a cyclic siloxane structure, as a silicon atom-containing partial structure.

Specific examples of the alkylsilyl structure and cyclic siloxane structure include the groups represented by the following formulae (CS-1) to (CS-3):

(CS-1)

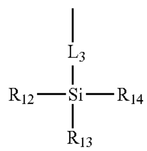

(CS-2)

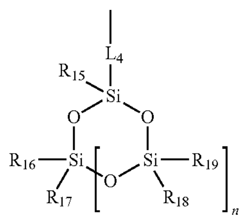

(CS-3)

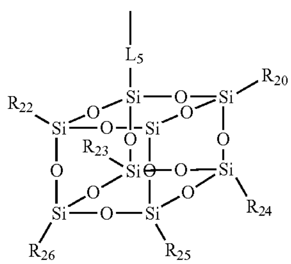

In formulae (CS-1) to (CS-3), $R_{12}$ to $R_{26}$ each independently represents a linear or branched alkyl group (preferably having a carbon number of 1 to 20) or a cycloalkyl group (preferably having a carbon number of 3 to 20).

$L_3$ to $L_5$ each represents a single bond or a divalent linking group. The divalent linking group is a single group or a combination of two or more groups, selected from the group consisting of an alkylene group, a phenylene group, an ether group, a thioether group, a carbonyl group, an ester group, an amide group, a urethane group and a ureylene group.

n represents an integer of 1 to 5.

Specific examples of the repeating unit having a group represented by formula (CS-1) to (CS-3) are set forth below, but the present invention is not limited thereto. In specific examples, $X_1$ represents a hydrogen atom, —$CH_3$, —F or —$CF_3$.

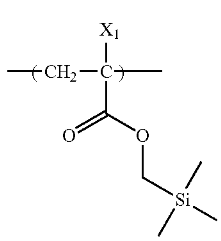

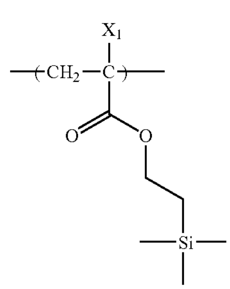

-continued

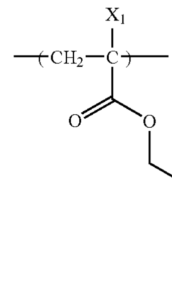

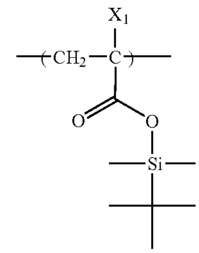

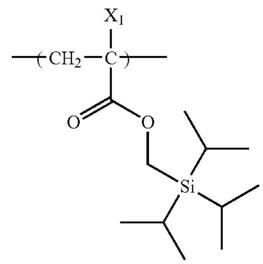

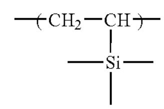

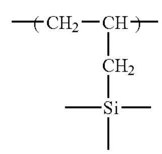

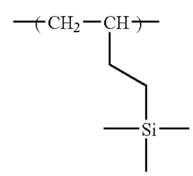

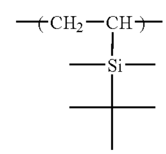

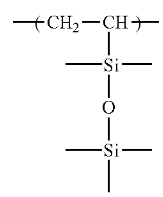

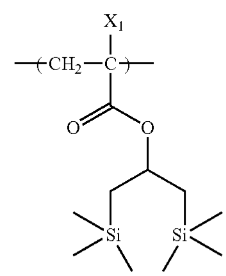

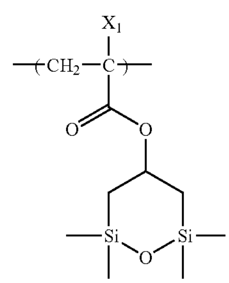

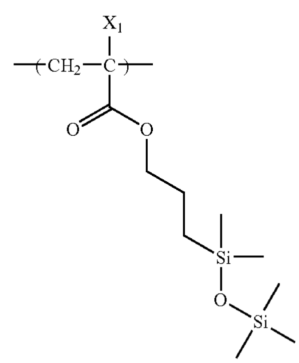

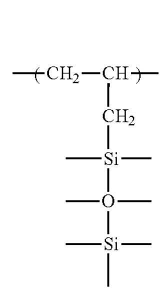

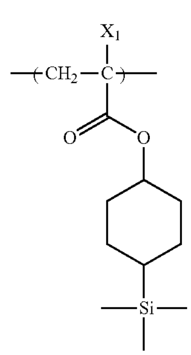

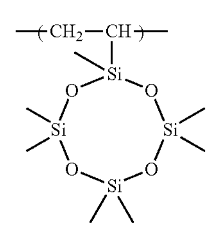

-continued

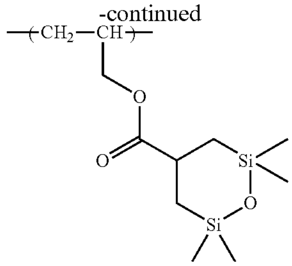

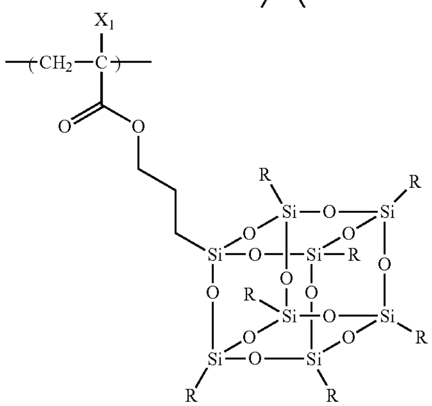

R = $CH_3$, $C_2H_5$, $C_3H_7$,$C_4H_9$

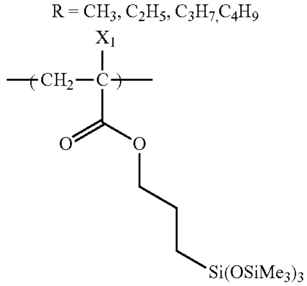

Furthermore, the hydrophobic resin (HR) may contain at least one group selected from the group consisting of the following (x) to (z):

(x) an alkali-soluble group, (y) a group capable of decomposing by the action of an alkali developer to increase the solubility in an alkali developer, and (z) a group capable of decomposing by the action of an acid.

Examples of the (x) alkali-soluble group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkyl-sulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)-imide group, a tris(alkylcarbonyl)methylene group and a tris(alkylsulfonyl)methylene group.

Preferred alkali-soluble groups include a fluorinated alcohol group (preferably hexafluoroisopropanol), a sulfonimide group and a bis(carbonyl)methylene group.

As for the repeating unit having (x) an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred.

The content of the repeating unit having (x) an alkali-soluble group is preferably from 1 to 50 mol %, more preferably from 3 to 35 mol %, still more preferably from 5 to 20 mol %, based on all repeating units in the polymer.

Specific examples of the repeating unit having (x) an alkali-soluble group are set forth below, but the present invention is not limited thereto.

In the formulae, Rx represents H, $CH_3$, $CF_3$ or $CH_2OH$.

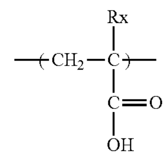

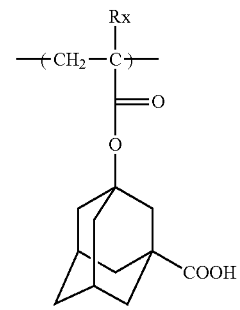

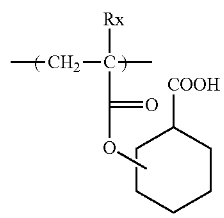

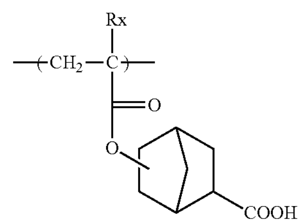

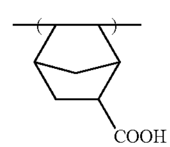

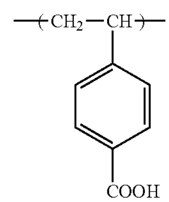

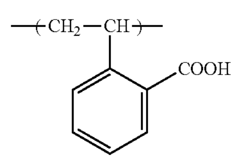

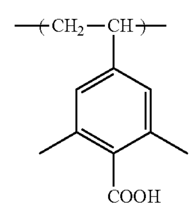

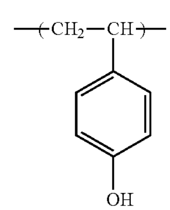

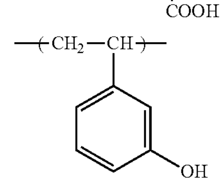

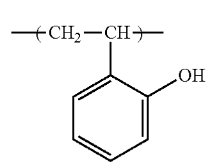

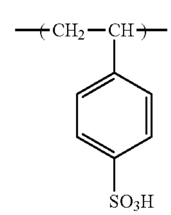

-continued

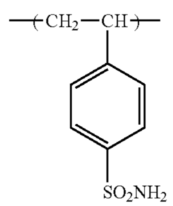

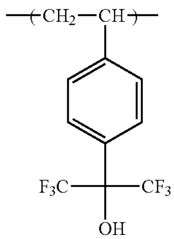

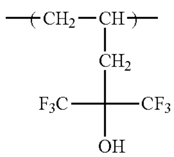

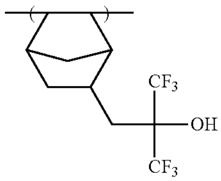

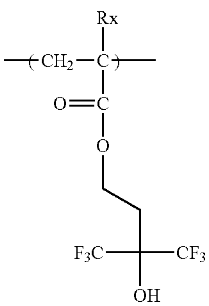

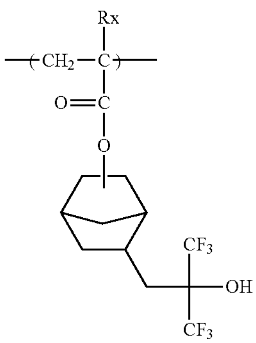

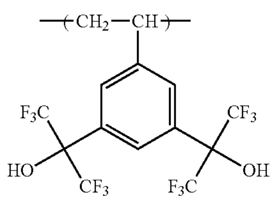

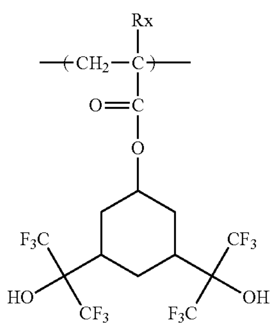

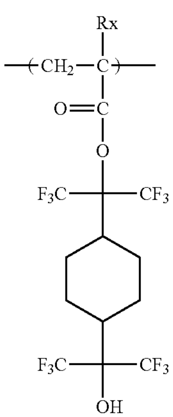

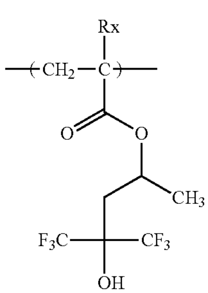

-continued

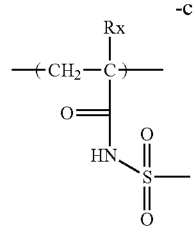

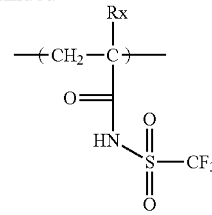

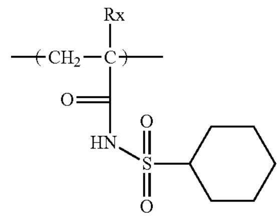

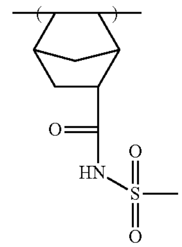

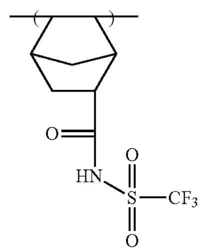

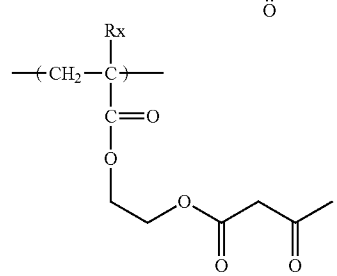

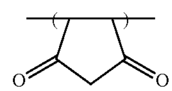

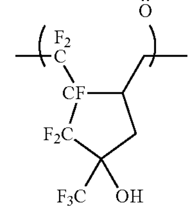

Examples of the (y) group capable of decomposing by the action of an alkali developer to increase the solubility in an alkali developer include a lactone structure-containing group, an acid anhydride group and an acid imide group, with a lactone group being preferred.

As for the repeating unit having (y) a group capable of decomposing by the action of an alkali developer to increase the solubility in an alkali developer, both a repeating unit where (y) a group capable of decomposing by the action of an alkali developer to increase the solubility in an alkali developer is bonded to the main chain of resin, such as repeating unit by an acrylic acid ester or a methacrylic acid ester, and a repeating unit where (y) a group capable of increasing the solubility in an alkali developer is introduced into the polymer chain terminal by using a polymerization initiator or chain transfer agent containing this group at the polymerization, are preferred.

The content of the repeating unit having (y) a group capable of increasing the solubility in an alkali developer is preferably from 1 to 40 mol %, more preferably from 3 to 30 mol %, still more preferably from 5 to 15 mol %, based on all repeating units in the polymer.

Specific examples of the repeating unit having (y) a group capable of increasing the solubility in an alkali developer are the same as those of the repeating unit having a lactone structure described for the resin (A).

Examples of the repeating unit having (z) a group capable of decomposing by the action of an acid, contained in the hydrophobic resin (HR), are the same as those of the repeating unit having an acid-decomposable group described for the resin (A). In the hydrophobic resin (HR), the content of the repeating unit having (z) a group capable of decomposing by the action of an acid is preferably from 1 to 80 mol %, more preferably from 10 to 80 mol %, still more preferably from 20 to 60 mol %, based on all repeating units in the polymer.

The hydrophobic resin (HR) may further contain a repeating unit represented by the following formula (III):

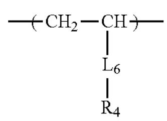

(III)

In formula (III), $R_4$ represents a group having an alkyl group, a cycloalkyl group, an alkenyl group or a cycloalkenyl group.

$L_6$ represents a single bond or a divalent linking group.

In formula (III), the alkyl group of $R_4$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The divalent linking group of $L_6$ is preferably an alkylene group (preferably having a carbon number of 1 to 5) or an oxy group.

In the case where the hydrophobic resin (HR) contains a fluorine atom, the fluorine atom content is preferably from 5 to 80 mass %, more preferably from 10 to 80 mass %, based on the molecular weight of the hydrophobic resin (HR). Also, the fluorine atom-containing repeating unit preferably occupies from 10 to 100 mass %, more preferably from 30 to 100 mass %, in the hydrophobic resin (HR).

In the case where the hydrophobic resin (HR) contains a silicon atom, the silicon atom content is preferably from 2 to 50 mass %, more preferably from 2 to 30 mass %, based on the molecular weight of the hydrophobic resin (HR). Also, the silicon atom-containing repeating unit preferably occupies from 10 to 100 mass %, more preferably from 20 to 100 mass %, in the hydrophobic resin (HR).

The standard polystyrene-reduced weight average molecular of the hydrophobic resin (HR) is preferably from 1,000 to 100,000, more preferably from 1,000 to 50,000, still more preferably from 2,000 to 15,000.

Similarly to the resin (A), the hydrophobic resin (HR) of course preferably has less impurities such as metal and also, the content of the residual monomer or oligomer component in the resin is preferably from 0 to 10 mass %, more preferably from 0 to 5 mass %, still more preferably from 0 to 1 mass %. When these conditions are satisfied, a resist free of foreign matters in the solution and suffering no change with aging of sensitivity or the like can be obtained. Also, in view of resolution, resist profile, side wall of resist pattern, roughness and the like, the molecular weight distribution (Mw/Mn, also called dispersity) is preferably from 1 to 5, more preferably from 1 to 3, still more preferably from 1 to 2.

As for the hydrophobic resin (HR), various commercially available products may be used or the resin may be synthesized by an ordinary method (for example, radical polymerization)). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the positive resist composition of the present invention. By the use of the same solvent, production of particles during storage can be suppressed.

The polymerization reaction is preferably performed in an inert gas atmosphere such as nitrogen or argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The reaction concentration is from 5 to 50 mass %, preferably from 30 to 50 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of removing by extraction only those having a molecular weight not more than a specific value; a reprecipitation method of adding dropwise the resin solution in a poor solvent to solidify the resin in the poor solvent and thereby remove residual monomers or the like; and a purification method in a solid state, such as a method of subjecting a resin slurry separated by filtration to washing with a poor solvent. For example, the resin is precipitated as a solid by contacting the reaction solution with a solvent in which the resin is sparingly soluble or insoluble (poor solvent) and which is in a volume amount of 10 times or less, preferably from 10 to 5 times.

The solvent used at the operation of precipitation or reprecipitation from the polymer solution (precipitation or reprecipitation solvent) may be sufficient if it is a poor solvent to the polymer, and the solvent may be appropriately selected, for example, from a hydrocarbon, a halogenated hydrocarbon, a nitro compound, an ether, a ketone, an ester, a carbonate, an alcohol, a carboxylic acid, water, and a mixed solvent containing such a solvent, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank, by a known method such as batch system or continuous system.

The precipitated or reprecipitated polymer is usually subjected to commonly employed solid-liquid separation such as filtration or centrifugation, then dried and used. The filtration is performed using a solvent-resistant filter element preferably under pressure.

The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volume amount of less than 10 times (preferably 5 times or less) the resin solution A, to precipitate a resin solid (step d), and separating the precipitated resin (step e).

Specific examples of the hydrophobic resin (HR) are set forth below. Also, the molar ratio of repeating units (corresponding to repeating units from the left), weight average molecular weight and dispersity of each resin are shown in Table 1 below.

(HR-1)

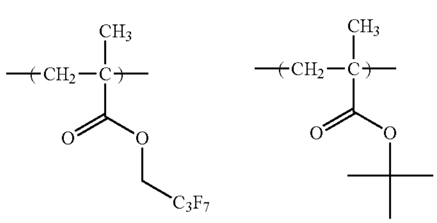

(HR-2)

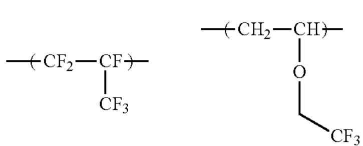

(HR-3)

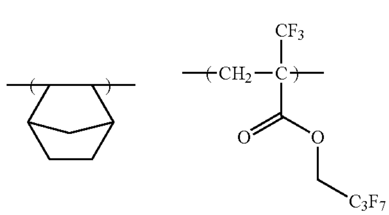

-continued (HR-4)

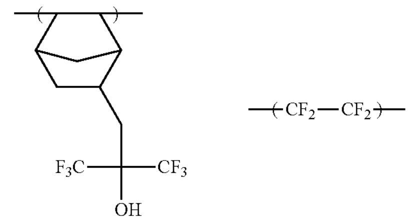

(HR-5)

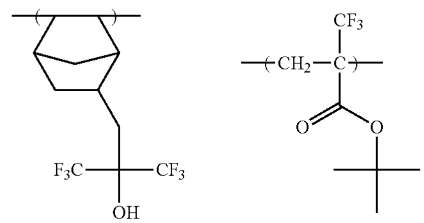

(HR-6)

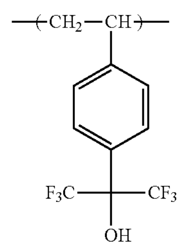

(HR-7)

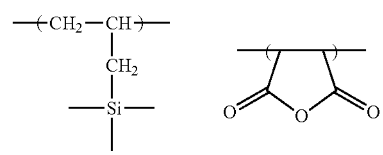

(HR-8)

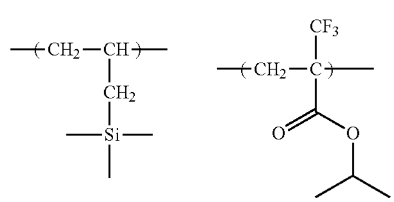

(HR-9)

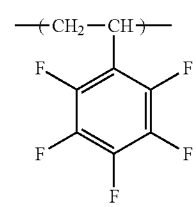

(HR-10)

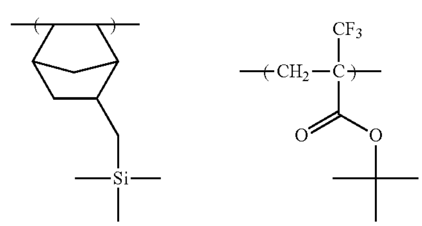

-continued
(HR-11)
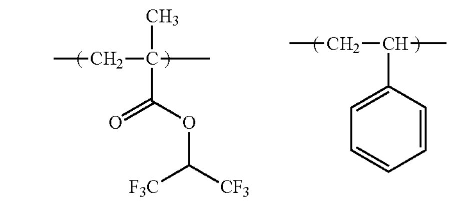
(HR-12)
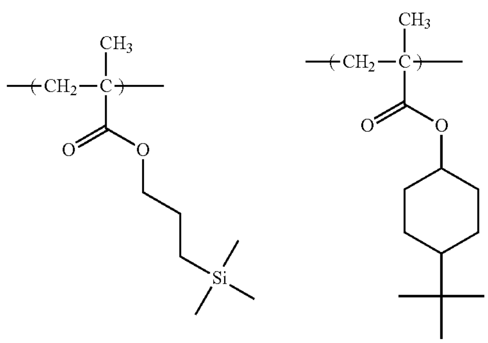
(HR-13)
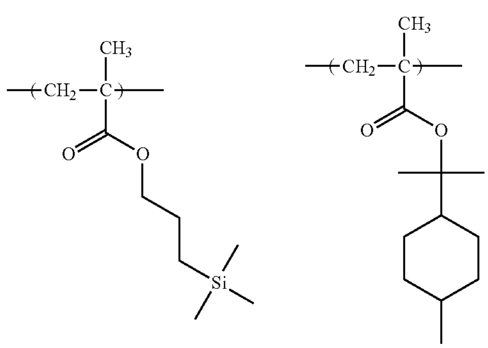
(HR-14)
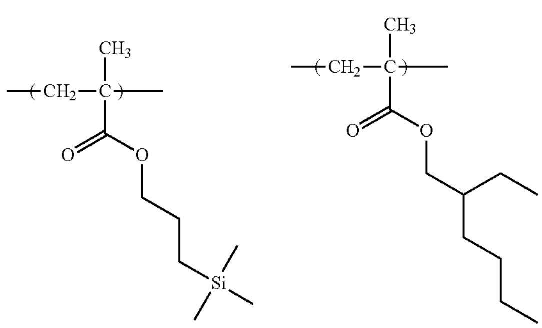
(HR-15)
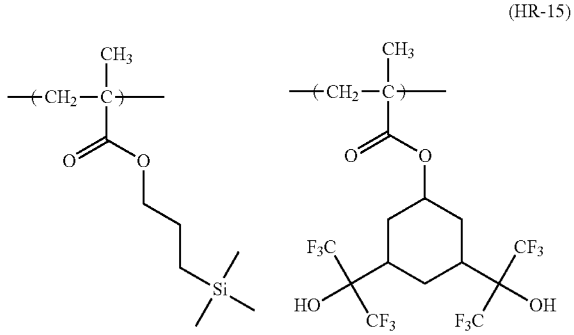
-continued
(HR-16)
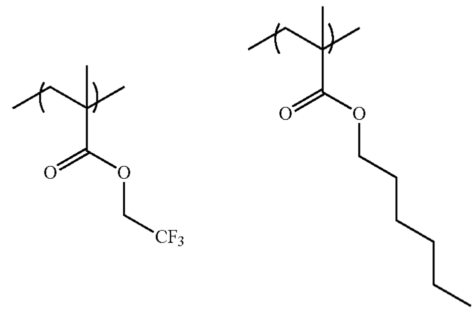
(HR-17)
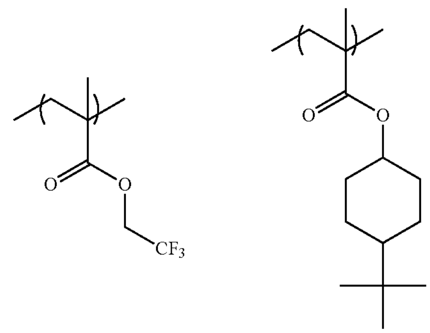
(HR-18)
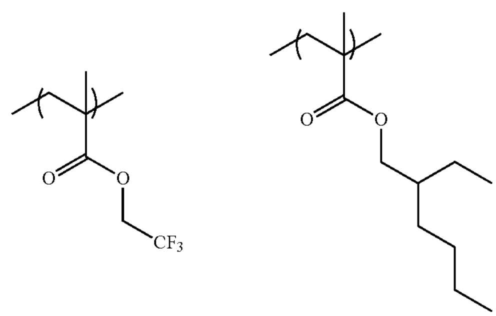
(HR-19)
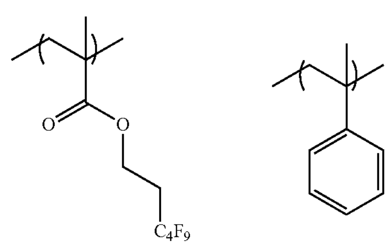
(HR-20)
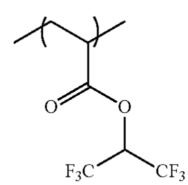
(HR-21)
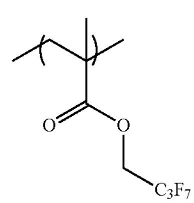

-continued
(HR-22)
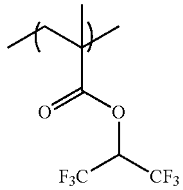
(HR-23)
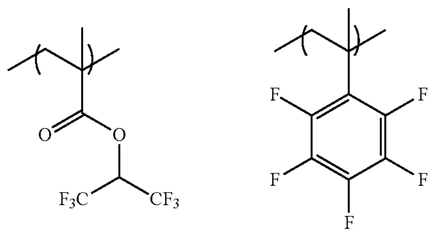
(HR-24)
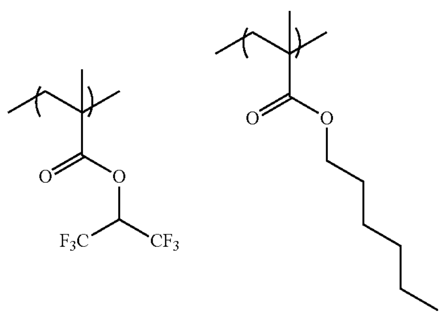
(HR-25)
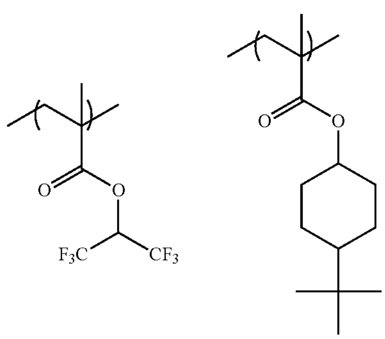
(HR-26)
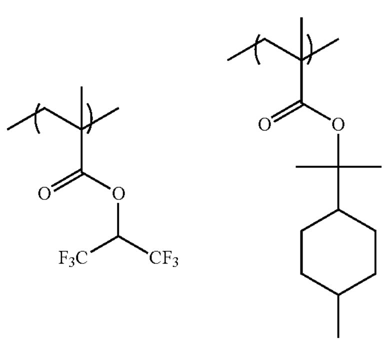
-continued
(HR-27)
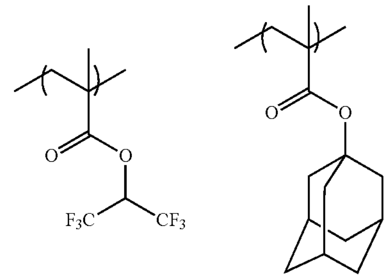
(HR-28)
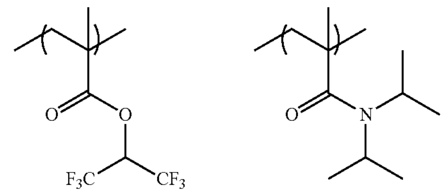
(HR-29)
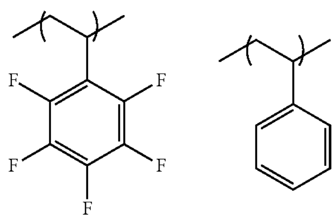
(HR-30)
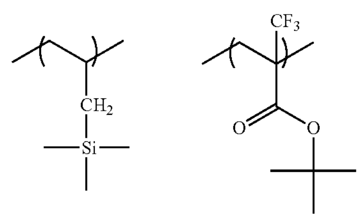
(HR-31)
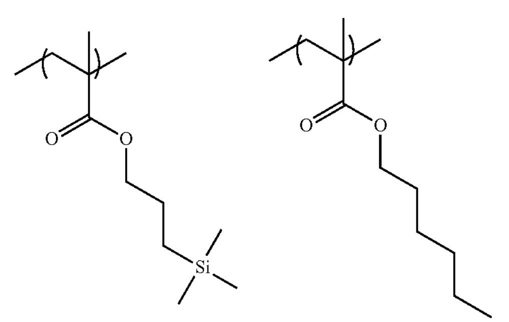
(HR-32)
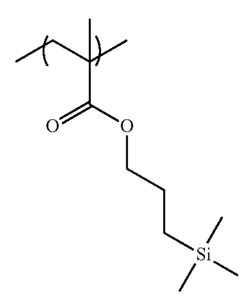

-continued
(HR-33)
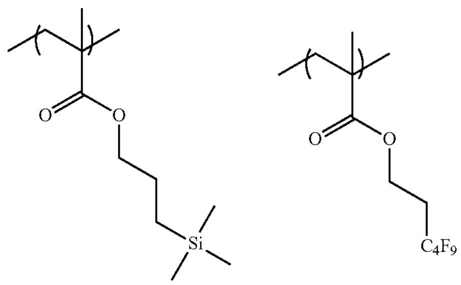
(HR-34)
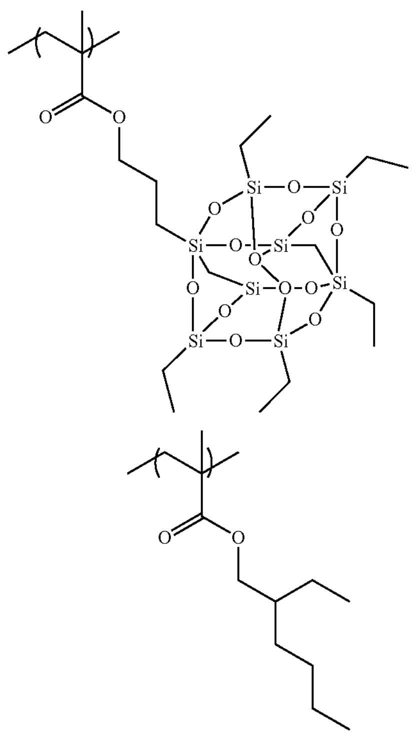
(HR-35)
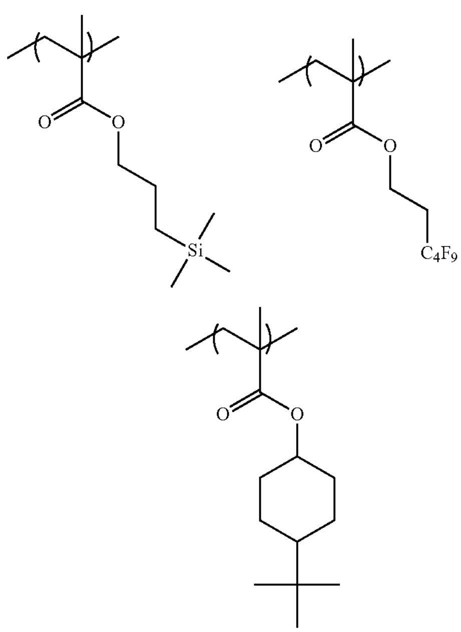
-continued
(HR-36)
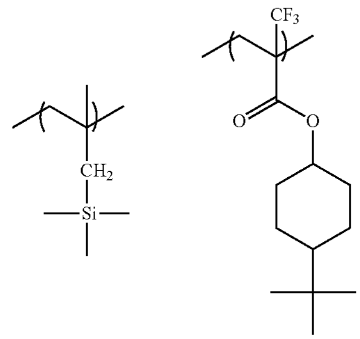
(HR-37)
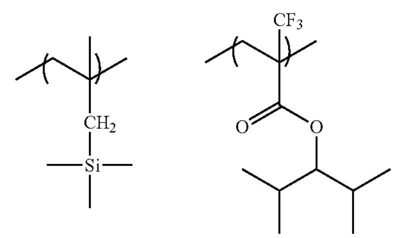
(HR-38)
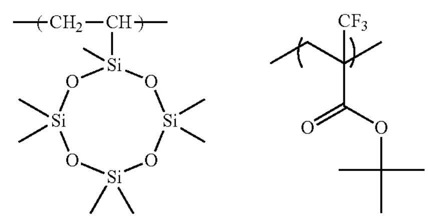
(HR-39)
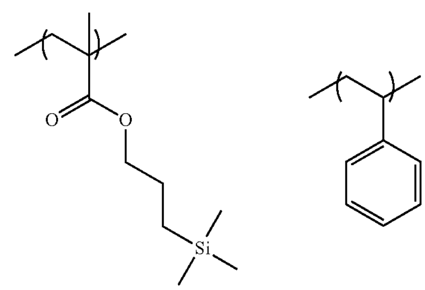
(HR-40)
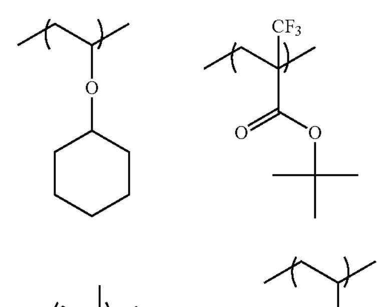
(HR-41)
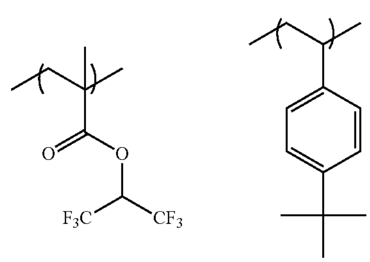

-continued
(HR-42)
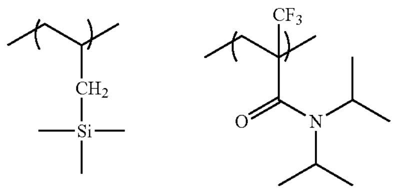
(HR-43)
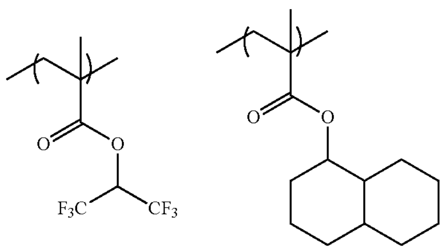
(HR-44)
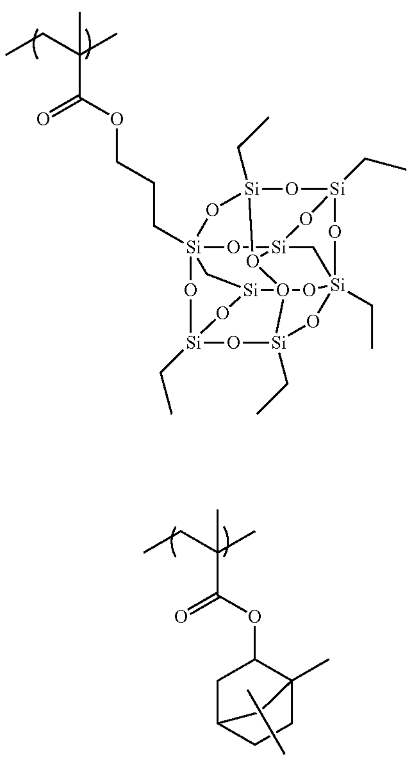
(HR-45)
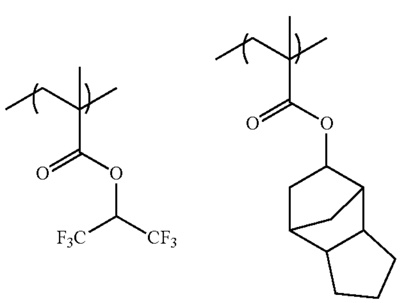
-continued
(HR-46)
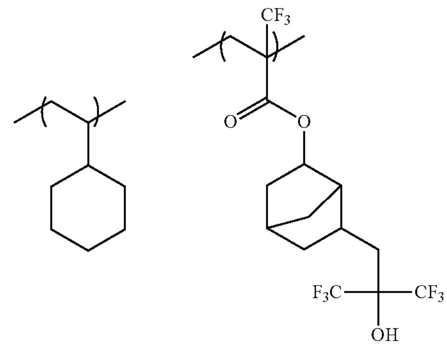
(HR-47)
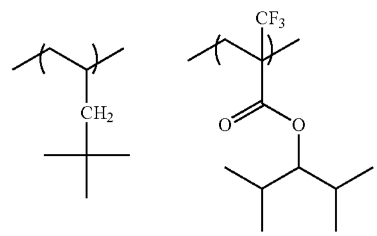
(HR-48)
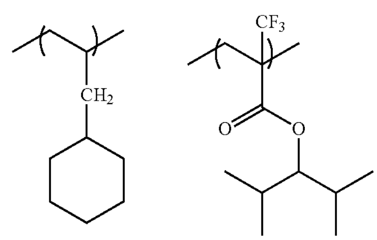
(HR-49)
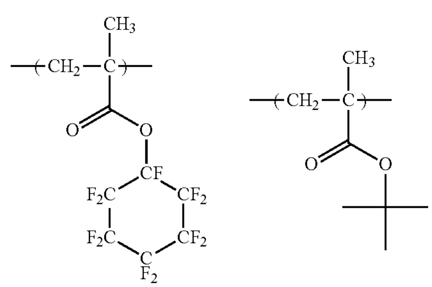
(HR-50)
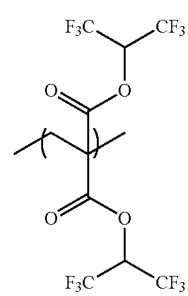

-continued
(HR-51)
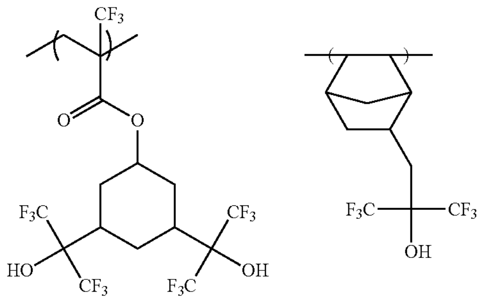
(HR-52)
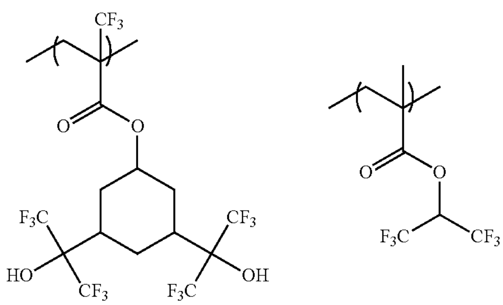
(HR-53)
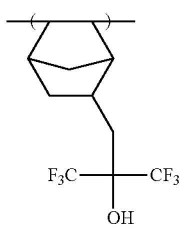
(HR-54)
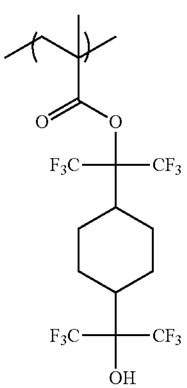
(HR-55)
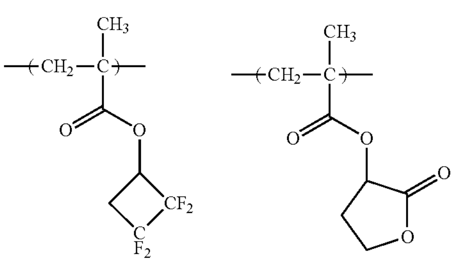
-continued
(HR-56)
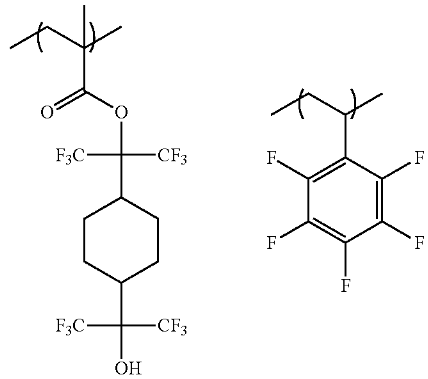
(HR-57)
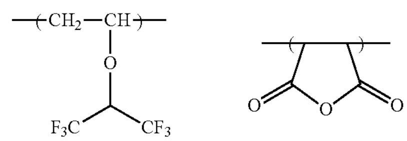
(HR-58)
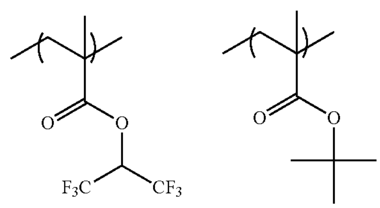
(HR-59)
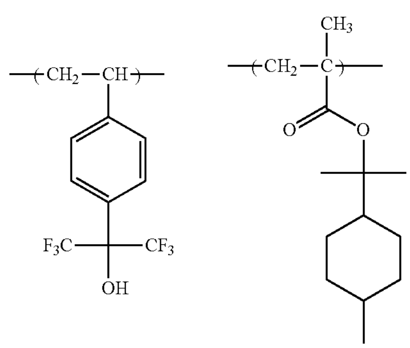
(HR-60)
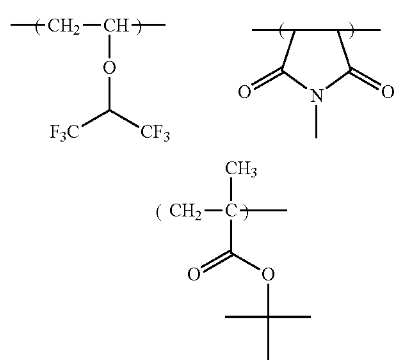

-continued
(HR-61)
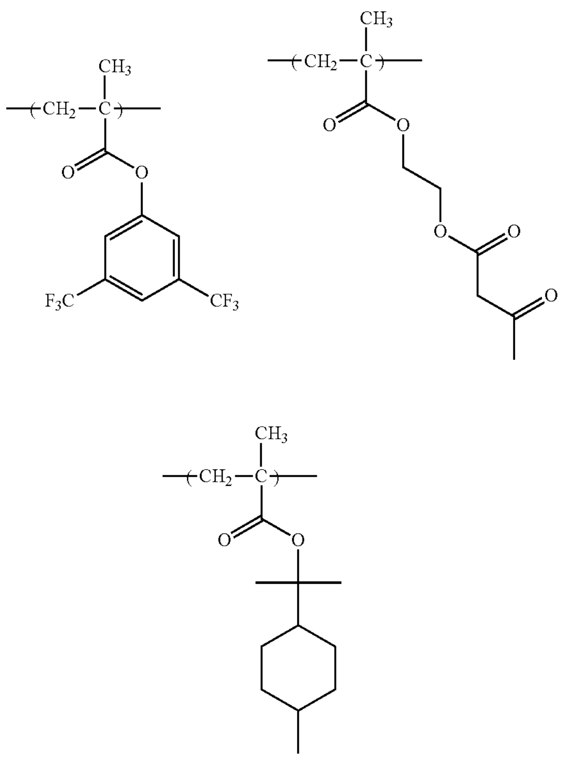
(HR-62)
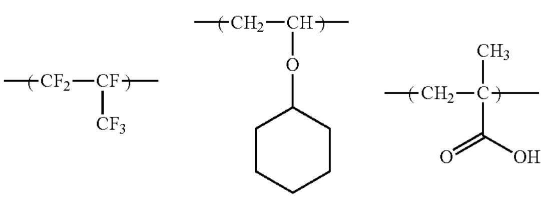
(HR-63)
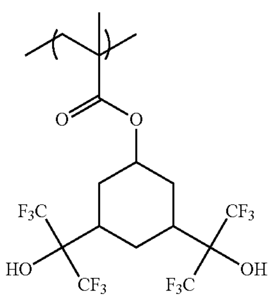
(HR-64)
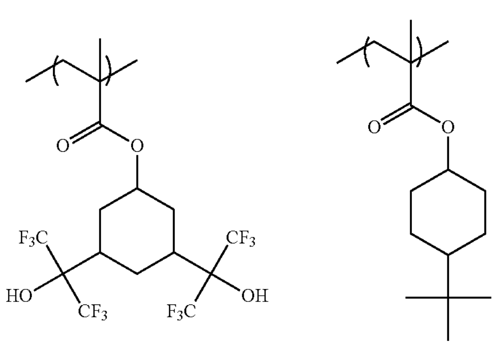
-continued
(HR-65)
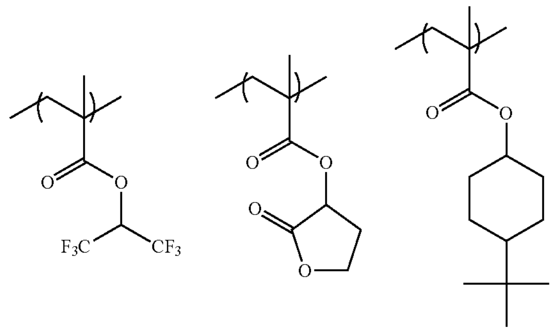
(HR-66)
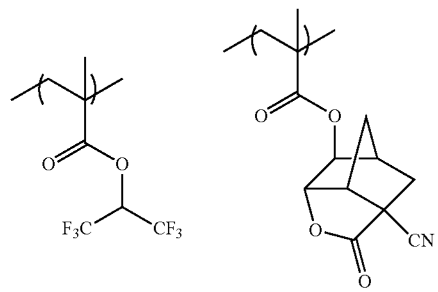
(HR-67)
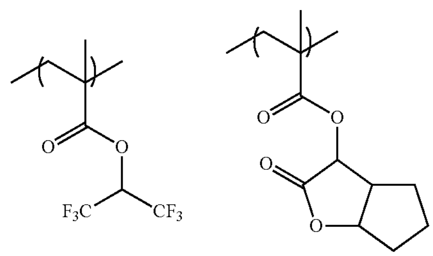
(HR-68)
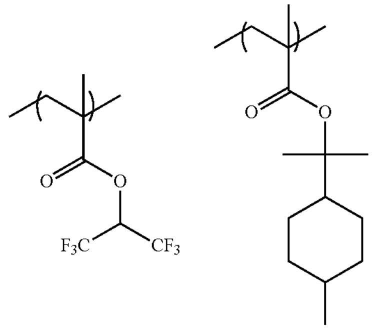
(HR-69)
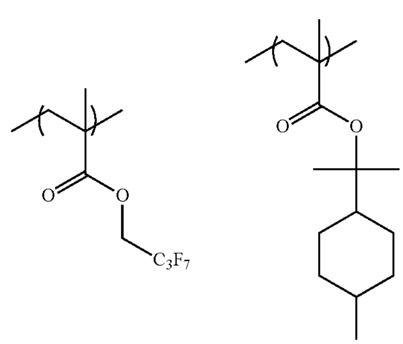

-continued
(HR-70)
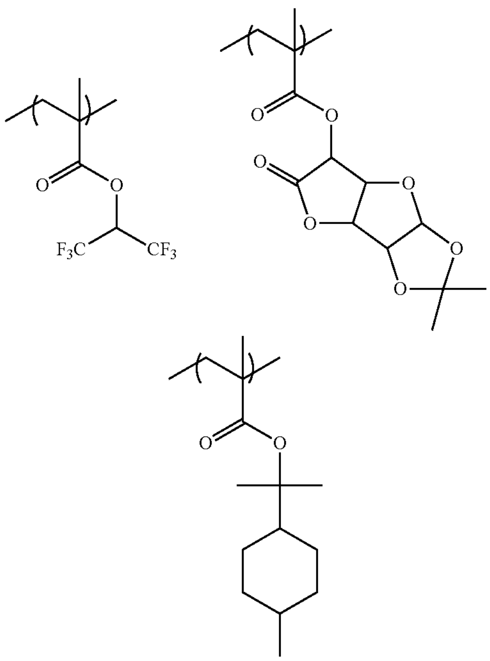
(HR-71)
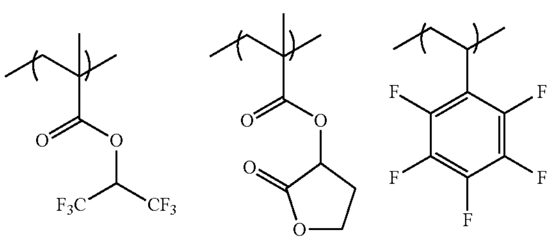
(HR-72)
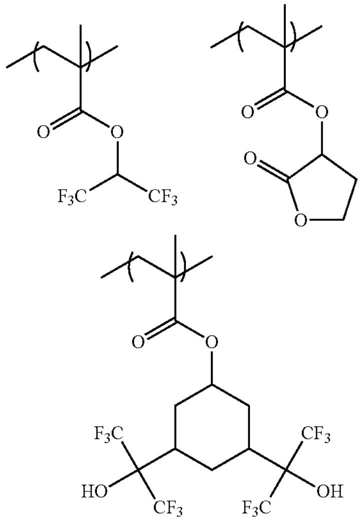
(HR-73)
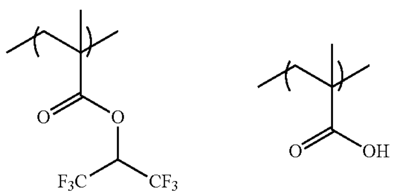
-continued
(HR-74)
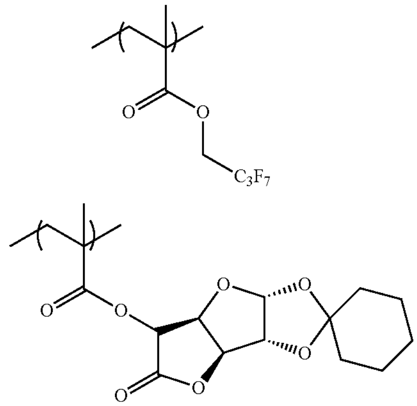
(HR-75)
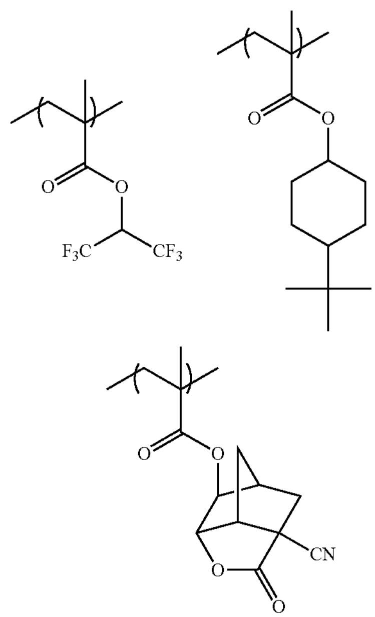
(HR-76)
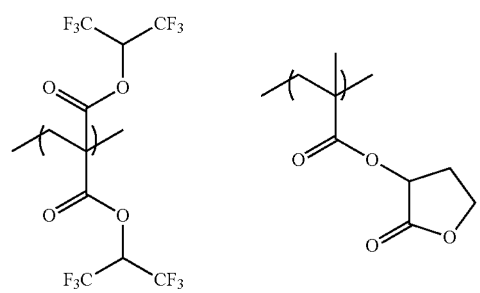
(HR-77)
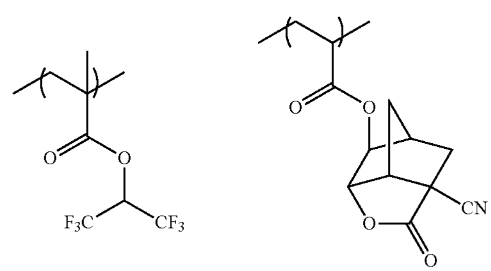

-continued
(HR-78)
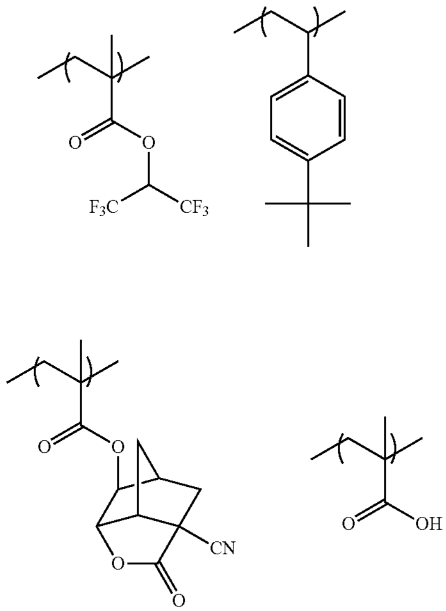
(HR-79)
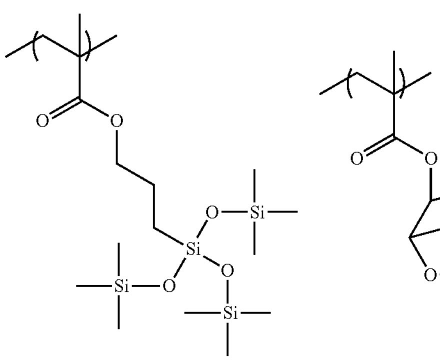
(HR-80)
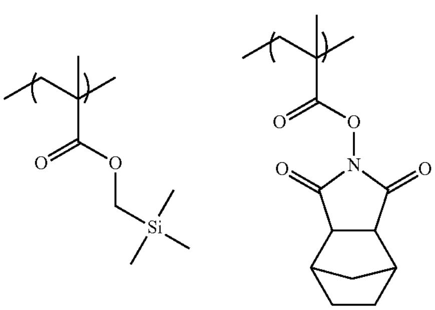
(HR-81)
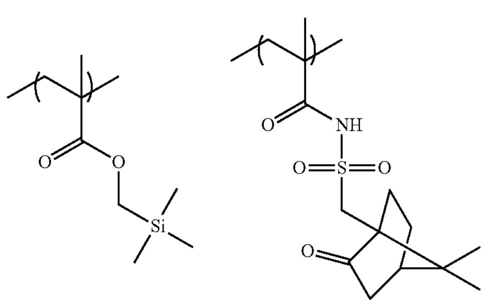
-continued
(HR-82)
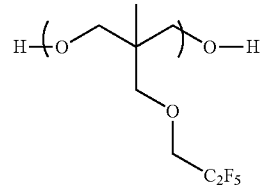
(HR-83)
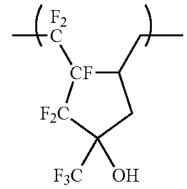
(HR-84)
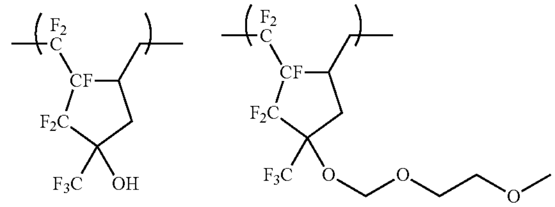
TABLE 1
| Resin | Composition | Mw | Mw/Mn |
|---|---|---|---|
| HR-1 | 50/50 | 8800 | 2.1 |
| HR-2 | 50/50 | 5200 | 1.8 |
| HR-3 | 50/50 | 4800 | 1.9 |
| HR-4 | 50/50 | 5300 | 1.9 |
| HR-5 | 50/50 | 6200 | 1.9 |
| HR-6 | 100 | 12000 | 2.0 |
| HR-7 | 50/50 | 5800 | 1.9 |
| HR-8 | 50/50 | 6300 | 1.9 |
| HR-9 | 100 | 5500 | 2.0 |
| HR-10 | 50/50 | 7500 | 1.9 |
| HR-11 | 70/30 | 10200 | 2.2 |
| HR-12 | 40/60 | 15000 | 2.2 |
| HR-13 | 40/60 | 13000 | 2.2 |
| HR-14 | 80/20 | 11000 | 2.2 |
| HR-15 | 60/40 | 9800 | 2.2 |
| HR-16 | 50/50 | 8000 | 2.2 |
| HR-17 | 50/50 | 7600 | 2.0 |
| HR-18 | 50/50 | 12000 | 2.0 |
| HR-19 | 20/80 | 6500 | 1.8 |
| HR-20 | 100 | 6500 | 1.2 |
| HR-21 | 100 | 6000 | 1.6 |
| HR-22 | 100 | 2000 | 1.6 |
| HR-23 | 50/50 | 6000 | 1.7 |
| HR-24 | 50/50 | 8800 | 1.9 |
| HR-25 | 50/50 | 7800 | 2.0 |
| HR-26 | 50/50 | 8000 | 2.0 |
| HR-27 | 80/20 | 8000 | 1.8 |
| HR-28 | 30/70 | 7000 | 1.7 |
| HR-29 | 50/50 | 6500 | 1.6 |
| HR-30 | 50/50 | 6500 | 1.6 |
| HR-31 | 50/50 | 9000 | 1.8 |
| HR-32 | 100 | 10000 | 1.6 |
| HR-33 | 70/30 | 8000 | 2.0 |
| HR-34 | 10/90 | 8000 | 1.8 |
| HR-35 | 30/30/40 | 9000 | 2.0 |
| HR-36 | 50/50 | 6000 | 1.4 |
| HR-37 | 50/50 | 5500 | 1.5 |
| HR-38 | 50/50 | 4800 | 1.8 |
| HR-39 | 60/40 | 5200 | 1.8 |
| HR-40 | 50/50 | 8000 | 1.5 |
| HR-41 | 20/80 | 7500 | 1.8 |
| HR-42 | 50/50 | 6200 | 1.6 |

TABLE 1-continued

| Resin | Composition | Mw | Mw/Mn |
|---|---|---|---|
| HR-43 | 60/40 | 16000 | 1.8 |
| HR-44 | 80/20 | 10200 | 1.8 |
| HR-45 | 50/50 | 12000 | 2.6 |
| HR-46 | 50/50 | 10900 | 1.9 |
| HR-47 | 50/50 | 6000 | 1.4 |
| HR-48 | 50/50 | 4500 | 1.4 |
| HR-49 | 50/50 | 6900 | 1.9 |
| HR-50 | 100 | 2300 | 2.6 |
| HR-51 | 60/40 | 8800 | 1.5 |
| HR-52 | 68/32 | 11000 | 1.7 |
| HR-53 | 100 | 8000 | 1.4 |
| HR-54 | 100 | 8500 | 1.4 |
| HR-55 | 80/20 | 13000 | 2.1 |
| HR-56 | 70/30 | 18000 | 2.3 |
| HR-57 | 50/50 | 5200 | 1.9 |
| HR-58 | 50/50 | 10200 | 2.2 |
| HR-59 | 60/40 | 7200 | 2.2 |
| HR-60 | 32/32/36 | 5600 | 2.0 |
| HR-61 | 30/30/40 | 9600 | 1.6 |
| HR-62 | 40/40/20 | 12000 | 2.0 |
| HR-63 | 100 | 6800 | 1.6 |
| HR-64 | 50/50 | 7900 | 1.9 |
| HR-65 | 40/30/30 | 5600 | 2.1 |
| HR-66 | 50/50 | 6800 | 1.7 |
| HR-67 | 50/50 | 5900 | 1.6 |
| HR-68 | 49/51 | 6200 | 1.8 |
| HR-69 | 50/50 | 8000 | 1.9 |
| HR-70 | 30/40/30 | 9600 | 2.3 |
| HR-71 | 30/40/30 | 9200 | 2.0 |
| HR-72 | 40/29/31 | 3200 | 2.1 |
| HR-73 | 90/10 | 6500 | 2.2 |
| HR-74 | 50/50 | 7900 | 1.9 |
| HR-75 | 20/30/50 | 10800 | 1.6 |
| HR-76 | 50/50 | 2200 | 1.9 |
| HR-77 | 50/50 | 5900 | 2.1 |
| HR-78 | 40/20/30/10 | 14000 | 2.2 |
| HR-79 | 50/50 | 5500 | 1.8 |
| HR-80 | 50/50 | 10600 | 1.9 |
| HR-81 | 50/50 | 8600 | 2.3 |
| HR-82 | 100 | 15000 | 2.1 |
| HR-83 | 100 | 6900 | 2.5 |
| HR-84 | 50/50 | 9900 | 2.3 |

In order to prevent the resist film from directly contacting with the immersion liquid, a film (hereinafter, sometimes referred to as a "topcoat") sparingly soluble in an immersion liquid may be provided between the immersion liquid and the resist film formed of the positive resist composition of the present invention. The functions required of the topcoat are suitability for coating as an overlayer of the resist, transparency to radiation particularly at 193 nm, and scarce solubility in the immersion liquid. The topcoat is preferably unmixable with the resist and capable of being uniformly coated as an overlayer of the resist.

In view of transparency to light at 193 nm, the topcoat is preferably a polymer not abundantly containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (HR) is also suitable as the topcoat. If impurities are dissolved out into the immersion liquid from the topcoat, the optical lens is contaminated. In this viewpoint, the amount of residual monomers of the polymer contained in the topcoat is preferably smaller.

On peeling off the topcoat, a developer may be used or a releasing agent may be separately used. The releasing agent is preferably a solvent less permeating into the resist film. From the standpoint that the peeling step can be performed simultaneously with the development step of the resist film, the topcoat is preferably peelable with an alkali developer and for enabling the peeling with an alkali developer, the topcoat is preferably acidic, but in view of non-intermixing with the resist film, the topcoat may be neutral or alkaline.

With no difference in the refractive index between the topcoat and the immersion liquid, the resolution is enhanced. In the case of using water as the immersion liquid at the exposure with an ArF excimer laser (wavelength: 193 nm), the topcoat for ArF immersion exposure preferably has a refractive index close to the refractive index of the immersion liquid. From the standpoint of making the refractive index close to that of the immersion liquid, the topcoat preferably contains a fluorine atom. Also, in view of transparency and refractive index, the topcoat is preferably a thin film The topcoat is preferably unmixable with the resist film and further unmixable with the immersion liquid. From this standpoint, when the immersion liquid is water, the topcoat solvent is preferably a medium which is sparingly soluble in the solvent used for the positive resist composition and insoluble in water. Furthermore, when the immersion liquid is an organic solvent, the topcoat may be either water-soluble or water-insoluble.

EXAMPLES

The present invention is described in greater detail below by referring to Examples, but the present invention should not be construed as being limited thereto.

Synthesis Example

Synthesis of Resin A (2)

Monomers corresponding to components 1 to 4 were charged in a ratio of 40/10/40/10 (by mol) and dissolved in cyclohexanone to prepare 450 g of a solution having a solid content concentration of 15 mass %. Subsequently, 1 mol % of a polymerization initiator, V-60, produced by Wako Pure Chemical Industries, Ltd. was added to the solution above, and the resulting solution was added dropwise to 50 g of cyclohexane heated at 100° C. over 6 hours in a nitrogen atmosphere. After the completion of dropwise addition, the reaction solution was stirred for 2 hours. When the reaction was completed, the reaction solution was cooled to room temperature and crystallized from 5 L of methanol, and the precipitated white powder was collected by filtration to recover the objective Resin (2).

The weight average molecular weight of the obtained polymer as determined by GPC measurement was 7,500 in terms of standard polystyrene, and the dispersity was 1.80.

Other polymers were synthesized in the same manner

Structures of polymers used are shown below. Incidentally, the compositional ratio of monomer components is shown in the Table by defining the repeating units from the left in the structural formula of each polymer as component 1, component 2, component 3 and component 4.

(1)

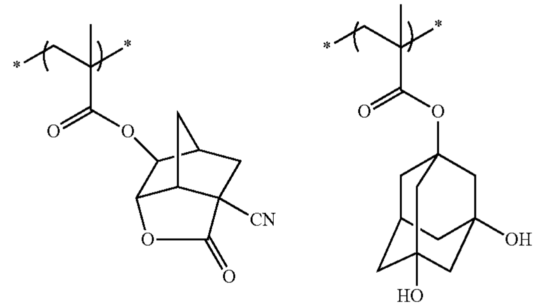

-continued
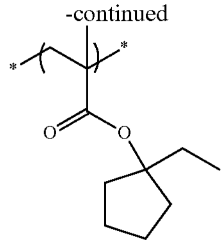
(2)
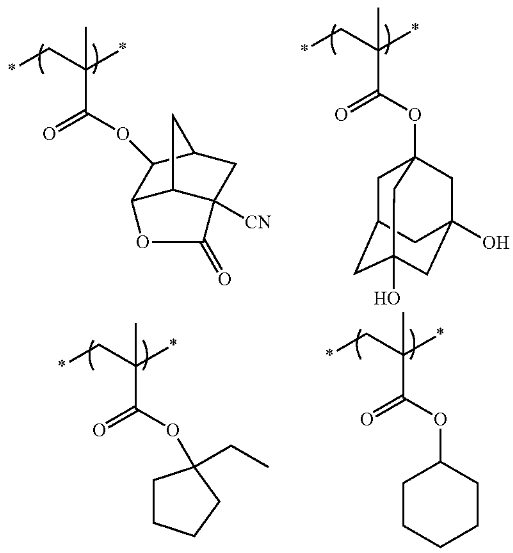
(3)
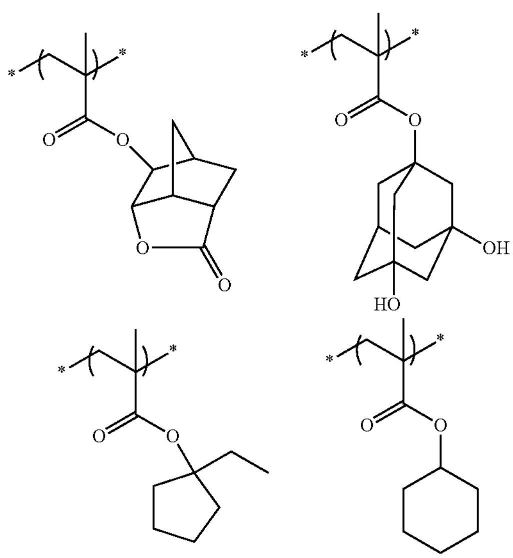
(4)
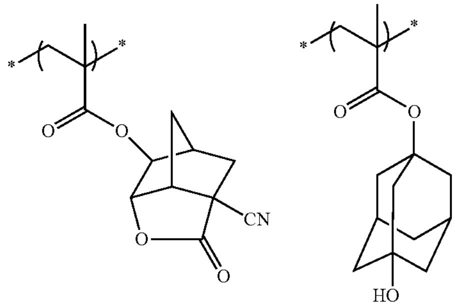
-continued
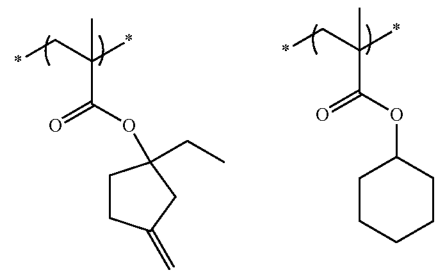
(5)
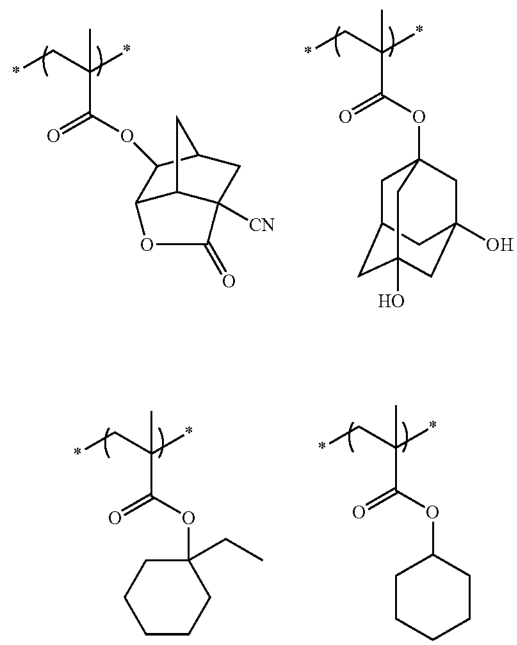
(6)
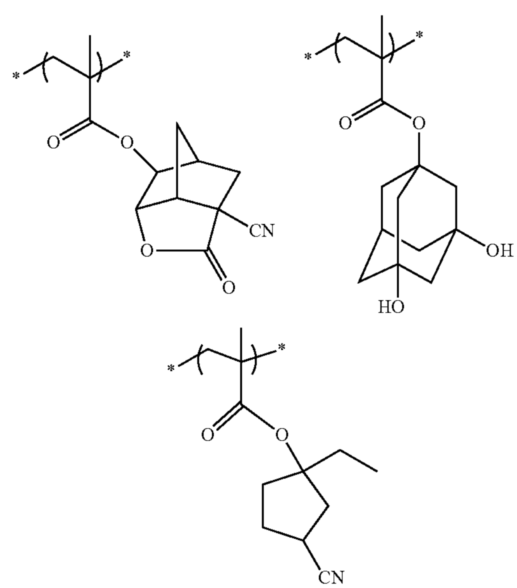

-continued
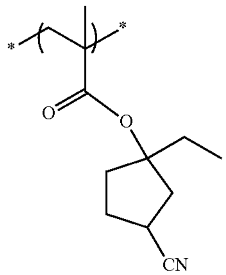
(7)
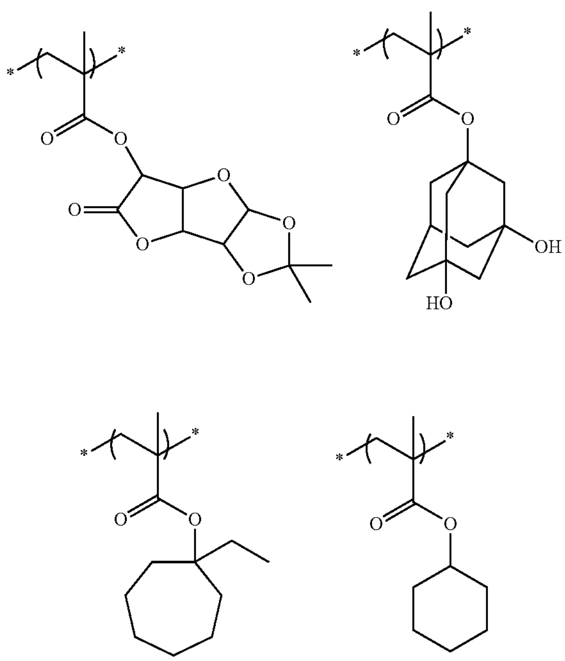
(8)
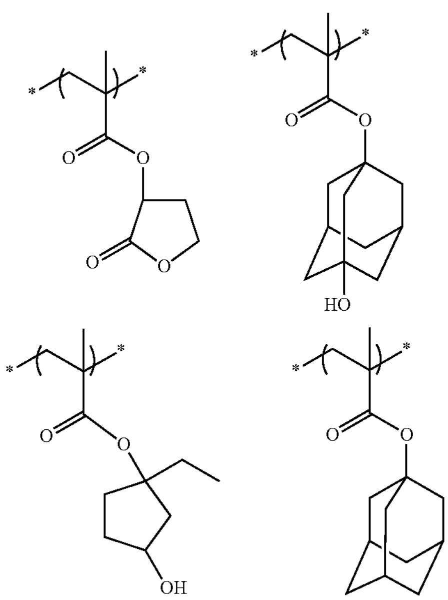
-continued
(9)
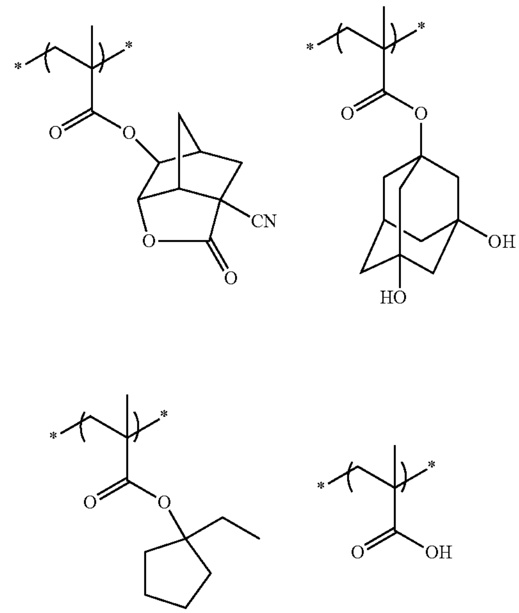
(10)
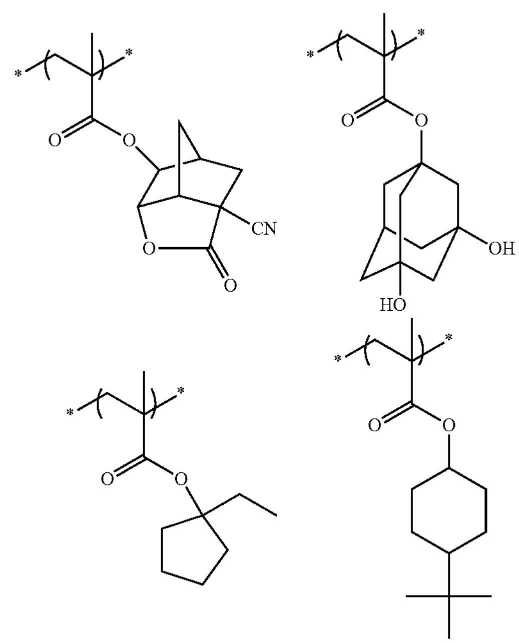
(11)
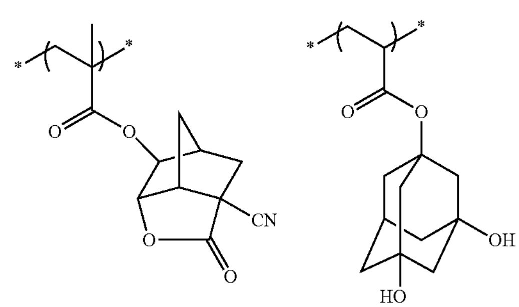

-continued
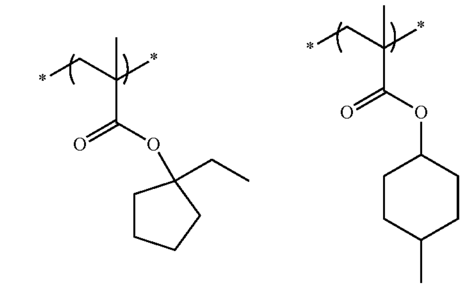
(12)
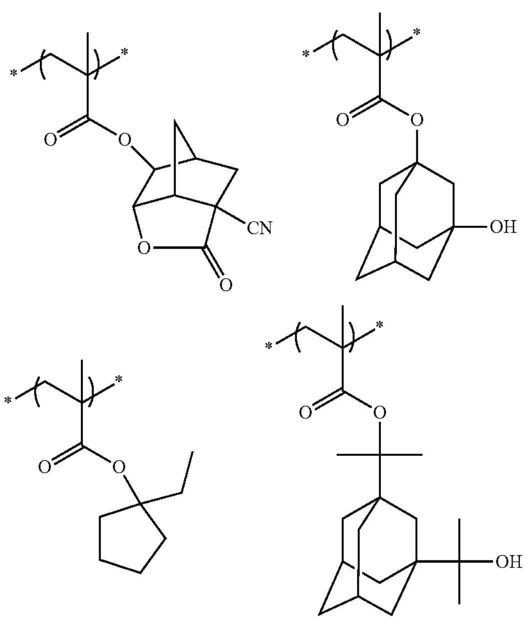
(13)
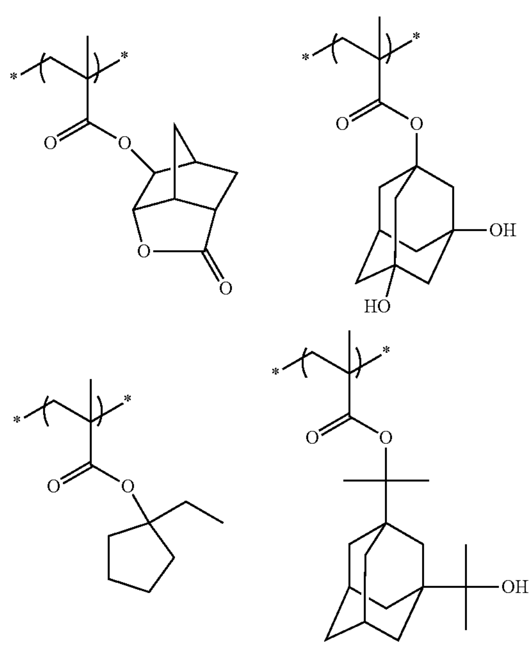
-continued
(R1)
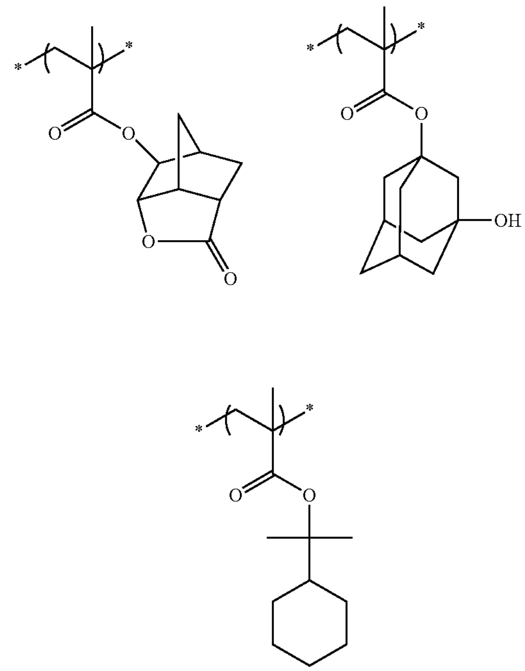
(R2)
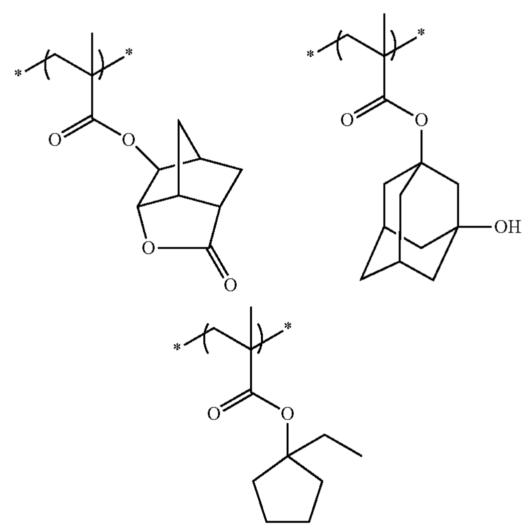
(R3)
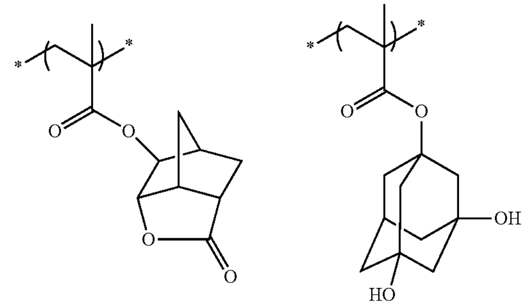

-continued

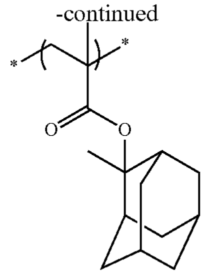

TABLE 2

| | Component 1 | Component 2 | Component 3 | Component 4 | Weight Average Molecular Weight | Dispersity |
|---|---|---|---|---|---|---|
| (1) | 40 | 10 | 50 | — | 8300 | 1.75 |
| (2) | 40 | 10 | 40 | 10 | 7500 | 1.80 |
| (3) | 45 | 20 | 30 | 5 | 10200 | 1.78 |
| (4) | 40 | 10 | 40 | 10 | 8800 | 1.83 |
| (5) | 40 | 10 | 40 | 10 | 7000 | 1.85 |
| (6) | 50 | 10 | 40 | — | 8300 | 1.79 |
| (7) | 40 | 10 | 40 | 10 | 8200 | 1.79 |
| (8) | 50 | 10 | 35 | 5 | 9000 | 1.72 |
| (9) | 40 | 10 | 40 | 10 | 7700 | 1.69 |
| (10) | 40 | 20 | 30 | 10 | 8100 | 1.71 |
| (11) | 40 | 10 | 40 | 10 | 8400 | 1.68 |

TABLE 3

| | Component 1 | Component 2 | Component 3 | Component 4 | Weight Average Molecular Weight | Dispersity |
|---|---|---|---|---|---|---|
| (12) | 40 | 10 | 30 | 20 | 8800 | 1.70 |
| (13) | 45 | 15 | 10 | 30 | 9100 | 1.65 |
| (R1) | 40 | 10 | 50 | — | 9000 | 1.71 |
| (R2) | 40 | 10 | 50 | — | 10300 | 1.89 |
| (R3) | 40 | 10 | 50 | — | 10400 | 1.74 |

<Preparation of Resist>

The components shown in the Table below were dissolved in a solvent to prepare a solution having a solid content concentration of 6 mass %, and the obtained solution was filtered through a filter having a pore size of 0.02 μm (47 mm UPE Membrane Disks, manufactured by Nihon Entegris K.K.) at a temperature of 23° C. under a filtration pressure of 0.4 MPa. At this time, filterability was evaluated by measuring the filtration speed. Also, the prepared positive resist composition was evaluated by the following method and the results are shown in the Table below.

Here, as for each component in the Table, the ratio when using a plurality of kinds is a ratio by mass.

<Evaluation of Filterability>

The value obtained by dividing the total time spent in filtration by the entire amount of the resist solution was defined as the filtration time (min/L). A smaller value indicates a higher performance.

<Resist Pattern Fowling Method>

An organic antireflection film, ARC29A (produced by Nissan Chemical Industries, Ltd.), was coated on a silicon wafer and baked at 205° C. for 60 seconds to form an antireflection film having a film thickness of 78 nm, and the positive resist composition prepared was coated thereon and baked at 130° C. for 60 seconds to form a resist film having a film thickness of 160 nm. The obtained wafer was subjected to exposure through a 6% halftone mask having a 1:1 line-and-space pattern of 65 nm by using an ArF excimer laser immersion scanner (PAS5500/1250i, manufactured by ASML, NA: 0.85). Ultrapure water was used as the immersion liquid. Thereafter, the wafer was heated at 130° C. for 60 seconds, then developed with an aqueous tetramethylammonium hydroxide solution (2.38 mass %) for 30 seconds, rinsed with pure water and spin-dried to obtain a resist pattern.

<Evaluation of Line Width Uniformity>

The repeating pattern obtained above was measured for the line width with respect to 55 shots in total in the wafer plane by using S9380 (manufactured by Hitachi Ltd.) (threshold=50), and the line width uniformity in the wafer plane was evaluated. The evaluation result was shown by the standard deviation (nm, 3σ) from the average value obtained. A smaller value indicates a higher performance.

TABLE 4

| | (A) Resin (2 g) | (B) Acid Generator | (C) Mixed Solvent (ratio by mass) | Basic Compound | Surfactant | Hydrophobic Resin (HR) | Filtration Time | Line Width Uniformity |
|---|---|---|---|---|---|---|---|---|
| Example 1 | (1) | (z1) 160 mg | SL-1/SL-4 (60/40) | (N-1) 16 mg | (W-1) 6 mg | (HR-30) 6 mg | 30 | 1.8 |
| Example 2 | (2) | (z1) 160 mg | SL-1/SL-4 (80/20) | (N-1) 16 mg | (W-1) 6 mg | (HR-30) 6 mg | 28 | 1.7 |
| Example 3 | (3) | (z1) 160 mg | SL-2/SL-4/SL-9 (20/30/50) | (N-1) 16 mg | (W-1) 6 mg | (HR-30) 6 mg | 35 | 1.9 |
| Example 4 | (4) | (z1) 160 mg | SL-3/SL-4 (60/40) | (N-1) 16 mg | (W-1) 6 mg | (HR-30) 6 mg | 31 | 1.9 |
| Example 5 | (5) | (z1) 160 mg | SL-3/SL-4/SL-7 (20/20/60) | (N-1) 16 mg | (W-1) 6 mg | (HR-30) 6 mg | 32 | 1.8 |
| Example 6 | (6) | (z30) 120 mg | SL-1/SL-4/SL-6 (60/38/2) | (N-2) 16 mg | (W-2) 6 mg | (HR-20) 6 mg | 34 | 2.0 |
| Example 7 | (7) | (z31) 200 mg | SL-1/SL-4/SL-5 (58/39/3) | (N-3) 16 mg | (W-3) 6 mg | (HR-33) 6 mg | 34 | 1.9 |
| Example 8 | (8) | (z35) 180 mg | SL-4/SL-7 (40/60) | (N-4) 16 mg | (W-4) 6 mg | (HR-34) 6 mg | 33 | 2.0 |
| Example 9 | (9) | (z40) 140 mg | SL-1/SL-4 (70/30) | (N-5) 8 mg | (W-5) 6 mg | (HR-35) 6 mg | 30 | 1.8 |
| Example 10 | (10) | (z41) 160 mg | SL-4/SL-8 (20/80) | (N-6) 8 mg | (W-6) 6 mg | (HR-40) 6 mg | 35 | 2.0 |
| Example 11 | (11) | (z42) 160 mg | SL-1/SL-4 (70/30) | (N-1) 8 mg | (W-1) 4 mg | (HR-30) 8 mg | 28 | 1.7 |
| Example 12 | (11) | (z42) 160 mg | SL-9/SL-4 (70/30) | (N-1) 8 mg | (W-1) 4 mg | (HR-30) 8 mg | 33 | 1.9 |
| Example 13 | (12) | (z1) 160 mg | SL-1/SL-4 (70/30) | (N-1) 16 mg | (W-1) 16 mg | (HR-30) 8 mg | 23 | 1.7 |
| Example 14 | (13) | (z1) 160 mg | SL-1/SL-4 (70/30) | (N-1) 16 mg | (W-1) 16 mg | (HR-30) 8 mg | 38 | 1.9 |
| Comparative Example (1) | (R1) | (z1) 160 mg | SL-1 (100) | (N-1) 8 mg | (W-1) 6 mg | (HR-30) 6 mg | 150 | 3.3 |
| Comparative Example (2) | (R2) | (z1) 160 mg | SL-1 (100) | (N-1) 8 mg | (W-1) 6 mg | (HR-30) 6 mg | 143 | 3.1 |
| Comparative Example (3) | (R1) | (z1) 160 mg | SL-1/SL-2 (60/40) | (N-1) 8 mg | (W-1) 6 mg | (HR-30) 6 mg | 144 | 3.8 |
| Comparative Example (4) | (R1) | (z1) 160 mg | SL-1/SL-7 (70/30) | (N-1) 8 mg | (W-1) 6 mg | (HR-30) 6 mg | 140 | 3.6 |
| Comparative Example (5) | (R1) | (z1) 160 mg | SL-1/SL-9 (70/30) | (N-1) 8 mg | (W-1) 6 mg | (HR-30) 6 mg | 138 | 3.1 |
| Comparative Example (6) | (R1) | (z1) 160 mg | SL-1/SL-5/SL-7 (55/5/40) | (N-1) 8 mg | (W-1) 6 mg | (HR-30) 6 mg | 145 | 3.0 |
| Comparative Example (7) | (R1) | (z1) 160 mg | SL-1/SL-5/SL-9 (60/5/35) | (N-1) 8 mg | (W-1) 6 mg | (HR-30) 6 mg | 151 | 3.3 |
| Comparative Example (8) | (R1) | (z1) 160 mg | SL-1 (100) | (N-1) 8 mg | (W-1) 6 mg | — | 120 | 2.9 |
| Comparative Example (9) | (R3) | (z1) 160 mg | SL-1/SL-4 (60/40) | (N-1) 16 mg | (W-1) 16 mg | (HR-30) 6 mg | 118 | 2.8 |

N-1: N,N-dibutylaniline
N-2: tetrabutylammonium hydroxide
N-3: 2,6-diisopropylaniline
N-4: tri-n-octylamine
N-5: N,N-dihydroxyethylaniline
N-6: N,N-dihexylaniline
W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: Polysiloxane Polymer KP-341 (produced by Shin-Etsu Chemical Co., Ltd.) (silicon-containing)
W-4: Troysol S-366 (produced by Troy Chemical)
W-5: PF656 (produced by OMNOVA, fluorine-containing)
W-6: PF6320 (produced by OMNOVA, fluorine-containing)
SL-1: propylene glycol monomethyl ether acetate (PGMEA) (Group (b))
SL-2: ethyl lactate (Group (d))
SL-3: methyl 3-methoxypropionate (Group (d))
SL-4: propylene glycol monomethyl ether (PGME) (Group (a))
SL-5: γ-butyrolactone (Group (c))
SL-6: propylene carbonate (Group (c))
SL-7: 2-heptanone (Group (c))
SL-8: methyl ethyl ketone (Group (c))
SL-9: cyclohexanone (Group (c))

Industrial Applicability

According to the present invention, a resist composition capable of realizing high filterability and excellent line width uniformity and a pattern forming method using the resist composition can be provided.

The entire disclosure of each and every foreign patent application from which the benefit of foreign priority has been claimed in the present application is incorporated herein by reference, as if fully set forth.

The invention claimed is:

1. A positive resist composition, comprising:

(A) a resin containing a repeating structural unit represented by formula (I) and being capable of decomposing by an action of an acid to increase the solubility of the resin (A) in an alkali developer;

(B) a compound capable of generating an acid upon irradiation with an actinic ray or radiation;

(C) a mixed solvent containing at least one solvent selected from the group consisting of the following Group (a), at least one solvent selected from the group consisting of the following Group (b), and at least one solvent selected from the group consisting of the following Group (c):

Group (a): an alkylene glycol monoalkyl ether,

Group (b): an alkylene glycol monoalkyl ether carboxylate, and

Group (c): a linear ketone, a branched chain ketone, and a cyclic ketone; and a hydrophobic resin (HR) having at least either one of a fluorine atom and a silicon atom:

(I)

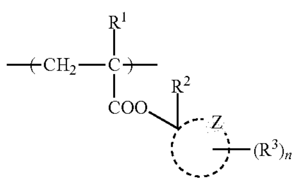

wherein $R^1$ represents a hydrogen atom, a halogen atom or an alkyl group;

$R^2$ represents an alkyl group;

$R^3$ represents a halogen atom, an alkyl group, a cycloalkyl group, a cyano group or a hydroxyl group, and when a plurality of $R^3$'s are present, the plurality of $R^3$'s are the same or different;

n represents 0 or a positive integer; and

Z represents a monocyclic cycloalkyl group having a carbon number of 3 to 8, and further wherein the hydrophobic resin (HR) contains at least one group selected from the group consisting of (x) an alkali-soluble group, (y) a group capable of decomposing by an action of an alkali developer to increase its solubility in an alkali developer, and (z) a group capable of decomposing by an action of an acid.

2. The positive resist composition according to claim 1, further comprising:

(D) a surfactant; and (E) a basic compound.

3. The positive resist composition according to claim 1, wherein the monocyclic cycloalkyl group represented by Z in formula (I) is a 5-membered ring.

4. The positive resist composition according to claim 1, wherein the resin as the component (A) further contains a repeating unit having a lactone structure.

5. The positive resist composition according to claim 4, wherein the lactone structure is represented by formula (A2):

(A2)

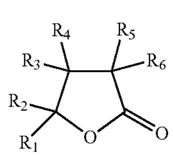

wherein $R_1$ to $R_6$ each independently represents a linking group to a main chain of the resin (A), a hydrogen atom or a substituent, provided that at least one of $R_1$ to $R_6$ represents a cyano group or a cyano group-containing substituent, at least two members out of $R_1$ to $R_6$ may combine together to form a ring structure, and at least one of $R_1$ to $R_6$ includes the linking group to the main chain of the resin (A).

6. The positive resist composition according to claim 4, wherein the lactone structure is represented by formula (A6):

(A6)

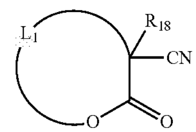

wherein $R_{18}$ represents a linking group to a main chain of the resin (A), a hydrogen atom or a substituent;

$L_1$ represents a linking group for linking the carbon atom at the 2-position of the lactone ring and the oxygen atom of the lactone ring to form a lactone ring structure, and the linking group to the main chain of the resin (A) may be substituted to $L_1$; and $R_{18}$ and $L_1$ may combine together to form a ring structure, provided that at least one of $R_{18}$ and $L_1$ includes the linking group to the main chain of the resin (A).

7. The positive resist composition according to claim 1, wherein the resin as the component (A) further contains a repeating unit represented by formula (2-1):

(2-1)

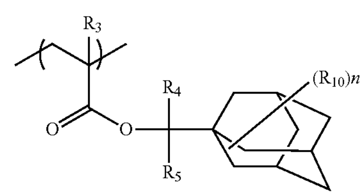

wherein $R_3$ represents a hydrogen atom, a halogen atom or an alkyl group;

$R_4$ and $R_5$ each independently represents an alkyl group or a cycloalkyl group;

$R_{10}$ represents a substituent containing a polar group; and n represents an integer of 0 to 15.

8. The positive resist composition according to claim 7, wherein $R_{10}$ in formula (2-1) represents a partial structure represented by —C($R_4$')($R_5$')—OH, in which $R_4$' and $R_5$' each independently represents an alkyl group or a cycloalkyl group, when n is 1 or more.

9. A pattern forming method, comprising:

forming a resist film from the positive resist composition according to claim 1; and exposing and developing the resist film.

10. The pattern forming method according to claim 9, wherein the resist film is exposed through an immersion medium.

11. The positive resist composition according to claim 1, wherein the amount of the hydrophobic resin (HR) is from 0.1 to 10 mass % based on the entire solids content of the positive resist composition.

12. The positive resist composition according to claim 1, wherein the ketone of Group (c) is cyclohexanone.

13. The positive resist composition according to claim 1, wherein the ketone of Group (c) is 2-heptanone.

14. The positive resist composition according to claim 1, wherein the carbon number of the monocyclic cycloalkyl group is 3-6.

15. A positive resist composition, comprising:

(A) a resin containing a repeating structural unit represented by formula (I) and being capable of decomposing by an action of an acid to increase the solubility of the resin (A) in an alkali developer;

(B) a compound capable of generating an acid upon irradiation with an actinic ray or radiation;

(C) a mixed solvent containing at least one solvent selected from the group consisting of the following Group (a), at least one solvent selected from the group consisting of the following Group (b), and at least one solvent selected from the group consisting of the following Group (c):

Group (a): an alkylene glycol monoalkyl ether,

Group (b): an alkylene glycol monoalkyl ether carboxylate; and

Group (c): a linear ketone, a branched chain ketone, and a cyclic ketone; and a hydrophobic resin (HR):

(I)

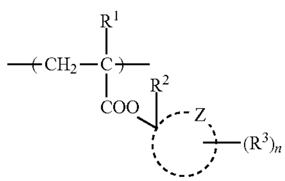

wherein $R^1$ represents a hydrogen atom, a halogen atom or an alkyl group;

$R^2$ represents an alkyl group;

$R^3$ represents a halogen atom, an alkyl group, a cycloalkyl group, a cyano group or a hydroxyl group, and when a plurality of $R^3$'s are present, the plurality of $R^3$'s are the same or different;

n represents 0 or a positive integer; and

Z represents a monocyclic cycloalkyl group having a carbon number of 3 to 8.

16. The positive resist composition according to claim 15, wherein the monocyclic cycloalkyl group represented by Z in formula (I) is a 5-membered ring.

17. The positive resist composition according to claim 15, wherein the resin as the component (A) further contains a repeating unit having a lactone structure.

18. The positive resist composition according to claim 15, wherein the resin as the component (A) further contains a repeating unit represented by formula (2-1):

(2-1)

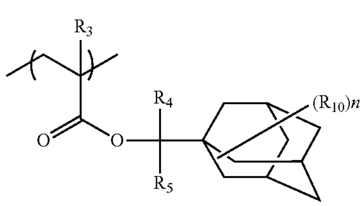

wherein $R_3$ represents a hydrogen atom, a halogen atom or an alkyl group;

$R_4$ and $R_5$ each independently represents an alkyl group or a cycloalkyl group;

$R_{10}$ represents a substituent containing a polar group; and n represents an integer of 0 to 15.

19. A pattern forming method, comprising:

forming a resist film from the positive resist composition according to claim 15; and exposing and developing the resist film.

20. The positive resist composition according to claim 15, wherein the carbon number of the monocyclic cycloalkyl group is 3-6.

21. A positive resist composition, comprising:

(A) a resin containing a repeating structural unit represented by formula (I) and being capable of decomposing by an action of an acid to increase the solubility of the resin (A) in an alkali developer;

(B) a compound capable of generating an acid upon irradiation with an actinic ray or radiation;

(C) a mixed solvent containing 2-heptanone, at least one solvent selected from the group consisting of the following Group (a), and at least one solvent selected from the group consisting of the following Group (b):

Group (a): an alkylene glycol monoalkyl ether, and

Group (b): an alkylene glycol monoalkyl ether carboxylate; and a hydrophobic resin (HR):

(I)

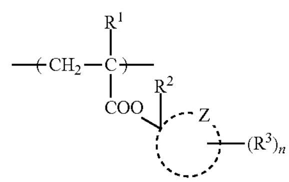

wherein $R^1$ represents a hydrogen atom, a halogen atom or an alkyl group;

$R^2$ represents an alkyl group;

$R^3$ represents a halogen atom, an alkyl group, a cycloalkyl group, a cyano group or a hydroxyl group, and when a plurality of $R^3$'s are present, the plurality of $R^3$'s are the same or different;

n represents 0 or a positive integer; and

Z represents a monocyclic cycloalkyl group having a carbon number of 3 to 8.

22. The positive resist composition according to claim 21, wherein the monocyclic cycloalkyl group represented by Z in formula (I) is a 5-membered ring.

23. The positive resist composition according to claim 21, wherein the resin as the component (A) further contains a repeating unit having a lactone structure.

24. A pattern forming method, comprising:

forming a resist film from the positive resist composition according to claim 21; and exposing and developing the resist film.

25. The positive resist composition according to claim 21, wherein the carbon number of the monocyclic cycloalkyl group is 3-6.

26. A positive resist composition, comprising:

(A) a resin containing a repeating structural unit represented by formula (I) and being capable of decomposing by an action of an acid to increase the solubility of the resin (A) in an alkali developer;

(B) a compound capable of generating an acid upon irradiation with an actinic ray or radiation;

(C) a mixed solvent containing at least one solvent selected from the group consisting of the following Group (a), at least one solvent selected from the group consisting of the following Group (b), and at least one solvent selected from the group consisting of the following Group (c):

Group (a): an alkylene glycol monoalkyl ether,

Group (b): an alkylene glycol monoalkyl ether carboxylate, and

Group (c): a linear ketone, a branched chain ketone, and a cyclic ketone; and a hydrophobic resin (HR) having at least either one of a fluorine atom and a silicon atom:

(I)

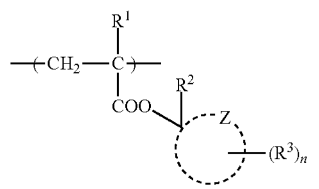

wherein $R^1$ represents a hydrogen atom, a halogen atom or an alkyl group;

$R^2$ represents an alkyl group;

$R^3$ represents a halogen atom, an alkyl group, a cycloalkyl group, a cyano group or a hydroxyl group, and when a plurality of $R^3$'s are present, the plurality of $R^3$'s are the same or different;

n represents 0 or a positive integer; and

Z represents a cyclic alkyl group having a carbon number of 3 to 8, and further wherein the hydrophobic resin (HR) contains at least one group selected from the group consisting of (x) an alkali-soluble group, (y) a group capable of decomposing by an action of an alkali developer to increase its solubility in an alkali developer, and (z) a group capable of decomposing by an action of an acid;

wherein the resin as the component (A) further contains a repeating unit represented by formula (2-1):

(2-1)

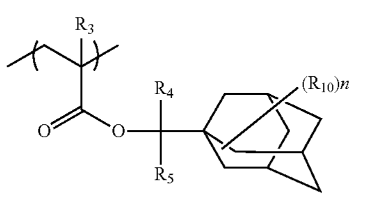

wherein $R_3$ represents a hydrogen atom, a halogen atom or an alkyl group;

$R_4$ and $R_5$ each independently represents an alkyl group or a cycloalkyl group;

$R_{10}$ represents a substituent containing a polar group; and n represents an integer of 0 to 15.

27. The positive resist composition according to claim 26, wherein the ketone of Group (c) is cyclohexanone.

28. The positive resist composition according to claim 26, wherein the ketone of Group (c) is 2-heptanone.

29. A pattern forming method, comprising:

forming a resist film from the positive resist composition according to claim 26; and exposing and developing the resist film.

30. The positive resist composition according to claim 29, wherein the resist film is exposed through an immersion medium.

31. A positive resist composition, comprising:

(A) a resin containing a repeating structural unit represented by formula (I) and being capable of decomposing by an action of an acid to increase the solubility of the resin (A) in an alkali developer;

(B) a compound capable of generating an acid upon irradiation with an actinic ray or radiation;

(C) a mixed solvent containing at least one solvent selected from the group consisting of the following Group (a), at least one solvent selected from the group consisting of the following Group (b), and at least one solvent selected from the group consisting of the following Group (c):

Group (a): an alkylene glycol monoalkyl ether,

Group (b): an alkylene glycol monoalkyl ether carboxylate; and

Group (c): a linear ketone, a branched chain ketone, and a cyclic ketone; and a hydrophobic resin (HR):

(I)

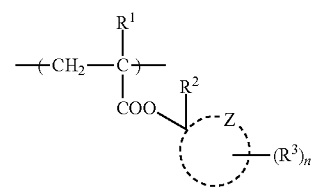

wherein $R^1$ represents a hydrogen atom, a halogen atom or an alkyl group;

$R^2$ represents an alkyl group;

$R^3$ represents a halogen atom, an alkyl group, a cycloalkyl group, a cyano group or a hydroxyl group, and when a plurality of $R^3$'s are present, the plurality of $R^3$'s are the same or different;

n represents 0 or a positive integer; and

Z represents a cyclic alkyl group having a carbon number of 3 to 8;

wherein the resin as the component (A) further contains a repeating unit represented by formula (2-1):

(2-1)

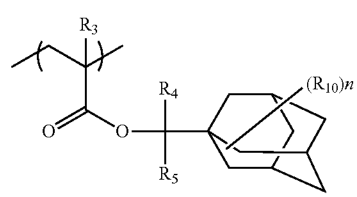

wherein $R_3$ represents a hydrogen atom, a halogen atom or an alkyl group;

$R_4$ and $R_5$ each independently represents an alkyl group or a cycloalkyl group;

$R_{10}$ represents a substituent containing a polar group; and n represents an integer of 0 to 15.

32. The positive resist composition according to claim 31, wherein the ketone of Group (c) is cyclohexanone.

33. The positive resist composition according to claim 31, wherein the ketone of Group (c) is 2-heptanone.

34. A pattern forming method, comprising:

forming a resist film from the positive resist composition according to claim 31; and exposing and developing the resist film.

35. The positive resist composition according to claim 34, wherein the resist film is exposed through an immersion medium.

* * * * *